US012805332B2

(12) United States Patent
Zhang et al.

(10) Patent No.: US 12,805,332 B2
(45) Date of Patent: Nov. 17, 2026

(54) ELECTROMAGNETIC INTERFERENCE SHIELDING FOR INTEGRATED CIRCUIT DEVICES

(71) Applicant: QUALCOMM Incorporated, San Diego, CA (US)

(72) Inventors: Jiaping Zhang, San Diego, CA (US); Heun Gun Shin, San Diego, CA (US); Anirudh Bhat, San Diego, CA (US); Tsu-Wei Lin, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 340 days.

(21) Appl. No.: 18/625,023

(22) Filed: Apr. 2, 2024

(65) Prior Publication Data

US 2025/0309135 A1 Oct. 2, 2025

(51) Int. Cl.
*H10W 42/20* (2026.01)
*H10W 74/10* (2026.01)
*H10W 90/00* (2026.01)

(52) U.S. Cl.
CPC .......... *H10W 42/20* (2026.01); *H10W 74/111* (2026.01); *H10W 90/00* (2026.01); *H10W 90/701* (2026.01)

(58) Field of Classification Search
CPC ... H10W 42/20; H10W 74/111; H10W 90/00; H10W 90/701; H10W 42/273; H10W 42/276; H10W 74/10; H10W 72/0198; H10W 72/072; H10W 74/114; H10W 90/724; H10W 74/014
USPC .......................................................... 257/659
See application file for complete search history.

(56) References Cited

U.S. PATENT DOCUMENTS

2020/0343151 A1* 10/2020 Nomura ................ H10W 70/60

FOREIGN PATENT DOCUMENTS

CN 114497008 A 5/2022

OTHER PUBLICATIONS

International Search Report and Written Opinion PCT/US2025/020448—ISA/EPO Aug. 29, 2025.
Partial International Search Report—PCT/US2025/020448—ISA/EPO—Jul. 8, 2025.

* cited by examiner

*Primary Examiner* — Nathan W Ha
(74) *Attorney, Agent, or Firm* — Moore IP

(57) ABSTRACT

A device includes a substrate and one or more dies electrically connected to the substrate. The device also includes a wall structure electrically connected to the substrate and extending along a side wall of at least one die of the one or more dies. The wall structure is configured to provide an electromagnetic barrier for the at least one die. The device further includes a mold compound at least partially encapsulating the one or more dies and the wall structure.

20 Claims, 24 Drawing Sheets

ELECTROMAGNETIC INTERFERENCE SHIELDING FOR INTEGRATED CIRCUIT DEVICES

FIELD

Various features relate to electromagnetic interference shielding for integrated circuit devices.

DESCRIPTION OF RELATED ART

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate processes.

State-of-the-art mobile application devices demand a small form factor, low cost, a tight power budget, and high electrical performance. Mobile package design has evolved to meet these divergent goals for enabling mobile applications that support increasingly complex functionality. One way to support more complex functionality in mobile devices and other devices is to include sophisticated integrated circuits that perform a variety of operations. However, complex integrated circuits such as radio frequency (RF) semiconductor packages can generate substantial electromagnetic interference (EMI), and as such, RF packages typically include EMI shielding. For example, once a substrate strip has been divided into individual semiconductor packages (e.g., at a unit level of a fabrication process), an EMI shielding material may be used to form a coating on a RF package to provide EMI shielding to the package. However, this unit-level EMI design does not take advantage of efficiencies at higher levels of a fabrication process, such as the strip level. Additionally, EMI shielding may be provided to underlying layers of a substrate of the RF package using a series of vias (referred to as a "via fence" wall), or to individual compartments of the RF package using wire bond Faraday cages. However, via fences and wire bonds (e.g., of a Faraday cage) may not provide sufficient EMI shielding and may increase cost and complexity of the fabrication process.

SUMMARY

Various features relate to integrated circuit devices.

One example provides a device that includes a substrate. The device also includes one or more dies electrically connected to the substrate. The device includes a wall structure electrically connected to the substrate and extending along a side wall of at least one die of the one or more dies. The wall structure is configured to provide an electromagnetic barrier for the at least one die. The device further includes a mold compound at least partially encapsulating the one or more dies and the wall structure.

Another example provides a method of fabrication that includes attaching a wall structure to a substrate along a side wall of at least one die of one or more dies that are electrically connected to the substrate. The wall structure is configured to provide an electromagnetic barrier for the at least one die. The method further includes depositing a mold compound to at least partially encapsulate the one or more dies and the wall structure.

Another example provides a device that includes a substrate. The substrate includes a first metal layer and a second metal layer. The substrate also includes a dielectric layer disposed between the first metal layer and the second metal layer. The dielectric layer defines a recess along an edge of the substrate between the first metal layer and the second metal layer. The substrate further includes a conductive sidewall structure electrically connected to the first metal layer and to the second metal layer. The conductive sidewall structure is disposed within the recess and extends to the edge of the substrate. The device also includes a first die electrically connected to the substrate and a second die electrically connected to the substrate. The device includes a first wall structure electrically connected to the substrate and extending between the first die and the second die. The first wall structure is configured to provide an electromagnetic barrier between the first die and the second die. The device includes a second wall structure electrically connected to the substrate and extending along a sidewall of the second die. The device further includes a mold compound at least partially encapsulating the first die, the second die, the first wall structure, and the second wall structure.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figure 1A:
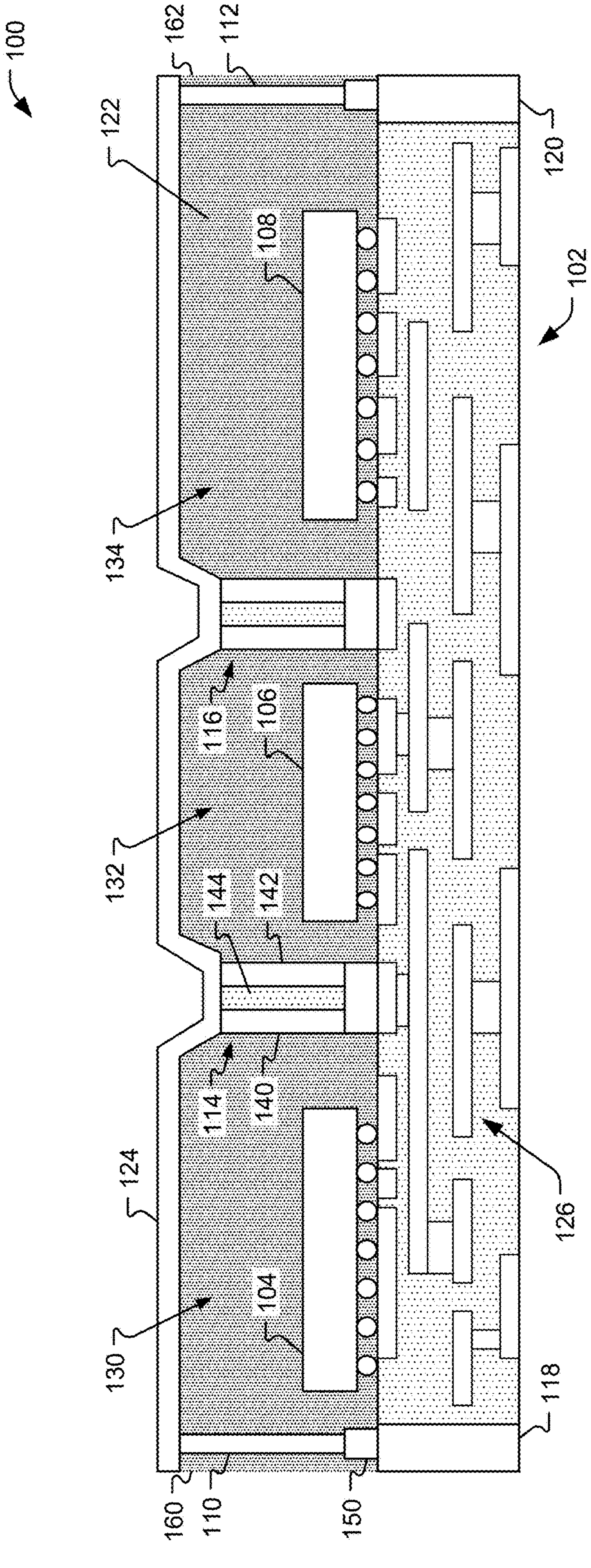
FIG. 1A illustrates a cross-sectional profile view of an exemplary device that includes one or more electromagnetic interference (EMI) shielding structures.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure. As another example, various devices and structures disclosed herein are illustrated schematically. Such schematic representations are not to scale and are generally intentionally simplified. To illustrate, integrated devices can have many tens or hundreds of contacts and corresponding interconnections; however, a very small number of such contacts and interconnects are illustrated herein to highlight important features of the disclosure without unduly complicating the drawings.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms “a,” “an,” and “the” are intended to include the plural forms as well, unless the context clearly indicates otherwise. Further, some features described herein are singular in some implementations and plural in other implementations. For ease of reference herein, such features are generally introduced as “one or more” features and are subsequently referred to in the singular or optional plural (as indicated by “(s)”) unless aspects related to multiple of the features are being described.

As used herein, the terms “comprise,” “comprises,” and “comprising” may be used interchangeably with “include,” “includes,” or “including.” As used herein, “exemplary” indicates an example, an implementation, and/or an aspect, and should not be construed as limiting or as indicating a preference or a preferred implementation. As used herein, an ordinal term (e.g., “first,” “second,” “third,” etc.) used to modify an element, such as a structure, a component, an operation, etc., does not by itself indicate any priority or order of the element with respect to another element, but rather merely distinguishes the element from another element having a same name (but for use of the ordinal term). As used herein, the term “set” refers to one or more of a particular element, and the term “plurality” refers to multiple (e.g., two or more) of a particular element.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming more common as significant power performance area (PPA) yield enhancements are demonstrated for stacked die and chiplet architecture product lines. As used herein, “stacked dies” and/or “stacked ICs” refer to arrangements in which one die (e.g., a first die) is disposed over (including directly over) another die (e.g., a second die). Unfortunately, stacked die schemes and other state-of-the-art IC designs can result in increased electromagnetic interference between components, particularly in radio frequency (RF) semiconductor packages such as used in mobile devices, which can degrade performance. Various aspects of the present disclosure provide various structures for integrated circuits that provide shielding from electromagnetic interference (EMI).

As used herein, the term "layer" includes a film, and is not construed as indicating a vertical or horizontal thickness unless otherwise stated. As used herein, the term "chiplet" may refer to an integrated circuit block, a functional circuit block, or other like circuit block specifically designed to work with one or more other chiplets to form a larger, more complex chiplet architecture.

Aspects of the present disclosure are directed to EMI shielding for integrated circuit (IC) devices, such as RF semiconductor packages. In some aspects, an IC device includes one or more structures configured to provide EMI shielding to components of the IC device, also referred to herein as "EMI shielding structures". These EMI shielding structures can include a compartment EMI shielding structure (e.g., a structure that provides EMI shielding to component(s) within a compartment of a semiconductor package), a sidewall EMI shielding structure (e.g., a structure that provides EMI shielding to a side of the semiconductor package), a substrate EMI shielding structure (e.g., a structure that provides EMI shielding to a side of a substrate of the semiconductor package), or a combination thereof. The disclosed EMI shielding structures may be able to be designed and formed at a strip level during a fabrication process, as compared to a unit level, which can provide EMI shielding to ICs that is scalable and has reduced complexity and costs as compared to other fabrication processes for EMI shielding in ICs.

In some drawings, multiple instances of a particular type of feature are used. Although these features are physically and/or logically distinct, the same reference number is used for each, and the different instances are distinguished by addition of a letter to the reference number. When the features as a group or a type are referred to herein e.g., when no particular one of the features is being referenced, the reference number is used without a distinguishing letter. However, when one particular feature of multiple features of the same type is referred to herein, the reference number is used with the distinguishing letter. For example, referring to FIG. 1B, multiple third wall structures 114 are illustrated and associated with reference numbers 114A and 114B. When referring to a particular one of these third wall structures, such as a third wall structure 114A, the distinguishing letter "A" is used. However, when referring to any arbitrary one of these third wall structures or to these third wall structures as a group, the reference number 114 is used without a distinguishing letter.

Exemplary Device Including EMI Shielding Structure(s)

Figure 1B:
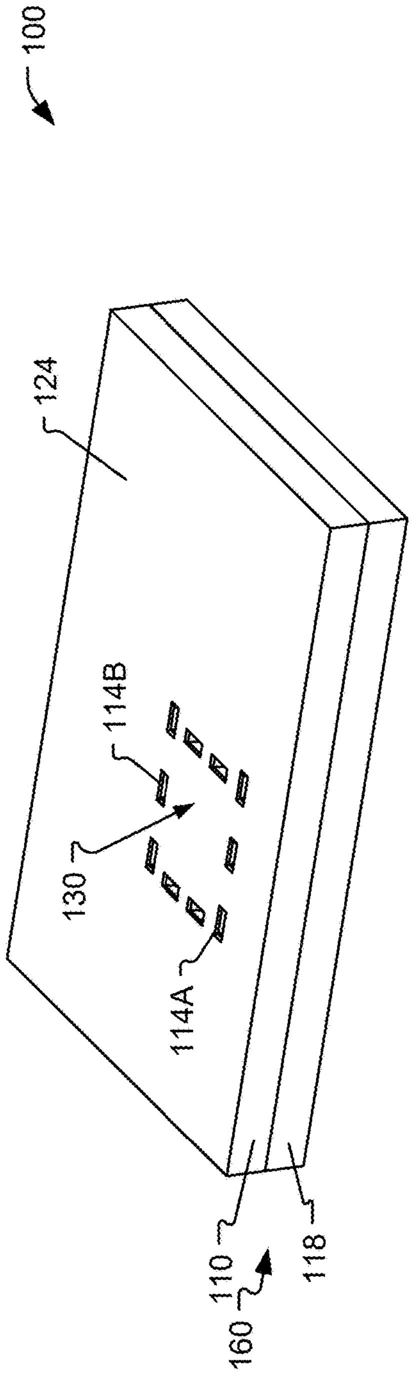
FIG. 1B illustrates an external perspective view of an implementation of the exemplary device of FIG. 1A.
Figure 1C:
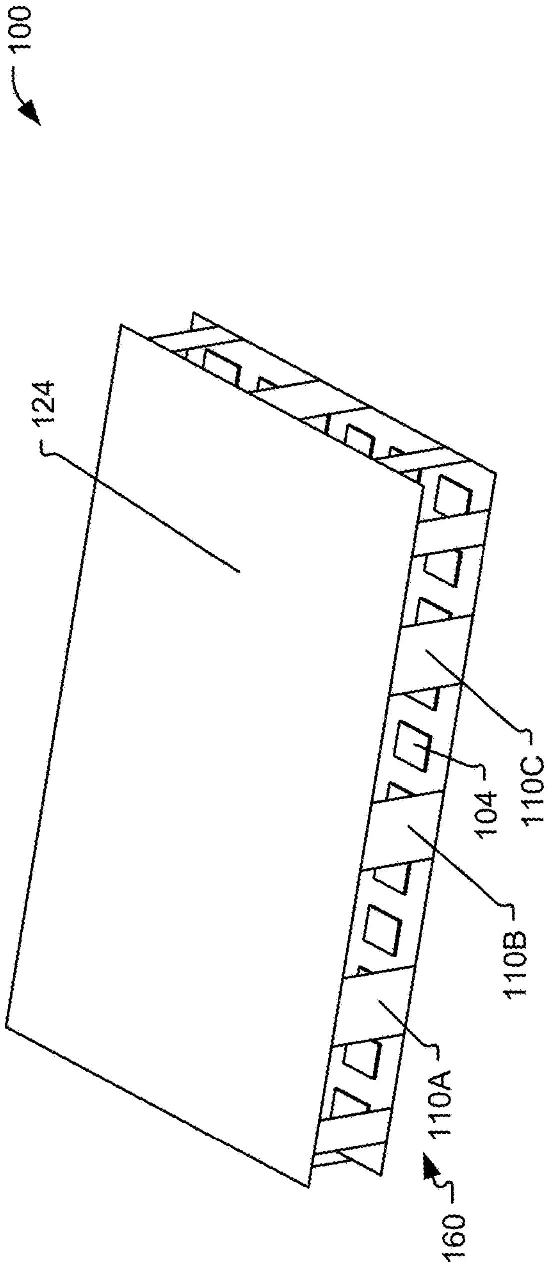
FIG. 1C illustrates an external perspective view of another implementation of the exemplary device of FIG. 1A.

FIG. 1A illustrates a cross-sectional profile view of an exemplary device 100 that includes one or more electromagnetic interference (EMI) shielding structures. FIG. 1B illustrates a top view of an implementation of the exemplary device 100 of FIG. 1A. FIG. 1C illustrates a top view of another implementation of the exemplary device 100 of FIG. 1A.

In the implementation shown in FIG. 1A, the device 100 includes a substrate 102 and a plurality of IC dies that are electrically connected to the substrate 102, including a first die 104, a second die 106, and a third die 108. The device 100 also includes a first wall structure 110 (e.g., a first sidewall EMI shielding structure), a second wall structure 112 (e.g., a second sidewall EMI shielding structure), a third wall structure 114 (e.g., a first compartmental EMI shielding structure), a fourth wall structure 116 (e.g., a second compartment EMI shielding structure), a fifth wall structure 118 (e.g., a first substrate EMI shielding structure), a sixth wall structure 120 (e.g., a second substrate EMI shielding structure), a mold compound 122 that at least partially encapsulates the dies 104-108 and the wall structures 110-120, and a cover layer 124 disposed on top of the mold compound 122.

Each of the dies 104-108 can include integrated circuitry, such as a plurality of transistors and/or other circuit elements arranged and interconnected to form amplifiers, switches, mixers, logic cells, memory cells, etc. Components of the integrated circuitry can be formed in and/or over a semiconductor substrate, such as the substrate 102. Different implementations can use different types of transistors, such as a field effect transistor (FET), planar FET, finFET, a gate all around FET, or mixtures of transistor types. In some implementations, a front end-of-line (FEOL) process may be used to fabricate the integrated circuitry in and/or over the substrate 102.

In some implementations, the IC dies are electrically connected to, or integrated with, the substrate 102. For example, the dies 104-108 may be electrically connected (e.g., via one or more contacts or interconnects) to one or more conductive pathways 126, within the substrate 102. Any of the conductive interconnects and contacts described herein can include, for example, microbumps, conductive pillars, conductive pads (e.g., for pad-to-pad bonding), or chiplet-to-chiplet interconnects used for three-dimensional (3D) chiplet stacking, or chiplet-to-substrate interconnects. The conductive pathways 126 may include one or more metal structures formed from metal layers of the substrate 102, one or more vias or other inter-level connections, other routings or interconnects, or a combination thereof. In some implementations, the device 100 may include one or more components or other structures (e.g., landside capacitors) on an opposite surface of the substrate 102 from the dies 104-108, and the conductive pathways 126 may provide electrical connections between one or more of the dies 104-108 and the components or other structure(s) on the opposite surface of the substrate 102.

The mold compound 122 may be any mold compound that is electrically stable at high temperatures. The mold compound 122 may be deposited on the dies 104-108 and the wall structures 110-120 and, along with the cover layer 124, may define a package (e.g., a semiconductor package, such as an RF package) that includes the substrate 102, the dies 104-108, and the wall structures 110-120. The cover layer 124 may include a metal, a metal alloy, or another type of material that is configured to provide electromagnetic shielding (e.g., an EMI barrier), such that the cover layer 124 acts as a top EMI shield for the device 100. The cover layer 124 may be formed by sputtering, spraying, or another technique that is performed at the strip level or panel level during a fabrication process, as further described herein.

In the implementation shown, the device 100 includes three types of EMI shielding structures: package side wall EMI shielding structures (e.g., the first wall structure 110 and the second wall structure 112), compartment EMI shielding structures (e.g., the third wall structure 114 and the fourth wall structure 116), and substrate EMI shielding structures (e.g., the fifth wall structure 118 and the sixth wall structure 120). In other implementations, the device 100 may include two types of EMI shielding structures or a single type of EMI shielding structure, based on design considerations of the device 100. Additionally, or alternatively, the package side wall EMI shielding structures (e.g., the first wall structure 110 and the second wall structure 112) may be replaced with additional instances of the compartment EMI shielding structures (e.g., the third wall structure 114 and the fourth wall structure 116), as further described herein with reference to FIGS. 9A-C. Each type of EMI shielding structure may be formed using different processes, as further described herein.

The compartment EMI shielding structures, also referred to as compartmental EMI shielding structures or compartment wall structures, may be disposed between two or more dies to define compartments (e.g., cavities) within the package of the device 100. In a particular implementation, the third wall structure 114 is disposed between the first die 104 and the second die 106 and the fourth wall structure 116 is disposed between the second die 106 and the third die 108. Because the wall structures 114 and 116 are disposed between respective dies, the wall structures 114 and 116 are also disposed along side walls of the respective dies. For example, the third wall structure 114 is disposed along a side wall of the first die 104 and along a side wall of the second die 106, and the fourth wall structure 116 is disposed along a side wall of the second die 106 and along a side wall of the third die 108.

In the implementation shown in FIG. 1A, a first compartment 130 (e.g., a first cavity) that includes the first die 104 is defined between the first wall structure 110 and the third wall structure 114, a second compartment 132 (e.g., a second cavity) that includes the second die 106 is defined between the third wall structure 114 and the fourth wall structure 116, and a third compartment 134 (e.g., a third cavity) that includes the third die 108 is defined between the fourth wall structure 116 and the second wall structure 112. Each of the compartments 130-134 extend between the substrate 102 on the bottom and the cover layer 124 on the top. The third wall structure 114 and the fourth wall structure 116 are configured to provide an electromagnetic barrier between adjacent compartments. For example, the third wall structure 114 may be configured to provide an electromagnetic barrier for the first die 104 (and the first compartment 130) from EMI generated by components within the second compartment 132. Similarly, the fourth wall structure 116 may be configured to provide an electromagnetic barrier for the third die 108 (and the third compartment 134) from EMI generated by components within the second compartment 132. Additionally, the third wall structure 114 and the fourth wall structure 116 may be configured to provide an electromagnetic barrier for the second die 106 (and the second compartment 132) from EMI generated by components within the first compartment 130 and the third compartment 134.

In some implementations, the compartment EMI shielding structures are multi-layer wall structures, also referred to as vertical laminate components, that include conductive and dielectric layers that are configured to provide compartmental EMI shielding. To illustrate, the third wall structure 114 may include a first vertical metal layer 140, a second vertical metal layer 142, and a vertical dielectric layer 144 between the first vertical metal layer 140 and the second vertical metal layer 142. Similarly, the fourth wall structure 116 may include a vertical dielectric layer between two vertical metal layers. In other implementations, the third wall structure 114 and the fourth wall structure 116 may include more than two metal layers and more than one dielectric layer, or an interior dielectric may be surrounded by a metal coating. In some implementations, the multi-layer wall structures are formed from a metal coated laminate substrate that is cut and positioned vertically, as further described herein with reference to FIGS. 5A-F. In such implementations, existing laminate preparation processes can be re-used to form the multi-layer wall structures (e.g., the third wall structure 114 and the fourth wall structure 116). Such vertical laminate components with metal layers may provide better EMI shielding capability with a smaller footprint than wire bond Faraday cages used to provide EMI shielding in other semiconductor packages.

The package side wall EMI shielding structures (e.g., the first wall structure 110 and the second wall structure 112), also referred to as mold side wall EMI shielding structures or mold side wall structures, may be disposed along side walls of the package that forms the device 100. For example, the first wall structure 110 may be disposed along a first side wall 160 (e.g., the left side wall in the orientation shown in FIG. 1A) of the package, such that the first wall structure 110 is disposed between the first side wall 160 and the first die 104. As another example, the second wall structure 112 may be disposed along a second side wall 162 (e.g., the right side wall in the orientation shown in FIG. 1A) of the package, such that the second wall structure 112 is disposed between the second side wall 162 and the third die 108. Because the wall structures 110 and 112 are disposed between a respective die and a respective side wall, the wall structures 110 and 112 are also disposed along a side wall of the respective die. For example, the first wall structure 110 is disposed along a side wall of the first die 104, and the second wall structure 112 is disposed along a side wall of the third die 108.

In some implementations, the first wall structure 110 is a unitary wall structure and the second wall structure 112 is a unitary wall structure. As used herein, a unitary wall structure refers to a wall structure that is not formed from bonding multiple layers together as a laminate or other multi-layer structure. These unitary wall structures may be electrically conductive to provide EMI shielding capabilities. For example, the first wall structure 110 and the second wall structure 112 may include metal, a metal alloy, or another conductive material. The thickness of the wall structures 110 and 112 may be tunable by controlling parameter(s) of a design process, as further described herein, and may be thicker than conventional sidewall EMI shielding formed by depositing the cover layer 124 on the side walls (e.g., side walls 160, 162) of the package at the unit level of the fabrication process. In some implementations, the wall structures 110 and 112 are formed from metal cans that are attached to a substrate strip or panel along side dividing areas (e.g., “sawing streets”) that divide portions of the substrate strip or panel that are to be cut separately to form individual packages, as further described herein with reference to FIG. 2. The metal cans may include copper, another metal, a metal alloy, or a combination thereof. The metal cans (or other metal structures) may have a variety of shapes, as described further herein with reference to FIGS. 3A-C. The upper portions of such metal cans may be removed by grinding a surface of the mold compound 122 down to a selected height of the wall structures 110 and 112, as further described herein with reference to FIGS. 7A-D and 8A-C.

The wall structures 110 and 112 are configured to provide EMI shielding for components of the device 100 (e.g., the package) from other IC devices or semiconductor packages adjacent to the device 100 and/or to provide EMI shielding to prevent EMI generated by components of the device 100 from interfering with adjacent IC devices or semiconductor packages. For example, the first wall structure 110 may be configured to provide an electromagnetic barrier to reduce or prevent EMI generated by the dies 104-108 from interfering with other IC devices adjacent to the first side wall 160 of the package (e.g., adjacent to the first wall structure 110) and/or an electromagnetic barrier for the device 100 from EMI generated by other IC devices adjacent to the first side wall 160 of the package. As another example, the second wall structure 112 may be configured to provide an electromagnetic barrier to reduce or prevent EMI generated by the dies 104-108 from interfering with other IC devices adjacent to the second side wall 162 of the package (e.g., adjacent to the second wall structure 112) and/or an electromagnetic barrier for the device 100 from EMI generated by other IC devices adjacent to the second side wall 162 of the package.

In some implementations, a layer of the mold compound 122 is disposed between the side walls 160 and 162 of the package that forms the device 100 and the respective wall structures 110 and 112. For example, there may be a thin layer of the mold compound 122 to the left of the first wall structure 110, between the first side wall 160 of the package and the first wall structure 110. As another example, there may be a thin layer of the mold compound 122 to the right of the second wall structure 112, between the second side wall 162 of the package and the second wall structure 112. These layers of the mold compound 122 may protect solder or other electrical interconnects for the wall structures 110 and 112 (e.g., to limit oxidation or to provide other environmental protection). In some other implementations, the wall structures 110 and 112 may have a different shape that prevents the solder or interconnects from being exposed, and the side walls of the packages may be cut up to the wall structures 110 and 112. For example, in such implementations, the first side wall 160 of the package corresponds to a face of the first wall structure 110, and the second side wall 162 corresponds to a face of the second wall structure 112, with no mold compound 122 between the wall structures 110, 112 and the respective side walls 160, 162 of the package.

The wall structures 110-116 may be electrically connected to the substrate 102 and to the cover layer 124. In some implementations, the wall structures 110-116 are electrically connected to the substrate 102 using solder or other interconnects. For example, the first wall structure 110 may be attached to the substrate 102 using illustrative solder 150 that electrically connects the first wall structure 110 to the substrate 102. The second wall structure 112, the third wall structure 114, and the fourth wall structure 116 may be similarly attached and electrically connected to the substrate 102 using respective instances of solder or other interconnects. In some implementations, the first wall structure 110 is electrically connected to the fifth wall structure 118, the second wall structure 112 is electrically connected to the sixth wall structure 120, the third wall structure 114 is electrically connected to one or more of the conductive pathways 126, and the fourth wall structure 116 is electrically connected to one or more of the conductive pathways 126. In other implementations, other connections between the wall structures 110-116 and components of the substrate 102 are possible. Additionally, the wall structures 110-116 are electrically connected to the cover layer 124 by exposing tops of the wall structures 110-116 and depositing the conductive material on the exposed portions to form the cover layer 124. For example, one or more grinding operations, such as strip grinding, one or more drilling operations, such as laser drilling, one or more other operations to remove some of the mold compound 122, or a combination thereof, may be performed to expose top surfaces of the wall structures 110-116, as further described herein, to enable deposition of the cover layer 124.

Figure 4A:
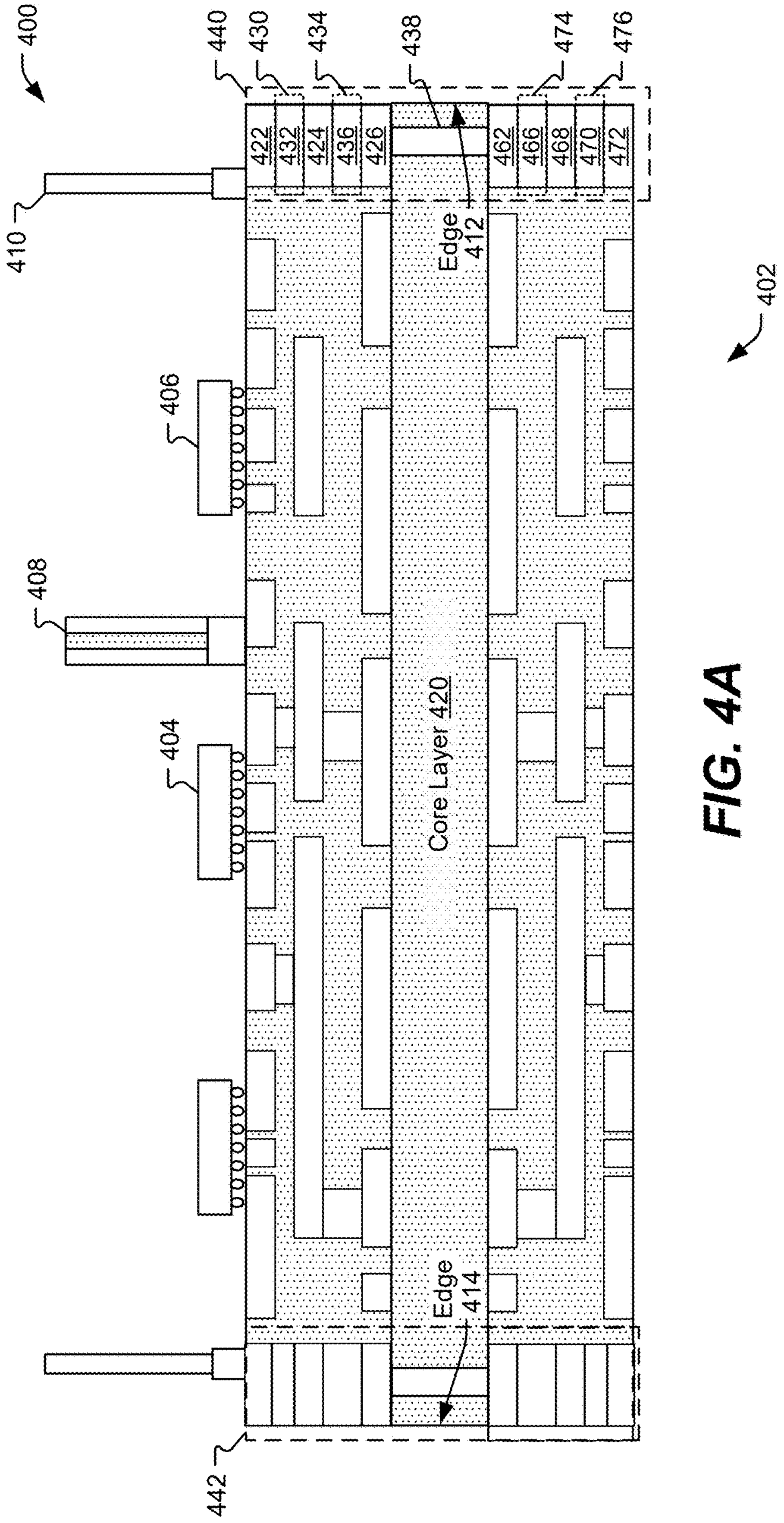
FIG. 4A illustrates a cross-sectional profile view of an exemplary device that includes one or more substrate EMI shielding structures.
Figure 4B:
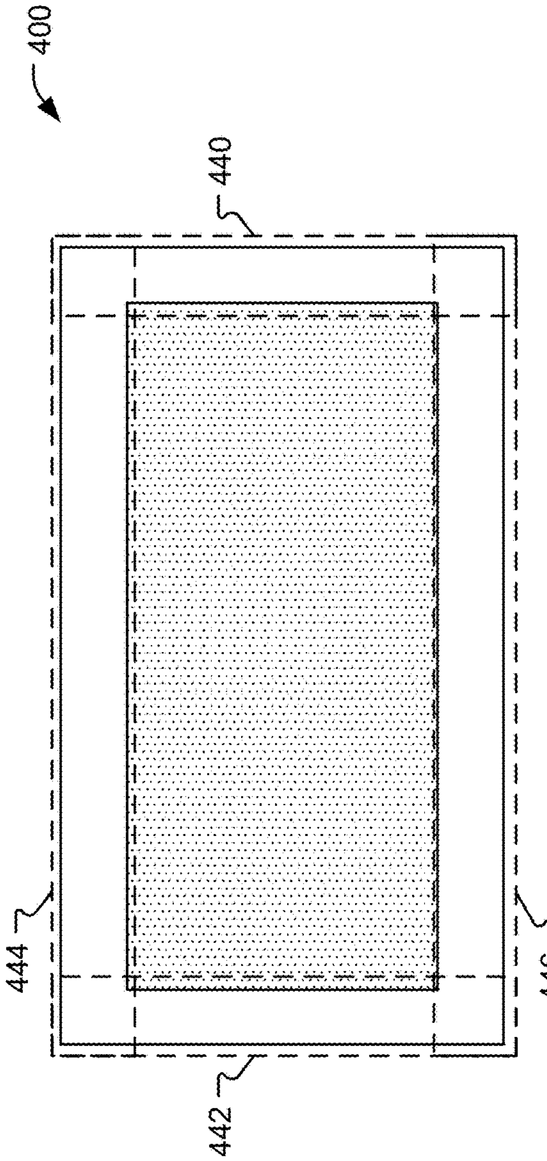
FIG. 4B illustrates a top cross-sectional view of an implementation of the exemplary device of FIG. 4A.
Figure 4C:
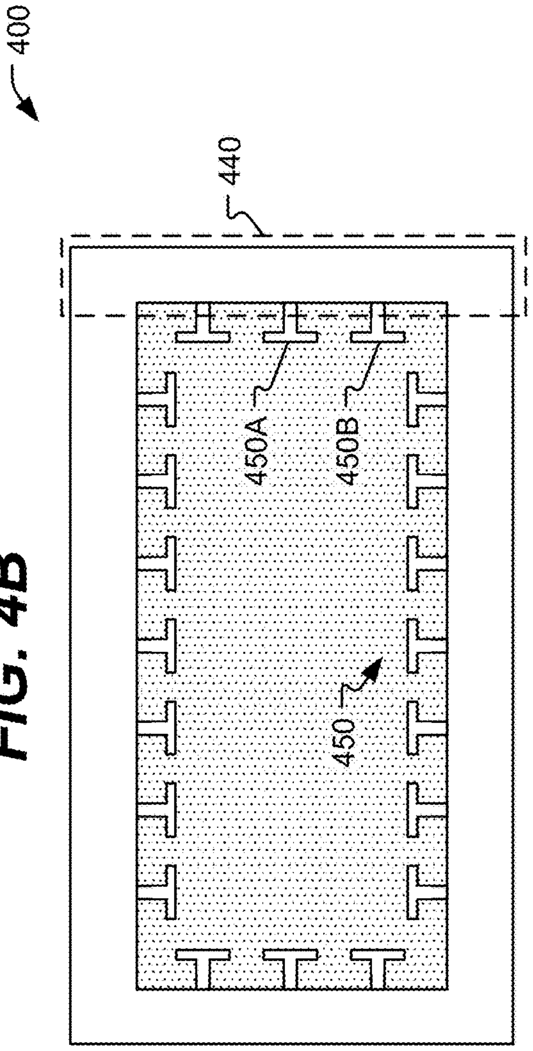
FIG. 4C illustrates a top cross-sectional view of another implementation of the exemplary device of FIG. 4A.

The substrate EMI shielding structures (e.g., the fifth wall structure 118 and the sixth wall structure 120), also referred to as substrate side wall structures or conductive sidewall structures, may be formed from one or more metal layers of the substrate 102 and metal material within cavities formed by one or more patterned dielectric layers of the substrate 102, as further described herein with reference to FIGS. 4A-C. Such patterned dielectric layers may include photo imageable dielectric (PID) material that can be patterned using a photo imaging process. The metal layers, the metal material, or both, may include a metal or a metal alloy. The thickness of the wall structures 118 and 120 may be tunable by controlling parameter(s) of a design process (e.g., a size of patterned regions of one or more PID layers), as further described herein, and may be thicker than conventional sidewall EMI shielding formed by depositing the cover layer 124 along the side edges of the substrate 102 at the unit level of the fabrication process.

In some implementations, the wall structures 118-120 form continuous walls along the entirety of respective edges of the substrate 102. For example, the fifth wall structure 118 can form a continuous wall along a first edge of the substrate 102 (the left edge in FIG. 1A, which corresponds to the above-described first side wall 160 of the package) and the sixth wall structure 120 can form a continuous wall along a second edge of the substrate 102 (the right edge in FIG. 1A, which corresponds to the above-described second side wall 162 of the package). In some implementations, the substrate 102 may include a core layer (e.g., a dielectric layer). In such implementations, the wall structure along each side wall can be divided into an upper wall structure that is above the core layer and a lower wall structure that is below the core layer, and the core layer can include one or more vias to electrically connect the upper wall structure and the lower wall structure, as further described herein with reference to FIGS. 4A-C.

FIG. 1B illustrates an external perspective view of an implementation of the device 100 in which the package side wall EMI shielding structures (e.g., the first wall structure 110 and the second wall structure 112 of FIG. 1A) extend to the side walls (e.g., side walls 160 and 162 of FIG. 1A) of the package (e.g., the device 100), such that no thin strip of the mold compound 122 is included between the side walls and the respective package side wall EMI shielding structures. Such an implementation may be formed using the metal structure described herein with reference to FIG. 3B. In implementations that use the metal structure described herein with reference to FIG. 3A, a small strip of the mold compound 122 surrounds the first wall structure 110. Thus, in such implementations, the first side wall 160 would include the fifth wall structure 118 and a portion of the mold compound 122, which would occlude a view of the first wall structure 110 in the view illustrated in FIG. 1B.

As shown in FIG. 1B, a first side wall 160 of the device 100 from the external view includes the first wall structure 110 (e.g., a first package side wall EMI shielding structure) disposed on the fifth wall structure 118 (e.g., a first substrate EMI shielding structure), and a top of the device 100 includes the cover layer 124. The first compartment 130 may be defined by one or more compartment EMI shielding structures, such as the illustrative third wall structure 114A and the illustrative third wall structure 114B. The indentations (e.g., cavities) in the cover layer 124 shown in FIG. 1B that correspond to the third wall structures 114 are due to additional drilling or other operations being performed to expose the surface of the third wall structures 114, as compared to the operations performed to expose the surface of the first wall structure 110, because in this implementation the height of the package side wall EMI shielding structures are greater than the height of the compartment EMI shielding structures, as further described herein with reference to FIGS. 7A-D. In some other implementations, the height of the third wall structures 114 and the height of the package side wall EMI shielding structures are the same, and in such implementations, no indentations are present in the cover layer 124.

FIG. 1C illustrates an external perspective view of another implementation of the device 100. The mold compound 122 has been omitted from the view illustrated in FIG. 1C. In this implementation, the package side wall EMI shielding structures (e.g., the first wall structure 110 and the second wall structure 112) do not extend the entirety of the length of the respective side walls (e.g., side walls 160 and 162) of the package (e.g., the device 100), and instead multiple package side wall EMI shielding structures are disposed along each side wall of the package. Such an implementation may be formed using the metal structure described herein with reference to FIG. 3C, with an additional overhang (not shown in FIG. 1C) or using multiple instances of either of the metal structures described with reference to FIG. 3A or 3B along each side wall.

As shown in FIG. 1C, the first side wall 160 of the device 100 from the external view includes multiple package side wall EMI shielding structures, such as an illustrative first wall structure 110A and an illustrative first wall structure 110B that are disposed along the first side wall 160 of the device 100. In some implementations, gaps between the first wall structures 110A and 110B, and other instances of the first wall structure 110, enable the mold compound 122 to flow between adjacent portions of the first wall structure 110 to facilitate formation of a substantially uniform layer of mold compound. Additionally, or alternatively, the sizes and/or locations of the gaps between the first wall structures 110A and 110B, and other portions of the first wall structure 110, may configure the first wall structure 110 to provide specific electromagnetic shielding properties. For example, the first wall structure 110 can be configured to block or permit particular electromagnetic frequencies. The size of the gaps can be tuned during a fabrication process by selection of a number of metal structures used to form the first wall structure 110, a width of the metal structures, a spacing of the metal structures, or a combination thereof.

It should be understood that the device 100 may include additional components, other components, fewer components, or a combination thereof, to support the functionality described herein. As non-limiting examples, the device 100 may include additional IC devices, additional layers, additional dies, additional packages, additional interconnects, additional structures, other components, different components, or a combination thereof, to support the functionality and technical advantages disclosed herein. In some implementations, the device 100 can be integrated in a smartphone, a tablet computer, a fixed location terminal device, an automobile, a wearable electronic device, a laptop computer, or some combination thereof, as described in more detail below with reference to FIG. 11.

While at least some of FIGS. 1A-C illustrate an example device that includes three types of EMI shielding structures, in other examples, fewer than three EMI shielding structures, more than three EMI shielding structures, one or more additional integrated devices, packages, or some combination thereof can be present in a stacked integrated circuit without departing from the scope of the subject disclosure. Further, the device 100 of FIGS. 1A-C can be integrated with or included within a wide variety of other devices. For example, a device that includes one or more of the device 100 disclosed herein can include components such as a power management integrated circuit (PMIC), an application processor, a modem, an RF device, a passive device, a filter, a capacitor, an inductor, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. In such devices, the device 100 can operate as any of these components (or a combination of these components) that includes active circuitry.

The device 100 thus provides similar EMI shielding effectiveness as conventional EMI shielding with reduced cost and complexity to fabricate. For example, the EMI shielding structures described with reference to FIGS. 1A-C (e.g., the wall structures 110-120) can be formed during the strip level of a fabrication process, which enables scaling of EMI shielding to multiple packaging without the additional costs and complexity of forming EMI shielding structures at the unit level, or relying on a five sided coating of material to provide all EMI shielding for each package. Such a coating process, which typically involves coating the top and each of the four sides of a package with the same material as used to form the cover layer 124 can result in very thin (e.g., only a few microns) uniform sidewall shielding thickness, poor sidewall adhesion, manufacturing defects such as metal bur and backspill, low throughput due to performing the EMI coating at the unit level, or a combination thereof. In contrast, the package side wall EMI shielding structures (e.g., the wall structures 110 and 112) and the substrate EMI shielding structures (e.g., the wall structures 118 and 120) of the device 100 have a tunable thickness from a few microns to a hundred microns, which can provide better sidewall adhesion through the use of thicker side walls, fewer manufacturing defects, and higher throughput, as compared to the other EMI shielding processes. Additionally, using vertical laminates (e.g., the wall structures 114 and 116) offers improved EMI shielding capability with a smaller substrate footprint as compared to using wire bond Faraday cages to provide compartment-level EMI shielding. Another advantage is that particular types of the disclosed EMI shielding structures can be used individually to provide different granularity levels of EMI shielding for different product designs, such as omitting the compartment EMI shielding structures for applications that are expected to generate or experience less EMI, or including the compartment EMI shielding structures for compartments that include sensitive components. The above-described EMI shielding structures (e.g., the wall structures 110-120) can be used with existing EMI shielding techniques as well, thereby offering backward compatibility with other processes. A technical advantage of the EMI shielding structures (e.g., the wall structures 110-120) includes improved EMI shielding capability and selectable EMI shielding configurations that are more scalable and have greater yield and lower cost than other semiconductor package fabrication techniques that include EMI shielding. Such technical advantages may be especially beneficial for RF modules and any power device that has densely packed components that are sensitive to cross talk or other electromagnetic interference.

In a particular implementation, a device (e.g., the device 100) includes a substrate (e.g., the substrate 102). The device also includes one or more dies (e.g., the first die 104, the second die 106, and the third die 108) electrically connected to the substrate. The device includes a wall structure (e.g., the first wall structure 110 or the third wall structure 114) electrically connected to the substrate and extending along a side wall of at least one die (e.g., the first die 104) of the one or more dies and configured to provide an electromagnetic barrier for the at least one die. The device further includes a mold compound (e.g., the mold compound 122) at least partially encapsulating the one or more dies and the wall structure.

Figure 2:
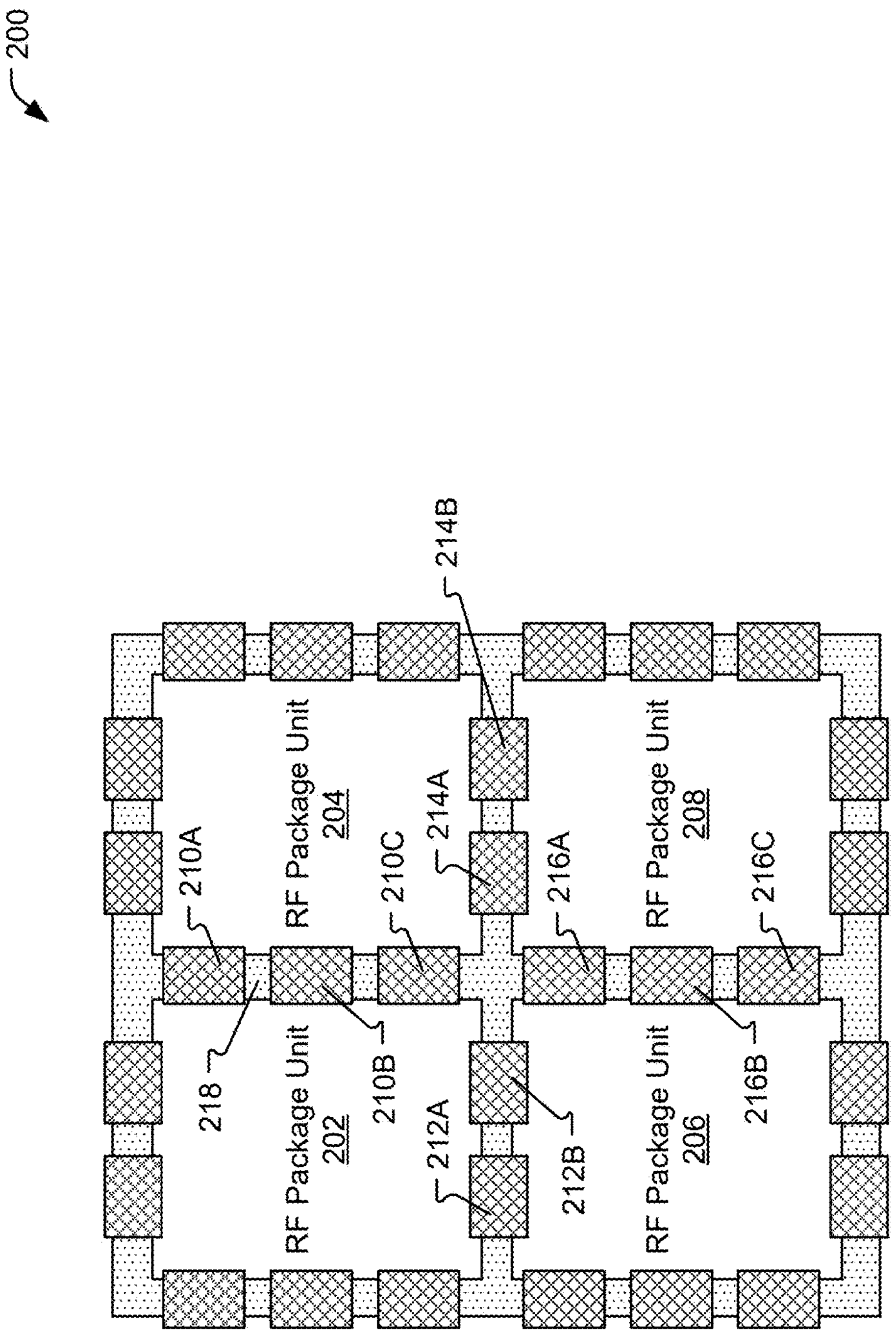
FIG. 2 illustrates a top view of a substrate that includes one or more metal structures that can be used to form EMI shielding structures between packages.

FIG. 2 illustrates a top view of a particular implementation of a substrate 200 that includes one or more metal structures that can be used to form EMI shielding structures between packages (e.g., semiconductor packages). In the example illustrated in FIG. 2, the substrate 200 includes a substrate panel which can be used to form four semiconductor packages concurrently. Alternatively, the substrate 200 can be a substrate strip, the substrate 200 can be used to form fewer than four or more than four semiconductor packages, or a combination thereof. In some implementations, the substrate 200 of FIG. 2 represents an intermediate stage of a fabrication process that forms the device 100 of FIGS. 1A-C.

In the example shown in FIG. 2, the substrate 200 includes multiple regions that are designated to form semiconductor packages (e.g., RF packages or modules) and that may include one or more components formed thereon, such as dies, transistors, inductors, resistors, capacitors, other wall structures, or a combination thereof (not shown in FIG. 2 for convenience). For example, the substrate 200 may include a first RF package unit 202, a second RF package unit 204, a third RF package unit 206, and a fourth RF package unit 208. Although four RF package units are shown in FIG. 2, in other implementations, the substrate 200 may be divided into fewer than four or more than four RF package units.

The substrate 200 also includes multiple metal structures that are attached to the substrate 200 in the various RF package units and that span intermediate regions between RF package units, referred to as "sawing streets" as these regions are to be cut to form the individual RF packages during a fabrication process. For example, the substrate 200 may include one or more metal structures 210 having ends attached to the first RF package unit 202 and the second RF package unit 204, one or more metal structures 212 having ends attached to the first RF package unit 202 and the third RF package unit 206, one or more metal structures 214 having ends attached to the second RF package unit 204 and the fourth RF package unit 208, and one or more metal structures 216 having ends attached to the third RF package unit 206 and the fourth RF package unit 208. The metal structures 210-216 may be "metal cans" that include a metal, such as copper or aluminum, or a metal alloy and that span intermediate areas between respective RF package units to which the ends of the metal cans are attached.

As an illustrative example, a first end of a metal structure 210A may be attached to the first RF package unit 202, a second end of the metal structure 210A may be attached to the second RF package unit 204, and the metal structure 210A may span an illustrative sawing street 218 between the first RF package unit 202 and the second RF package unit 204. Similarly, each of the metal structures 210B, 210C may have a respective first end attached to the first RF package unit 202, a respective second end attached to the second RF package unit 204, and the metal structures 210B, 210C may span the sawing street 218. The metal structures 212-216 may similarly span sawing streets between the first RF package unit 202 and the third RF package unit 206, between the second RF package unit 204 and the fourth RF package unit 208, and between the third RF package unit 206 and the fourth RF package unit 208, respectively.

The metal structures 210-216 may be u-shaped metal cans (e.g., metal structures having a u-shape). Particular implementations of the metal structures are described herein with reference to FIGS. 3A-C. As an illustrative example, the metal structures 210-216 may each be a u-shaped structure that includes at least a first portion that attaches to one RF package unit, a second portion that attaches to another RF package unit, and a third portion (e.g., an upper portion) that is substantially orthogonal to and connects the first portion and the second portion. After the metal structures 210-216 are attached to the substrate 200 at the various RF package units, and the mold compound is deposited, grinding operations can be performed to remove upper portions (e.g., the third portions) of the metal structures 210-216 (and portions of the mold compound) to cause the metal structures 210-216 to have a target height, as further described herein with reference to FIGS. 7A-D and 8A-C. The grinding also separates respective first portions and second portions of the metal structures 210-216 from each other, thereby forming package side wall EMI shielding structures. For example, a first portion of the metal structure 210A, after grinding away the third portion, may form the first wall structure 110 of FIGS. 1A-B or the first wall structure 110A of FIG. 1C.

Additionally, or alternatively, parameters associated with the metal structures 210-216 may be selected (e.g., tuned) to control aspects of wall structures or RF packages formed during fabrication. To illustrate, the size, quantity, and spacing of the metal structures 210-216 may be selected to enable a mold compound to flow and encapsulate the metal structures 210-216, to cause the EMI barrier provided by wall structures formed from portions of the metal structures 210-216 to permit or block certain frequencies of signals, or a combination thereof. For example, the size of the metal structures 210A, 210B, and 210C, as well as the spacing between the metal structure 210A and the metal structure 210B and the spacing between the metal structure 210B and the metal structure 210C may be selected such that a mold compound may uniformly encapsulate the portions of the metal structures 210 that are attached to the RF package units 202, 204 and/or to control aspects of the EMI shielding provided by wall structures formed from portions of the metal structures 210. The size of, and the spacing between, the metal structures 212, the metal structures 214, and the metal structures 216 may be similarly selected based on design considerations of the respective RF packages. Metal structures between different RF package units may have different sizes or spacing, or different numbers of metal structures may be attached between different RF package units. For example, the spacing between the metal structures 210 may be different than the spacing between the metal structures 216, and the metal structures 210 may include a different number (e.g., 3) of metal structures than the metal structures 212 (e.g., 2). Although three metal structures 210, two metal structures 212, two metal structures 214, and three metal structures 216 are shown in FIG. 2, in other implementations, the metal structures 210 may include fewer than three or more than three metal structures, the metal structures 212 may include fewer than two or more than two metal structures, the metal structures 214 may include fewer than two or more than two metal structures, and the metal structures 216 may include fewer than three or more than three metal structures.

Figure 3B:
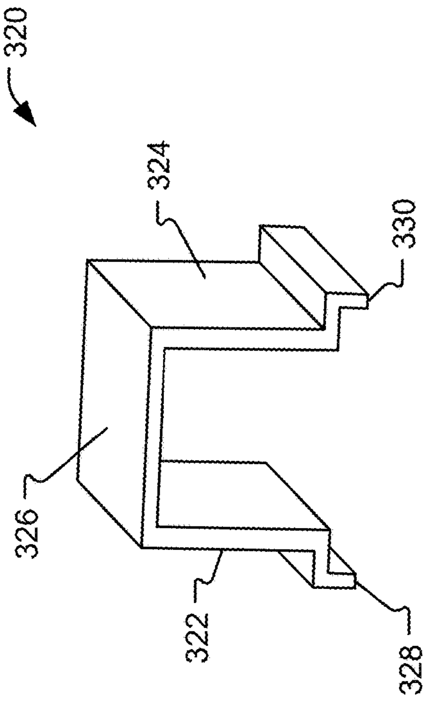
FIGS. 3A-C illustrate perspective views of examples of the metal structures of FIG. 2.
Figure 3A:
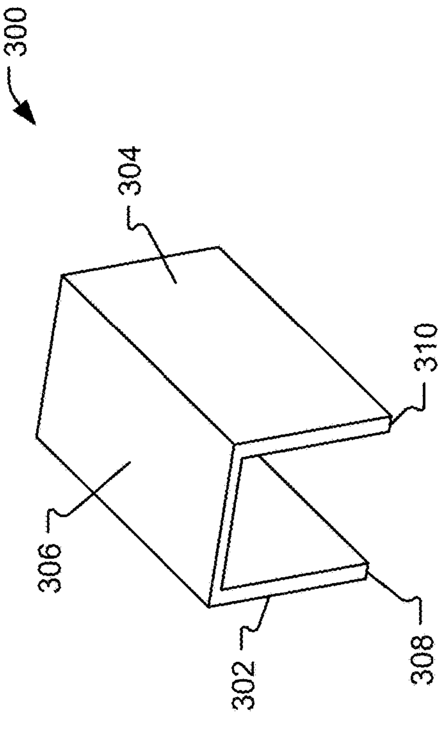
Figure 3C:
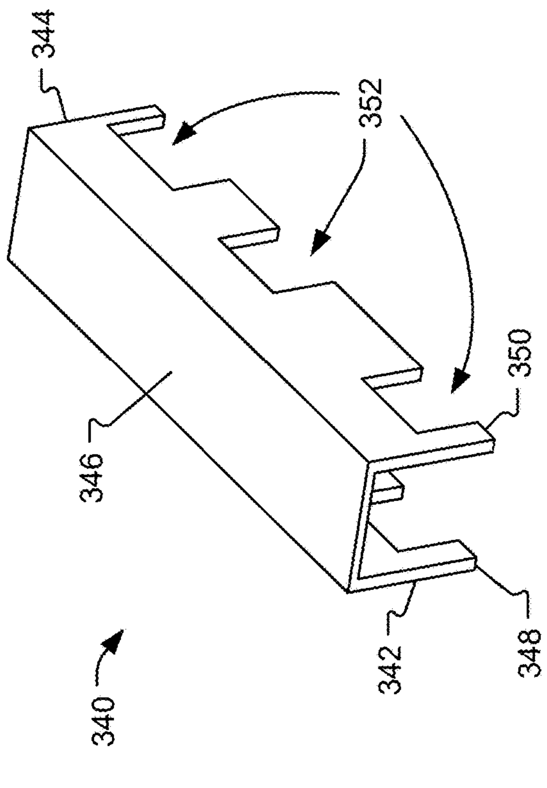

FIGS. 3A-C illustrate perspective views of examples of the metal structures that can be used to form EMI shielding structures between packages described with reference to FIG. 2. FIG. 3A depicts a metal structure 300, FIG. 3B depicts a metal structure 320, and FIG. 3C depicts a metal structure 340. Any of the metal structures 300, 320, or 340 may include or correspond to any of the metal structures 210-216 of FIG. 2 that are disposed on the substrate 200 between two units designated to become different packages (e.g., the metal structures 300, 320, or 340 may span a sawing street of the substrate, such as the sawing street 218). In some implementations, the metal structures 300, 320, and/or 340 are formed using a bending or metal shaping process. In other implementations, the metal structures 300, 320, and/or 340 are formed using other techniques (e.g., extrusion).

The metal structure 300 of FIG. 3A is a u-shaped "metal can" that is configured to be attached to a substrate for use in forming package side wall EMI shielding structures. The metal structure 300 may include a first portion 302, a second portion 304 that extends substantially parallel to the first portion 302, and a third portion 306 that extends substantially orthogonal to and connects the first portion 302 and the second portion 304, thereby forming a u-shape. In some implementations, a first end 308 of the first portion 302 is attached to a substrate at a first location (e.g., a first RF package unit) and a first end 310 of the second portion 304 is attached to the substrate at a second location (e.g., a second RF package unit).

During fabrication of a semiconductor package, the top surface of the metal structure 300, and any encapsulating mold material, may be removed (e.g., via grinding) to expose a top surface of the metal structure 300. For example, strip grinding may be performed to remove the third portion 306 and optionally some of the top of the first portion 302 and the second portion 304 to achieve a target height of the first portion 302 and the second portion 304. After removing the third portion 306, the first portion 302 may form a package side wall EMI shielding structure (e.g., a wall structure) for a first semiconductor package, and the second portion 304 may form a package side wall EMI shielding structure (e.g., a wall structure) for a second semiconductor package. Details of such fabrication processes are further described herein with reference to FIGS. 7A-D and 8A-C.

The metal structure 320 of FIG. 3B is a modified u-shaped metal can that is configured to be attached to a substrate for use in forming package side wall EMI shielding structures. The metal structure 320 may include a first portion 322, a second portion 324, and a third portion 326 that connects the first portion 322 and the second portion 324. Two portions of the metal structure 320 may each form an offset bend. For example, the first portion 322 forms an offset bend near a first end 328, and the second portion 324 forms an offset bend near a first end 330, such that the metal structure 320 has a modified u-shape. The offset bend may also be referred to as a z-shape, such that the first end 328 of the first portion 322 and the first end 330 of the second portion 324 each form a respective z-shape at the ends of the modified u-shape of the metal structure 320. In some implementations, the first end 328 of the first portion 322 is attached to a substrate at a first location (e.g., a first RF package unit) and the first end 330 of the second portion 324 is attached to the substrate at a second location (e.g., a second RF package unit).

The modified u-shape of the metal structure 320 may enable semiconductor packages to be cut up to the package side wall EMI shielding structures while still protecting solder that connects the package side wall EMI shielding structures to a substrate from being exposed during the cutting. To illustrate, because the first end 328 of the first portion 322 is offset a distance away from a remainder of the first portion 322 due to the offset bend, solder that connects the first end 328 to the substrate is offset from the edge of the remainder of the first portion 322. Because the solder is offset, mold compound may fill a recess underneath the offset bend such that, after the third portion 326 is removed, a semiconductor package that includes the first portion 322 can be cut up to the edge of the remainder of the first portion 322 without exposing the solder. In such implementations, a thin layer of the mold compound is not needed between the edge of the package and the side wall EMI shielding structure formed from the first portion 322 to protect the connecting solder from being exposed.

The metal structure 340 of FIG. 3C is a longer u-shaped metal can than either the metal structure 300 or the metal structure 320 that includes cutouts to improve mold compound flow and optionally, to configure aspects of the EMI shielding provided by the metal structure 340. The metal structure 340 may include a first portion 342, a second portion 344 that extends substantially parallel to the first portion 342, and a third portion 346 that extends substantially orthogonal to and connects the first portion 342 and the second portion 344, thereby forming a u-shape. In some implementations, a first end 348 of the first portion 342 is attached to a substrate at a first location (e.g., a first RF package unit) and the second end 350 of the second portion 344 is attached to the substrate at a second location (e.g., a second RF package unit).

The metal structure 340 also includes one or more partial cut-outs 352 that are spaced along the first portion 342, the second portion 344, or both, along a direction that corresponds to side walls of packages that are to include the first portion 342 or the second portion 344. The partial cut-outs 352 may provide "venting" that allows a mold compound that is deposited on the metal structure 340 and other components during a fabrication process to more easily flow to an area between the first portion 342 and the second portion 344. Improving the mold compound flow may ensure that the mold compound sufficiently covers both sides of the first portion 342 and the second portion 344, and any solder used to attach the first end 348 and the second end 350 to a substrate, such that a cutting process to form multiple semiconductor packages does not expose the solder.

In some implementations, the partial cut-outs 352 are cut inward from the first end 348 of the first portion 342 and/or from the second end 350 of the second portion 344. Alternatively, the partial cut-outs 352 may be punched out or otherwise removed from an interior of the first portion 342 and/or the second portion 344. In some implementations, each of the partial cut-outs 352 has the same size (e.g., dimensions) as others of the partial cut-outs 352. Alternatively, at least some of the partial cut-outs 352 may have different dimensions than others of the partial cut-outs 352. In some implementations, the partial cut-outs 352 are uniformly spaced along a respective side of the metal structure 340. Alternatively, the spacing between adjacent cut-outs of the partial cut-outs 352 may be different for at least some of the partial cut-outs 352.

Additionally, or alternatively, parameters associated with the metal structure 340 may be selected (e.g., tuned) to control aspects of wall structures for RF packages formed from the metal structure 340. To illustrate, the size, quantity, and spacing of the partial cut-outs 352 may be selected to enable a mold compound to flow and encapsulate the metal structure 340, to cause the EMI barrier provided by wall structures formed from portions of the metal structure 340 to permit certain frequencies of signals, or a combination thereof. For example, the size of the partial cut-outs 352, as well as the spacing between the partial cut-outs 352 may be selected such that a mold compound may more easily encapsulate interior sides of the first portion 342 and the second portion 344 that are covered by the third portion 346 and/or to control aspects of the EMI shielding provided by wall structures formed from the first portion 342 and the second portion 344. In this manner, the metal structure 340 may provide the same tunable parameter capabilities as the multiple metal structures described above with reference to FIG. 2 while only requiring a single metal structure, which may reduce cost and complexity of the fabrication process.

FIG. 4A illustrates a cross-sectional profile view of an exemplary device 400 that includes one or more substrate EMI shielding structures. FIG. 4B illustrates a top cross-sectional view of an implementation of the exemplary device 400 of FIG. 4A. FIG. 4C illustrates a top cross-sectional view of another implementation of the exemplary device 400 of FIG. 4A.

In the implementation shown in FIG. 4A, the device 400 includes a substrate 402, one or more dies that are electrically connected to the substrate 402, and one or more wall structures that are electrically connected to the substrate 402. The one or more dies are electrically connected to a first side (e.g., the top, in the orientation shown in FIG. 4A) of the substrate 402, such as an illustrative first die 404 and a second die 406. The one or more wall structures are attached to the first side of the substrate 402, such as an illustrative first wall structure 408 and a second wall structure 410. The first wall structure 408 may be disposed between the first die 404 and the second die 406, and the second wall structure 410 may extend along an edge 412 of the substrate 402 (e.g., parallel to a side wall of a package of the device 400). The one or more wall structures may include package side wall EMI shielding structures, compartment EMI shielding structures, or both. As an illustrative example, the first wall structure 408 may be a compartment EMI shielding structure (e.g., the first wall structure 408 may include or correspond to the third wall structure 114 or the fourth wall structure 116 of FIG. 1A) and the second wall structure 410 may be a package side wall EMI shielding structure (e.g., the second wall structure 410 may include or correspond to the first wall structure 110 or the second wall structure 112 of FIG. 1A). The device 400 may also include a mold compound that at least partially encapsulates the one or more dies and the one or more wall structures, and optionally other layers, which are not shown in FIG. 4A for clarity.

The substrate 402 includes multiple layers and components to enable electrical connections between components on the first side and/or the second side of the substrate 402. At least some of the multiple layers of the substrate form substrate EMI shielding structures. In the implementation shown in FIG. 4A, the substrate 402 includes a core layer 420, multiple layers on a first side (e.g., the top, in the orientation shown in FIG. 4A) of the core layer 420, and multiple layers on a second side (e.g. a bottom) of the core layer 420. In this implementation, the layers on the first side of the core layer 420 include a first metal layer that includes at least a first patterned portion 422, a first dielectric layer below the first metal layer, a second metal layer that is below the first dielectric layer and includes at least a second patterned portion 424, a second dielectric layer below the second metal layer, and a third metal layer that includes at least a third patterned portion 426. The metal layers and dielectric layers generally alternate, such that the first dielectric layer is disposed between the first metal layer (including the first patterned portion 422) and the second metal layer (including the second patterned portion 424), and the second dielectric layer is disposed between the second metal layer (including the second patterned portion 424) and the third metal layer (including the third patterned portion 426). Each of the metal layers is patterned to define conductive traces, and conductive vias extend through the dielectric layers at various points to electrically connect conductive traces in one metal layer to conductive traces of another metal layer.

Further, in FIG. 4A, the layers on the second side of the core layer 420 are arranged in a similar manner to the layers on the first side of the core layer 420 (e.g., including metal layers defining conductive traces and dielectric layers therebetween) except that conductive traces and conductive vias of the layers on the second side can be arranged differently from the conductive traces and conductive vias of the layers on the first side. For example, the layers on the second side of the core layer 420 include a fourth metal layer that includes at least a fourth patterned portion 462, a third dielectric layer below the fourth metal layer, a fifth metal layer that is below the third dielectric layer and includes at least a fifth patterned portion 468, a fourth dielectric layer below the fifth metal layer, and a sixth metal layer that is below the fourth dielectric layer and includes at least a sixth patterned portion 472.

In some implementations, the dielectric layers are patterned dielectric layers that define one or more recesses between surrounding patterned portions of metal layers. In some examples, the dielectric layers include photo imageable dielectric (PID) materials that, using a photoimaging process, can be patterned to form features within the dielectric layers. For example, the dielectric layers may include thin film PID materials that can be placed using vacuum lamination and that can be patterned to form recesses using a photoimaging process. Conductive materials, such as metals or metal alloys, may be deposited within the recesses to form conductive sidewall structures that are disposed within the recesses and that extend to the edge 412, and these conductive sidewall structures may be part of a multi-layer structure that forms a substrate EMI shielding structure.

To illustrate a process of forming such a substrate EMI shielding structure, the first dielectric layer (e.g., a first patterned dielectric layer) may be formed on the second metal layer, such as using a vacuum lamination process or other formation process. Forming the first dielectric layer may also include performing a photoimaging process to pattern the first dielectric layer such that the first dielectric layer defines a first recess 430 along the edge 412 of the substrate 402 and on the second metal layer (e.g., over the second patterned portion 424). After forming the first dielectric layer, the process includes depositing a conductive material within the first recess 430 to form a first conductive sidewall structure 432 that is electrically connected to (e.g., in contact with) the first metal layer (e.g., with the first patterned portion 422) and with the second metal layer (e.g., with the second patterned portion 424) and that extends from the first dielectric layer (e.g., an interior of the substrate 402 in the example shown in FIG. 4A) to the edge 412 of the substrate 402.

The process also includes forming the second dielectric layer on the third metal layer, such as using a vacuum lamination process. A photoimaging process may be performed to pattern the second dielectric layer such that the second dielectric layer defines a second recess 434 along the edge 412 of the substrate 402 and on the third metal layer (e.g., over the third patterned portion 426). After forming the second dielectric layer, the process includes depositing a conductive material within the second recess 434 to form a second conductive sidewall structure 436 that is electrically connected to (e.g., in contact with) the second metal layer (e.g., with the second patterned portion 424) and with the third metal layer (e.g., with the third patterned portion 426) and that extends from the second dielectric layer (e.g., an interior of the substrate 402 in the example shown in FIG. 4A) to the edge 412 of the substrate 402. This process may be performed from the core layer 420, or the third metal layer, up, such that an order of formation is the second dielectric layer and the second conductive sidewall structure 436, followed by the second metal layer and the second patterned portion 424, followed by the first dielectric layer and the first conductive sidewall structure 432, and ending with the first metal layer and the first patterned portion 422.

In some implementations, the above-described layers that are formed on the top of the core layer 420 may be formed on a carrier layer that is subsequently removed. For example, the carrier layer may include the core layer 420, or another type of carrier substrate, and after the metal layers (e.g., M1-M3, as a non-limiting example) and the dielectric layers are formed, the carrier layer (e.g., the core layer 420) may be peeled away, grinded off, or otherwise removed, such that the third metal layer (including the third patterned portion 426) may defines contacts for connecting to a printed circuit board (PCB) or other device. In such implementations, additional layers are not formed on the bottom of the carrier layer (e.g., the core layer 420).

In some implementations, additional metal layers and dielectric layers may be formed on a second side (e.g., the bottom, in the orientation shown in FIG. 4A) of the core layer 420. In this implementation, the layers on the second side of the core layer 420 include a fourth metal layer, a third dielectric layer, a fifth metal layer, a fourth dielectric layer, and a sixth metal layer. The illustrative process can include similar stages as described with reference to the first, second, and third metal layers and the first and second dielectric layers, which may include forming patterned portions of these metal layers and patterning these dielectric layers to form recesses that are filled with the conductive material to form additional conductive structures between the patterned portions. For example, the fourth metal layer may be patterned to form a fourth patterned portion 462, the fifth metal layer may be patterned to form a fifth patterned portion 468, and the sixth metal layer may be patterned to form a sixth patterned portion 472. In this example, a photoimaging process may be performed to pattern the third dielectric layer such that the third dielectric layer defines a third recess 474 along the edge 412 of the substrate 402 and under the fourth metal layer (e.g., below the fourth patterned portion 462). After forming the third dielectric layer, the process includes depositing a conductive material within the third recess 474 to form a third conductive sidewall structure 466 that is electrically connected to (e.g., in contact with) the fourth metal layer (e.g., with the fourth patterned portion 462) and with the fifth metal layer (e.g., with the fifth patterned portion 468) and that extends from the third dielectric layer (e.g., an interior of the substrate 402 in the example shown in FIG. 4A) to the edge 412 of the substrate 402. Similarly, the fourth dielectric layer may be patterned, using a photoimaging process, to define a fourth recess 476 along the edge 412 of the substrate 402 and under the fifth metal layer (e.g., below the fifth patterned portion 468), and a conductive material may be deposited within the fourth recess 476 to form a fourth conductive sidewall structure 470 that is electrically connected to (e.g., in contact with) the fifth metal layer (e.g., with the fifth patterned portion 468) and with the sixth metal layer (e.g., with the sixth patterned portion 472) and that extends from the fourth dielectric layer (e.g., an interior of the substrate 402 in the example shown in FIG. 4A) to the edge 412 of the substrate 402.

In some such implementations, corresponding layers on each side of the core layer 420 may be formed during the same stage(s). As an illustrative example, the second dielectric layer (e.g., formed on the third metal layer) and the third dielectric layer (e.g., formed on the fourth metal layer) may be formed and patterned during the same stage(s). Similarly, the second metal layer and the fifth metal layer may be formed and patterned during the same stage(s), the first dielectric layer and the fourth dielectric layer may be formed and patterned during the same stage(s), and the first metal layer and the sixth metal layer may be formed and patterned during the same stage(s). In some implementations, the core layer 420 may initially include metal films (e.g., the first metal layer and the fourth metal layer), and the process may be performed to build up the other layers. Alternatively, the core layer 420 may include only a substrate core, and the first and fourth metal layers, in addition to the other described layers, may be formed using the above-described patterning and formation process.

In implementations in which layers are formed on both sides of the core layer 420, the patterned portions of the metal layers and the conductive sidewall structures on each side of the core layer 420 are electrically connected by one or more conductive vias that extend through the core layer 420. For example, in FIG. 4A, the third patterned portion 426, the second conductive sidewall structure 436, the second patterned portion 424, the first conductive sidewall structure 432, and the first patterned portion 422 are electrically connected to the fourth patterned portion 462, the third conductive sidewall structure 466, the fifth patterned portion 468, the fourth conductive sidewall structure 470, and the sixth patterned portion 472 by one or more conductive vias 438 that extends through the core layer 420.

Electrically connecting the first patterned portion 422, the first conductive sidewall structure 432, the second patterned portion 424, the second conductive sidewall structure 436, and the third patterned portion 426 (and optionally the patterned portions of the metal layers and conductive structures on the opposite side of the core layer 420) forms a first substrate EMI shielding structure 440 that extends along an entirety of the edge 412 and that is configured to provide an electromagnetic barrier for at least a portion of the substrate 402. In some examples, the first substrate EMI shielding structure 440 includes the first patterned portion 422 of the first metal layer, the first conductive sidewall structure 432, the second patterned portion 424 of the second metal layer, the second conductive sidewall structure 436, and the third patterned portion 426 of the third metal layer. In implementations in which layers are built up on the bottom of the core layer 420, the first substrate EMI shielding structure 440 also includes the one or more conductive vias 438, the fourth patterned portion 462, the third conductive sidewall structure 466, the fifth patterned portion 468, the fourth conductive sidewall structure 470, and the sixth patterned portion 472. Similarly, a second substrate EMI shielding structure 442 that extends along an entirety of an opposite edge 414 of the substrate 402 may include other patterned portions of the same metal layers and similar conductive sidewall structures and via(s). In some implementations, additional substrate EMI shielding structures may be formed, in a similar manner, along edges of one or more designated regions within the core layer 420 such as sawing streets, as further described herein with reference to FIGS. 6A-C. In implementations in which the device 400 includes a semiconductor package having a rectangular shape, forming interconnected substrate EMI shielding structures along each of the four edges of the substrate 402 in the above-described manner results in a single, unitary substrate EMI shielding structure that is configured to provide an EMI barrier between components within the substrate 402 and adjacent semiconductor packages or other components.

FIG. 4B illustrates a top cross-sectional view of an implementation of the device 400 that includes a unitary substrate EMI shielding structure. As shown in FIG. 4B, the device 400 includes the first substrate EMI shielding structure 440 (e.g., that is formed along and extending to the edge 412 of the substrate 402), the second substrate EMI shielding structure 442 (e.g., that is formed along and extending to the opposite edge 414), a third substrate EMI shielding structure 444 (e.g., that is formed along and extending to a third edge), and a fourth substrate EMI shielding structure 446 (e.g., that is formed along and extending to a fourth edge). The substrate EMI shielding structures 440-446 represent portions of a single, unitary substrate EMI shielding structure that provides an EMI barrier for components of the substrate 402. Such a unitary substrate EMI shielding structure extends along an entirety of the edges of the substrate 402, as compared to conventional via fence walls, and therefore may provide increased EMI shielding as compared to the via fence walls.

FIG. 4C illustrates a top cross-sectional view of another implementation of the device 400 that includes the unitary substrate EMI shielding structure and that includes one or more anchor structures 450 coupled to the conductive sidewall structures that make up part of the substrate EMI shielding structure. In some implementations, each of the substrate EMI shielding structures that are formed along edges of the substrate may be coupled to one or more of the anchor structures 450. For example, illustrative anchor structures 450A and 450B may be coupled to the first substrate EMI shielding structure 440, as shown in FIG. 4C. The anchor structures 450 may include one or more metals, metal alloys, or other conductive materials that are the same or different as the materials of the conductive sidewall structures of the substrate EMI shielding structures. In some implementations, the anchor structures 450 may be formed in each of the various dielectric layers that include PID materials, using a similar photoimaging process as described above for the conductive sidewall structures.

The anchor structures 450 may be included in the device 400 to improve adhesion of the conductive sidewall structures to the device 400, or to otherwise prevent the conductive sidewall structures from being inadvertently removed or lost during particular stages of a fabrication process, such as cutting a substrate strip or a substrate panel into various portions to form individual semiconductor packages. In some implementations, the anchor structures 450 have a T-shape. In other implementations, the anchor structures 450 have other shapes that are designed to improve adhesion of the conductive sidewall structures to the device 400.

It should be understood that the device 400 of FIGS. 4A-C may include additional components, other components, fewer components, or a combination thereof, to support the functionality described herein. As non-limiting examples, the device 400 may include additional components attached to either surface of the substrate 402, additional EMI shielding structures attached to either surface of the substrate 402, conductive pathways within the substrate 402, other components, or a combination thereof. In some implementations, the device 400 of FIGS. 4A-C represents an intermediate stage of a fabrication process that forms the device 100 of FIGS. 1A-C. In some implementations, the device 400 can be integrated in a smartphone, a tablet computer, a fixed location terminal device, an automobile, a wearable electronic device, a laptop computer, or some combination thereof, as described in more detail below with reference to FIG. 11.

While FIGS. 4A-C illustrate an example device that includes three metal layers and two dielectric layers on each side of the core layer 420, and two substrate EMI shielding structures 440, 442, in other examples, fewer than three metal layers, more than three metal layers, fewer than three dielectric layers, more than three dielectric layers, a single substrate EMI shielding structure, more than two substrate EMI shielding structures, or some combination thereof can be present in the device 400 without departing from the scope of the subject disclosure. Further, the device 400 of FIGS. 4A-C can be integrated with or included within a wide variety of other devices. For example, the device 400 disclosed herein can include components such as a PMIC, an application processor, a modem, an RF device, a passive device, a filter, a capacitor, an inductor, a transmitter, a receiver, a GaAs-based integrated device, a SAW filter, a BAW filter, an LED integrated device, a Si-based integrated device, a SiC-based integrated device, a memory, power management processor, and/or combinations thereof.

The device 400 provides improved EMI shielding effectiveness as compared to semiconductor packages with conventional EMI shielding. For example, the substrate EMI shielding structures 440-446 may be thicker than an EMI shielding coating layer that is applied to conventional semiconductor packages, and thus provide greater EMI shielding capability. Such a coating process, which typically involves coating the sides of a package with an EMI shielding material can result in very thin (e.g., only a few microns) uniform sidewall shielding thickness, poor sidewall adhesion, and manufacturing defects such as metal bur and backspill. In contrast, the substrate EMI shielding structures 440-446 have a tunable thickness from a few microns to a hundred microns (e.g., due to appropriate sizing and patterning of the respective dielectric layers). Additionally, because the substrate EMI shielding structures 440-446 are integral with the metal layers and the dielectric layers of the substrate, the substrate EMI shielding structures 440-446 provide better sidewall adhesion than can be provided using a coating process. Moreover, the adhesion of the substrate EMI shielding structures 440-446 can be further improved through the use of the anchor structures 450. A technical advantage of the substrate EMI shielding structures 440-446 includes improved EMI shielding capability without significantly increasing cost or complexity of a semiconductor package fabrication process (e.g., due to the use of PID materials for dielectric layers of the substrate 402). Such technical advantages may be especially beneficial for RF modules and any power device that has densely packed components that are sensitive to cross talk or other electromagnetic interference.

In a particular implementation, a device (e.g., the device 400) includes a substrate (e.g., the substrate 402) that includes a first metal layer (e.g., the third patterned portion 426) and a second metal layer (e.g., the second patterned portion 424). The substrate also includes a dielectric layer (e.g., the second dielectric layer) disposed between the first metal layer and the second metal layer and defining a recess (e.g., the second recess 434) along an edge (e.g., the edge

412) of the substrate between the first metal layer and the second metal layer. The substrate further includes a conductive sidewall structure (e.g., the second conductive sidewall structure 436) electrically connected to the first metal layer and to the second metal layer. The conductive sidewall structure is disposed within the recess and extends to the edge of the substrate. Optionally, the device also includes a first die (e.g., the first die 404) electrically connected to the substrate and a second die (e.g., the second die 406) electrically connected to the substrate. The device may also include a first wall structure (e.g., the first wall structure 408) electrically connected to the substrate and extending between the first die and the second die and configured to provide an electromagnetic barrier between the first die and the second die. The device may also include a second wall structure (e.g., the second wall structure 410) electrically connected to the substrate and extending along a sidewall of the second die. The device may further include a mold compound at least partially encapsulating the first die, the second die, the first wall structure, and the second wall structure.

In some implementations, preparation of an EMI shielding structure, in particular a compartment EMI shielding structure can include several processes. FIGS. 5A-F illustrate an exemplary sequence for preparing a compartment EMI shielding structure to be attached to a device, as described with reference to any of FIGS. 1A-C, 2, 3A-C, and 4A-C. In some implementations, the sequence of FIGS. 5A-F may be used to prepare the third wall structure 114 or the fourth wall structure 116 of FIG. 1A or the first wall structure 408 of FIG. 4A for being attached to a substrate.

It should be noted that the sequence of FIGS. 5A-F may combine one or more stages in order to simplify and/or clarify the sequence for preparing a compartment EMI shielding structure (e.g., a multi-layer vertical wall structure). In some implementations, the order of the processes may be changed or modified. In some implementations, one or more of the processes may be replaced or substituted without departing from the scope of the disclosure. Each of the various stages of the sequence illustrated in FIGS. 5A-F shows a single compartment EMI shielding structure being prepared. In other implementations, a plurality of compartment EMI shielding structures may be prepared.

Figure 5A:
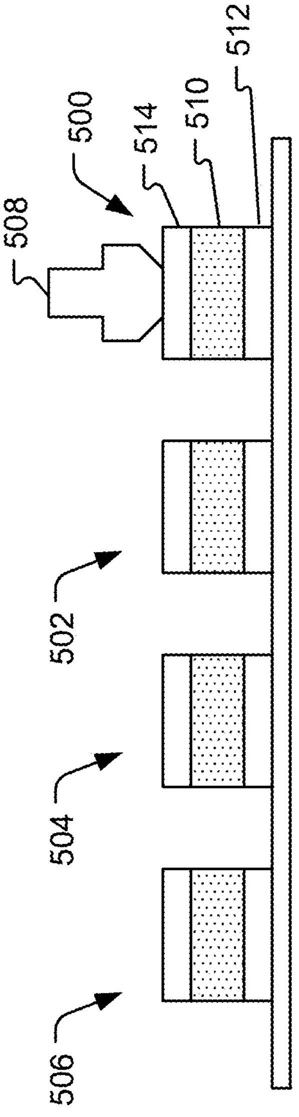
FIGS. 5A-F illustrate an exemplary sequence for preparing a compartment EMI shielding structure to be attached to a device.

A first stage of FIG. 5A illustrates a state after a laminate core with metal layers is cut (e.g., diced) into a plurality of laminate blocks and one is selected to be picked up. For example, as part of the first stage, a laminate may be cut into a first laminate block 500, a second laminate block 502, a third laminate block 504, and a fourth laminate block 506. Each of the laminate blocks 502-506 may include a dielectric layer 510 disposed between a first metal layer 512 and a second metal layer 514. In some implementations, the laminate that is cut into blocks may include a substrate core layer that includes a metal foil on each side, such that the dielectric layer 510 includes the substrate core layer and the first metal layer 512 and the second metal layer 514 include the metal foils. The first laminate block 500 may be picked up using a vacuum tool 508, or another tool.

Figure 5C:
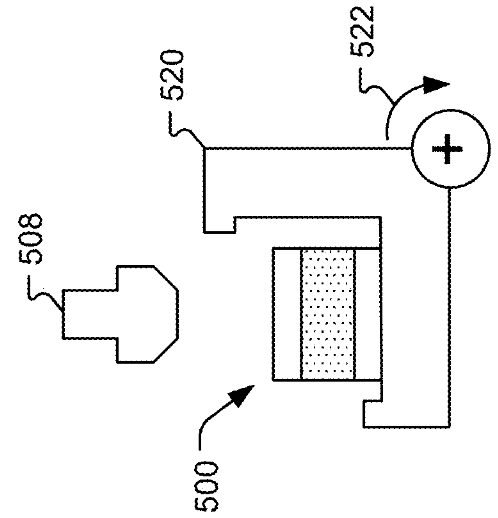
Figure 5B:
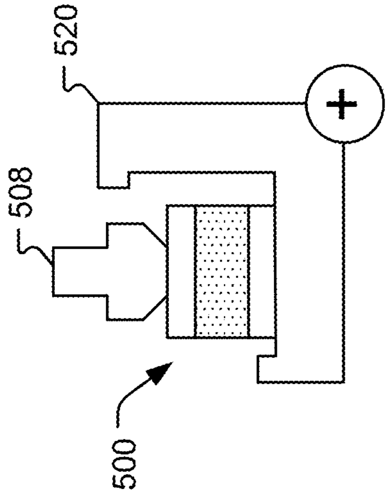

A second stage of FIG. 5B illustrates a state after the first laminate block 500 is placed on a jig 520. For example, as part of the second stage, the vacuum tool 508 may pick up the first laminate block 500, move the first laminate block 500 from a cutting area to the jig 520, and place the first laminate block 500 on the jig 520. Although described as using the jig 520, in other implementations, any tool capable of rotating a laminate block may be used.

A third stage of FIG. 5C illustrates a state after the vacuum tool 508 releases the first laminate block 500 on the jig 520. For example, as part of the third stage, the vacuum tool 508 may release the first laminate block 500 and move away from the jig 520. After the vacuum tool 508 is moved away, the jig 520 is prepared to rotate with the first laminate block 500 according to a rotation direction 522.

Figure 5D:
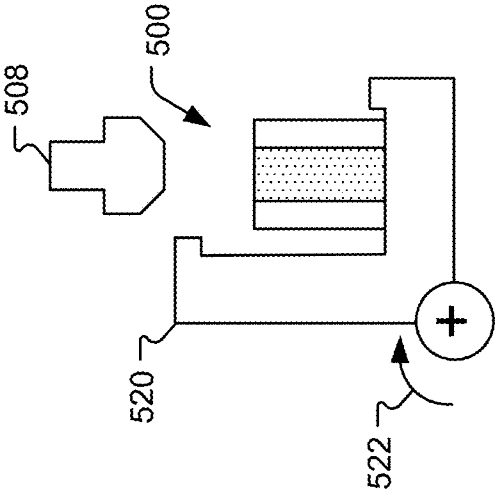

A fourth stage of FIG. 5D illustrates a state after the jig 520 is rotated according to the rotation direction 522. For example, as part of the fourth stage, the jig 520 may be rotated approximately 90° in the rotation direction 522, such that the first laminate block 500 is rotated from a horizontal orientation to a vertical orientation, as shown in FIG. 5D.

Figure 5E:
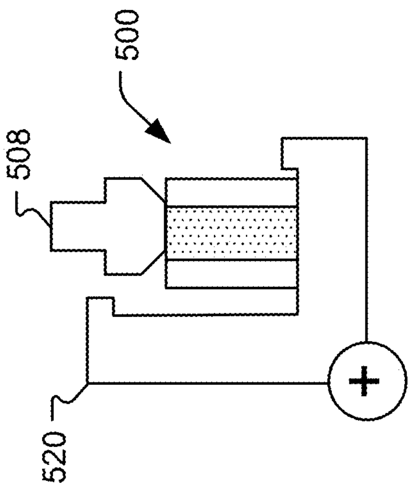

A fifth stage of FIG. 5E illustrates a state after the jig 520 completes the rotation and the vacuum tool 508 is re-attached to the first laminate block 500. For example, as part of the fifth stage, the vacuum tool 508 may be moved back to the jig 520 to pick up the first laminate block 500.

Figure 5F:
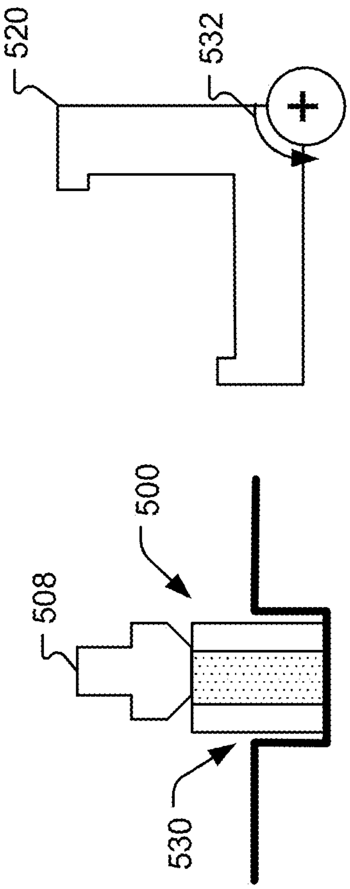

A sixth stage of FIG. 5F illustrates a state after the first laminate block 500 is moved onto a tape and reel pocket 530. For example, as part of the sixth stage, the vacuum tool 508 may move the first laminate block 500 (in the vertical orientation) to the tape and reel pocket 530 (or another tool or location to be used for transport and/or preparation for attaching to a substrate during a fabrication process for one or more semiconductor packages). Additionally, the jig 520 may be rotated according to a second rotation direction 532 to return the jig 520 to the original orientation shown in FIG. 5B. After completion of the sixth stage, the vacuum tool 508 may release the first laminate block 500 on the tape and reel pocket 530, and the first laminate block 500 may be transported and/or otherwise prepared for attaching to a substrate strip or a substrate panel. Additionally, the jig 520 is prepared to receive another laminate block provided by the vacuum tool 508 if additional laminate blocks are being prepared.

Exemplary Sequences for Fabricating a Device Including EMI Shielding Structure(s)

In some implementations, fabricating a device including one or more EMI shielding structures (e.g., any of the device 100 of FIGS. 1A-C and the device 400 of FIGS. 4A-C) includes several processes. FIGS. 6A-C, 7A-D, 8A-C, and 9A-C illustrate exemplary sequences for fabricating or providing a device that includes one or more EMI shielding structures, as described with reference to any of FIGS. 1A-C, 2, 3A-C, 4A-C, and 5A-F. In some implementations, the sequence of FIGS. 6A-C, 7A-D, 8A-C, and/or 9A-C may be used to provide (e.g., during fabrication of) one or more of the device 100 of FIGS. 1A-C, the substrate 200 of FIG. 2, or the device 400 of FIGS. 4A-C.

It should be noted that the sequence of FIGS. 6A-C, 7A-D, 8A-C, and/or 9A-C may combine one or more stages in order to simplify and/or clarify the sequence for providing or fabricating an integrated device. In some implementations, the order of the processes may be changed or modified. As an example, FIGS. 6A-C, 7A-D, 8A-C, and/or 9A-C show a particular order in which components are attached to, or deposited on, a substrate. In other implementations, one or more of the components may be attached to, or deposited on, the substrate in a different order. In some implementations, one or more of the processes may be replaced or substituted without departing from the scope of the disclosure. In the following description, reference is made to various illustrative Stages of the sequence, which are numbered (using circled numbers) in FIGS. 6A-C, 7A-D, 8A-C, and 9A-C. Each of the various stages of the sequence illustrated in FIGS. 6A-C, 7A-D, 8A-C, and 9A-C shows a plurality of integrated devices being formed. In other implementations, a single integrated device may be formed.

Figure 6A:
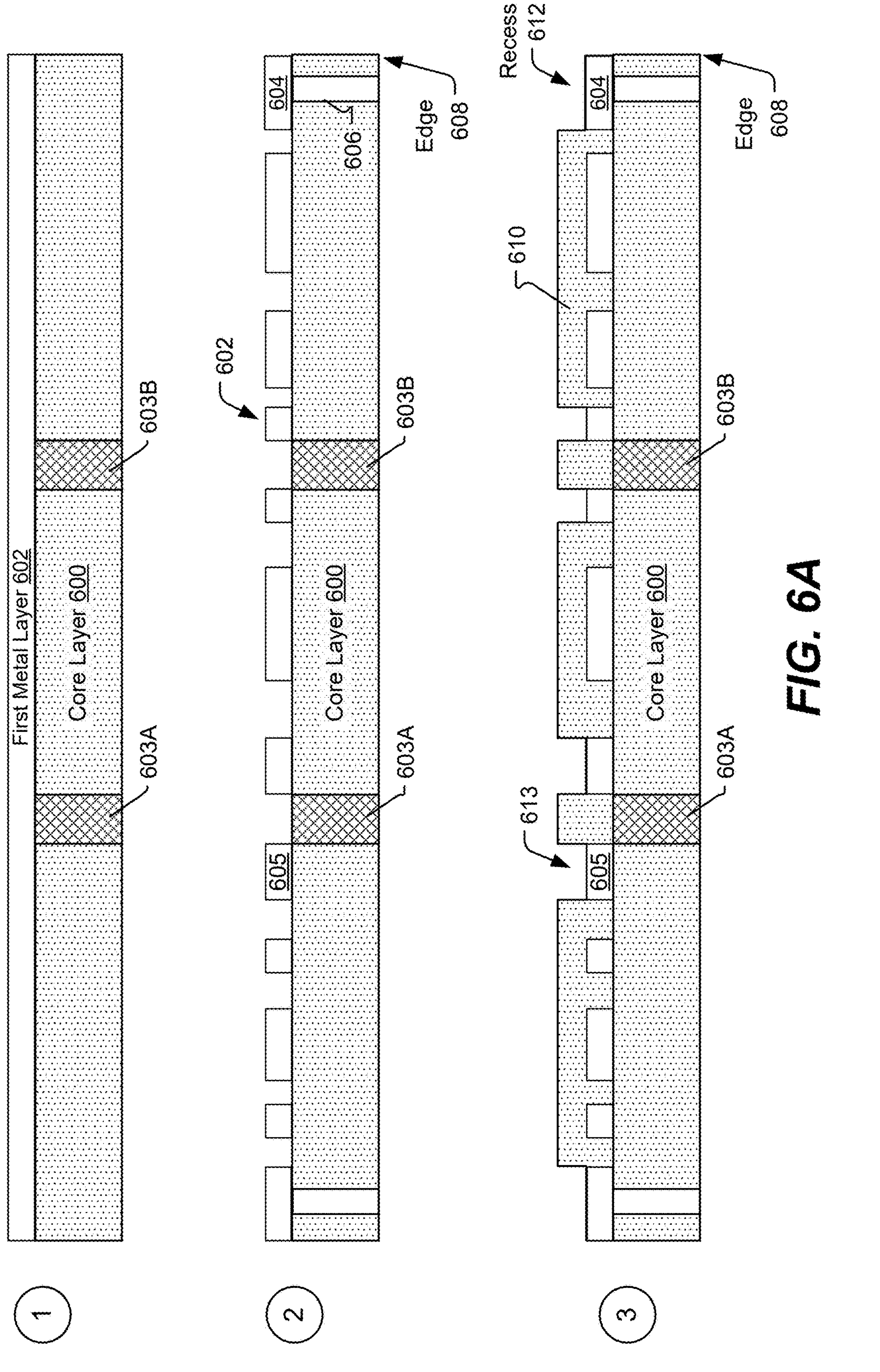
FIG. 6A illustrates a first part of an exemplary sequence for fabricating an exemplary device that includes one or more substrate EMI shielding structures.
Figure 6B:
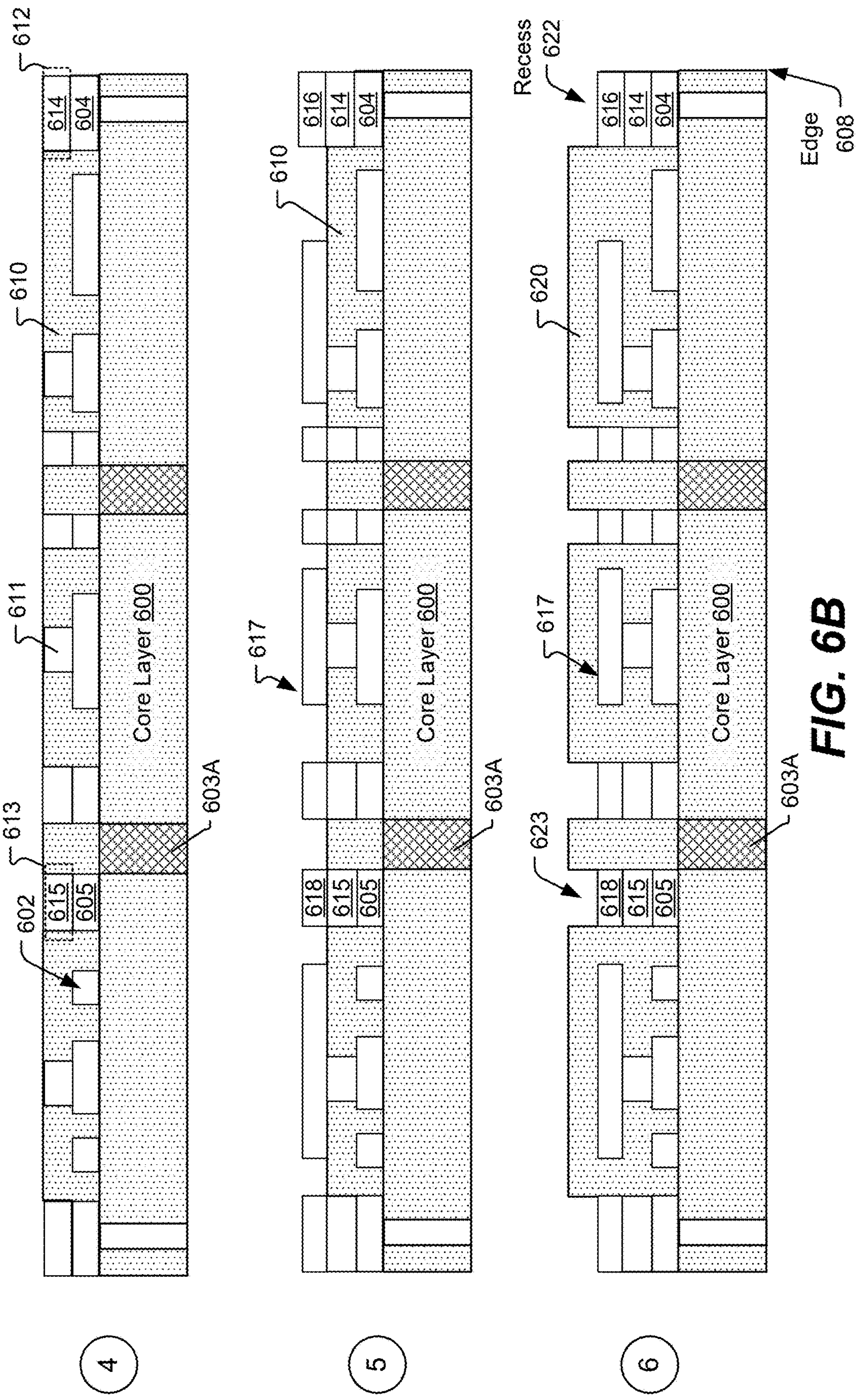
FIG. 6B illustrates a second part of an exemplary sequence for fabricating an exemplary device that includes one or more substrate EMI shielding structures.
Figure 6C:
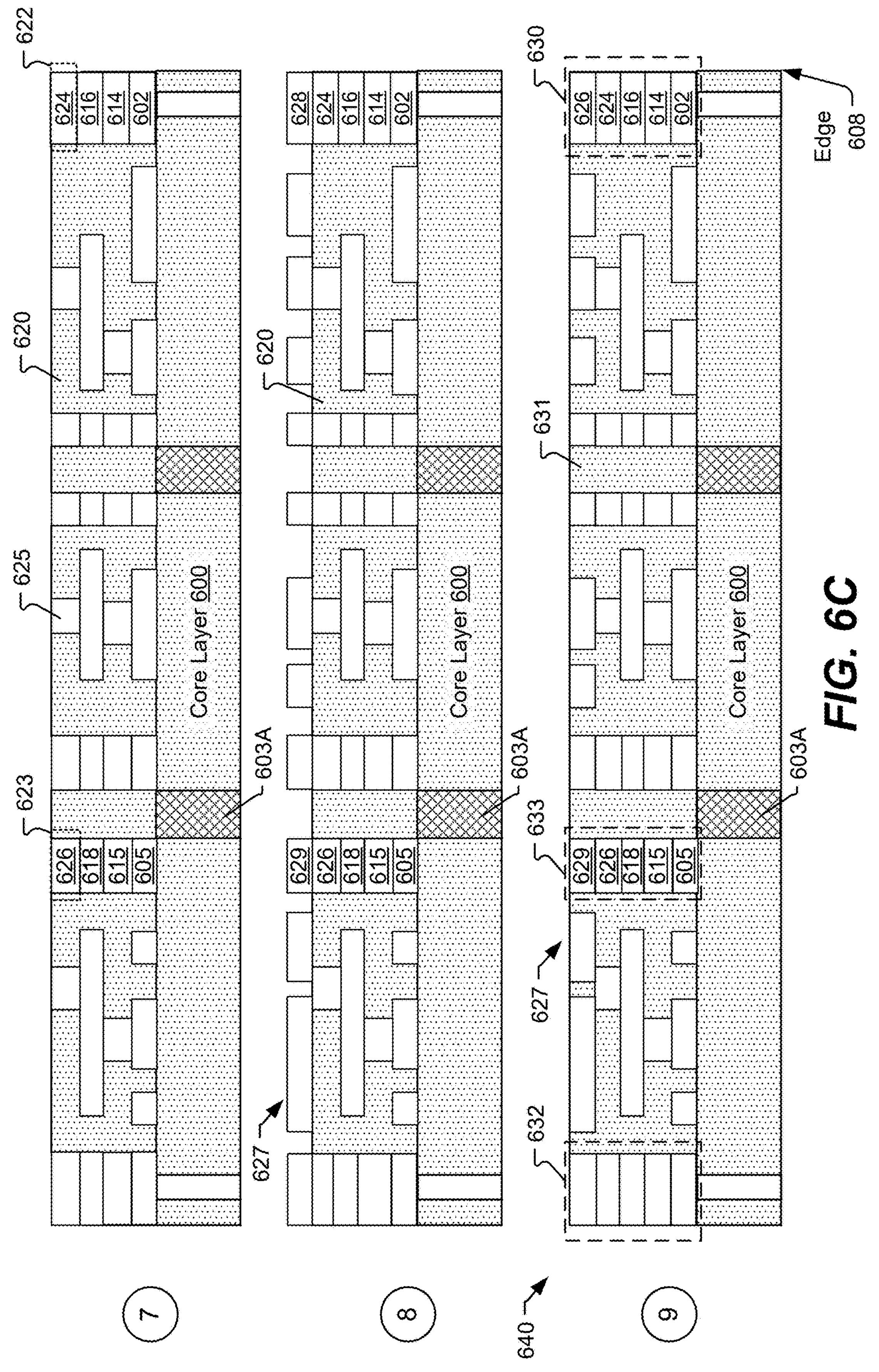
FIG. 6C illustrates a third part of an exemplary sequence for fabricating an exemplary device that includes one or more substrate EMI shielding structures.

In the description of FIGS. 6A-C, the various layers are described according to the order in which they are formed, in contrast to conventional descriptions of substrates in which layers are described in order from the topmost layer down. Thus, in FIG. 6A, a first metal layer 602 refers to the first layer applied to the core layer 600, which may correspond to a third metal layer (e.g., an M3 layer) or some other layer of the substrate according to conventional numbering schemes. Additionally, for ease of illustration, only layers formed on the top of the core layer 600 are illustrated and described with reference to FIGS. 6A-C; however, in some embodiments, layers are formed symmetrically on the core layer 600. For example, in such embodiments, the core layer 600 includes a dielectric material having two metal foils on opposite sides (e.g., a first metal layer 602 and another metal layer (not shown)). In embodiments in which a substrate is formed by arranging layers on only one side of the core layer 600, the core layer 600 can be replaced with another carrier layer that is removed from the stack of layers after formation of the substrate is complete.

Referring to FIGS. 6A-C, Stage 1 of FIG. 6A illustrates a state after a core layer 600 is prepared for forming one or more substrate EMI shielding structures. For example, as part of Stage 1, the core layer 600 may be provided. In other implementations, Stage 1 also includes forming the first metal layer 602 on a top surface of the core layer 600. In some implementations, one or more regions may be designated to be cut (e.g., sawed) during a fabrication process to form multiple semiconductor packages. These regions may be referred to as sawing streets, such as sawing streets 603 that include illustrative sawing street 603A and sawing street 603B.

Stage 2 illustrates a state after the first metal layer 602 has been patterned to form a first patterned metal layer. For example, as part of Stage 2, one or more metal patterning processes may be performed to pattern the first metal layer 602 into one or more conductive pathways, such as traces, to be used to electrically connect components of a semiconductor package. A first patterned portion 604 of the first metal layer 602 may be formed near an edge 608 of the core layer 600, and other patterned portions may be formed near other edges of the core layer 600. Additionally, patterned portions may be formed near edges of the sawing streets 603, such as a first interior patterned portion 605 near an edge of the sawing street 603A. In some implementations, the first patterned portion 604 includes or corresponds to the third patterned portion 426 of FIG. 4A. In some implementations, Stage 2 (or Stage 1) also includes forming one or more vias, such as an illustrative via 606, within the core layer 600. The via 606 may electrically connect one or more features on the top side of the core layer 600 with one or more features on the bottom side (not shown in FIGS. 6A-C). For example, the via 606 may correspond to one of the one or more conductive vias 438 of FIG. 4A.

Stage 3 illustrates a state after a first dielectric layer 610 is formed on the first patterned metal layer (including the first patterned portion 604). For example, as part of Stage 3, a PID material may be deposited on top of the core layer 600 and the first patterned metal layer to form the first dielectric layer 610. Stage 3 may also include patterning the first dielectric layer 610 to form one or more features. For example, a photo-imaging process may be performed to form a first recess 612 within the first dielectric layer 610. The first recess 612 may be on the first patterned portion 604 and extend from a non-patterned edge of the first dielectric layer 610 to the edge 608 of the core layer 600. The first recess 612 may extend along an entirety of the edge 608 (e.g., an entirety of a side wall of the substrate being formed). Further, the first patterned portion 604 can be exposed by the first recess 612. Similarly, patterned portions may be formed along other edges of the core layer 600 and/or along edges of the sawing streets 603. As an example, a first interior recess 613 may be defined within the first dielectric layer 610 that exposes the first interior patterned portion 605.

Stage 4 of FIG. 6B illustrates a state after a conductive material is deposited within one or more recesses defined by the first dielectric layer 610 to form one or more conductive sidewall structures. For example, as part of Stage 4, a conductive material such as copper, aluminum, or another metal or metal alloy may be deposited within the first recess 612 to form a first conductive sidewall structure 614 that extends to the edge 608 and along an entirety of the edge 608. In some implementations, because the first recess 612 exposed a top surface of the first patterned portion 604, the first conductive sidewall structure 614 is electrically connected to (e.g., in contact with) the first patterned portion 604. Other conductive sidewall structures may be similarly formed in recesses along other edges of the core layer 600 and/or the sawing streets 603. As an example, a first interior conductive sidewall structure 615 may be formed in the first interior recess 613. Additionally, or alternatively, Stage 4 may include forming one or more vias 611 in the first dielectric layer 610 to electrically connect conductive pathways or features of the first metal layer 602 to features of higher metal layers to be formed.

Stage 5 illustrates a state after a second patterned metal layer 617 is formed on the first dielectric layer 610. For example, as part of Stage 5, a metal or metal alloy may be deposited on the first dielectric layer 610 and patterned, using one or more metal patterning processes, to form one or more conductive pathways and one or more patterned portions to be used to form the substrate EMI shielding structure, such as an illustrative second patterned portion 616. The second patterned portion 616 may be formed near the edge 608, and other patterned portions may be formed near other edges of the core layer 600 and/or the sawing streets 603. Because the second patterned portion 616 is formed on the first conductive sidewall structure 614 without any intervening layers, the second patterned portion 616 may be electrically connected to (e.g., in contact with) the first conductive sidewall structure 614. As another example, a second interior patterned portion 618 may be formed near an edge of the sawing street 603A and be electrically connected to the first interior conductive sidewall structure 615.

Stage 6 illustrates a state after a second dielectric layer 620 is formed on the second patterned metal layer 617. For example, as part of Stage 6, a PID material may be deposited on top of the core layer 600, the first dielectric layer 610, and the second patterned metal layer 617 to form the second dielectric layer 620. Stage 6 may also include patterning the second dielectric layer 620 to form one or more features. For example, a photo-imaging process may be performed to form a second recess 622 within the second dielectric layer 620. The second recess 622 may expose the second patterned portion 616 and may extend to the edge 608. The second recess 622 may extend along an entirety of the edge 608 (e.g., an entirety of a side wall of the substrate being formed). Additional recesses may be formed along other edges of the core layer 600 and/or the sawing streets 603, such as a second interior recess 623 formed along an edge of the sawing street 603A that exposes the second interior patterned portion 618.

Stage 7 of FIG. 6C illustrates a state after a conductive material is deposited within one or more recesses defined by the second dielectric layer 620 to form one or more conductive sidewall structures. For example, as part of Stage 7, a conductive material such as copper, aluminum, or another metal or metal alloy may be deposited within the second recess 622 to form a second conductive sidewall structure 624 that extends to the edge 608 and along an entirety of the edge 608. In some implementations, because the second recess 622 exposed a top surface of the second patterned portion 616, the second conductive sidewall structure 624 is electrically connected to (e.g., in contact with) the second patterned portion 616. Other conductive sidewall structures may be similarly formed in recesses along other edges of the core layer 600 and/or the sawing streets 603. As an example, a second interior conductive sidewall structure 626 may be formed in the second interior recess 623. Additionally, or alternatively, Stage 7 may include forming one or more vias 625 in the second dielectric layer 620 to electrically connect conductive pathways or features of the lower layers to features of a higher metal layer to be formed. In some implementations, the second dielectric layer 620 and/or the first dielectric layer 610 may be patterned to form recesses used to form anchor structures, such as the anchor structures 450 described above with reference to FIG. 4C.

Stage 8 illustrates a state after a third patterned metal layer 627 is formed on the second dielectric layer 620. For example, as part of Stage 8, a metal or metal alloy may be deposited on the second dielectric layer 620 and patterned, using one or more metal patterning processes, to form one or more conductive pathways and one or more patterned portions to be used to form the substrate EMI shielding structure, such as an illustrative third patterned portion 628. The third patterned portion 628 may be formed near the edge 608, and other patterned portions may be formed near other edges of the core layer 600 and/or the sawing streets 603. Because the third patterned portion 628 is formed on the second conductive sidewall structure 624 without any intervening layers, the third patterned portion 628 may be electrically connected to (e.g., in contact with) the second conductive sidewall structure 624. As another example, a third interior patterned portion 629 may be formed near an edge of the sawing street 603A and be electrically connected to the second interior conductive sidewall structure 626.

Stage 9 illustrates a state after an additional dielectric layer or dielectric material 631 (e.g., a solder resist layer) is deposited on or around the third patterned metal layer 627. Formation of a substrate 640 that includes one or more of the exemplary substrate EMI shielding structures described herein is complete after Stage 9 of FIG. 6D. In the example shown in FIG. 6D, the substrate 640 includes a first substrate EMI shielding structure 630 that is disposed along the edge 608, a second substrate EMI shielding structure 632 that is disposed along an opposite edge of the core layer 600, and a third substrate EMI shielding structure 633 that is disposed along an edge of the sawing street 603A, as well as other substrate EMI shielding structures disposed along other edges of the core layer 600 and the sawing streets 603. In this example, the first substrate EMI shielding structure 630 includes the first patterned portion 604, the first conductive sidewall structure 614, the second patterned portion 616, the second conductive sidewall structure 624, and the third patterned portion 628 (and optionally a via through the core layer 600 and additional conductive structures on the bottom of the core layer 600). Similarly, the third substrate EMI shielding structure 633 includes the first interior patterned portion 605, the first interior conductive sidewall structure 615, the second interior patterned portion 618, the second interior conductive sidewall structure 626, and the third interior patterned portion 629 (and optionally a via through the core layer 600 and additional conductive structures on the bottom of the core layer 600).

Figure 7A:
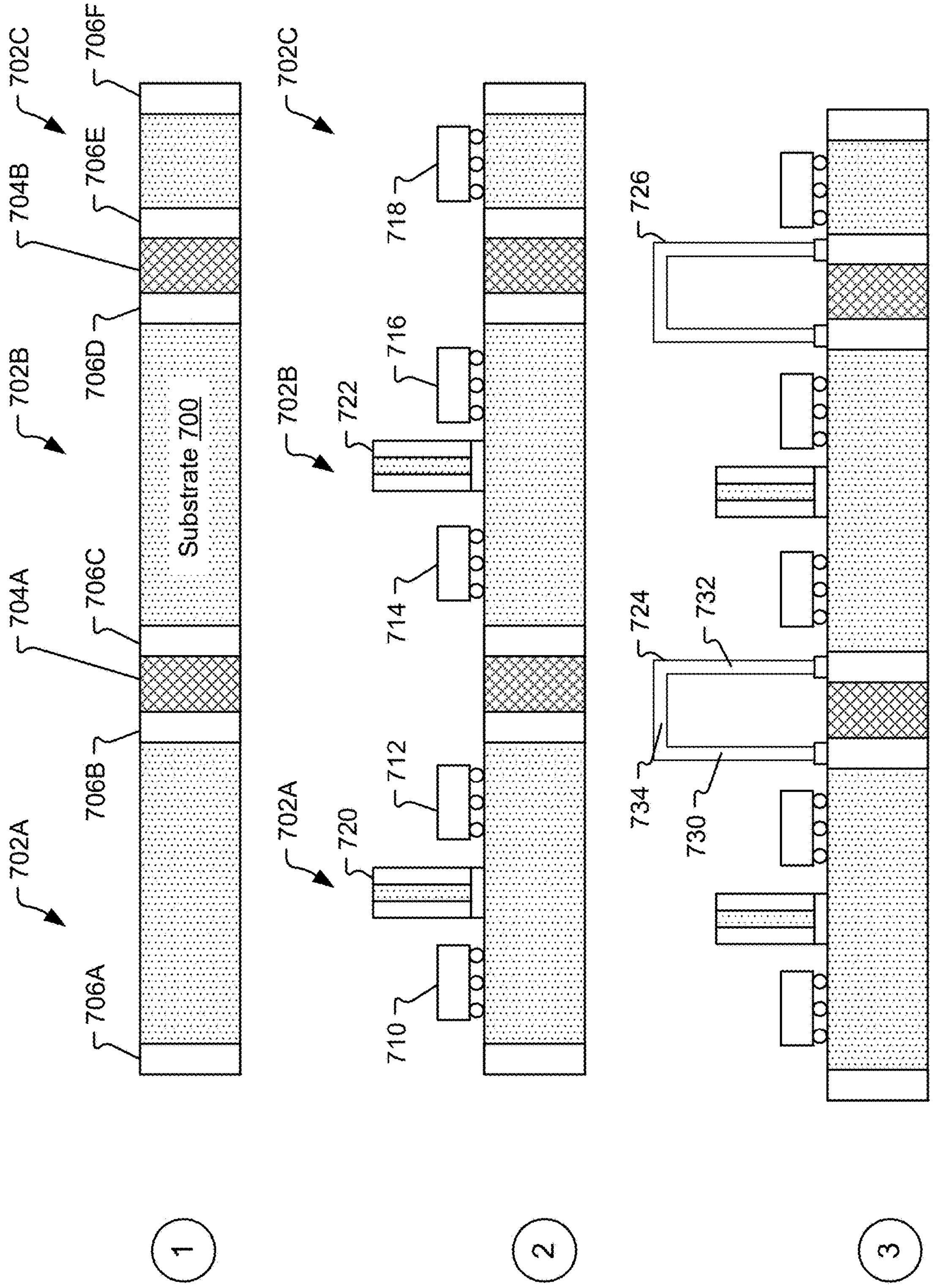
FIG. 7A illustrates a first part of an exemplary sequence for fabricating an exemplary device that includes one or more EMI shielding structures.

Referring to FIGS. 7A-D, Stage 1 of FIG. 7A illustrates a state after a substrate 700 is prepared and one or more substrate EMI shielding structures are formed. In the example illustrated in FIGS. 7A-7D, the substrate 700 includes a substrate strip or a substrate panel which can be used to form two or more semiconductor packages concurrently. For example, as part of Stage 1, regions of the substrate 700 may be designated as package units 702, and intervening areas may be designated as sawing streets 704. For example, in FIG. 7A, the substrate 700 includes illustrative package units 702A, 702B, and 702C, a region between the package unit 702A and the package unit 702B is designated as a sawing street 704A, and a region between the package unit 702B and the package unit 702C is designated as a sawing street 704B. The package units 702 represent regions of the substrate 700 in which semiconductor packages, such as RF packages or modules, are to be formed (e.g., including one or more integrated circuits and one or more EMI shielding structures), and the sawing streets 704 represent regions in which the substrate 700 is to be cut to form the semiconductor packages, as further described above with reference to FIG. 2.

At Stage 1, one or more substrate EMI shielding structures 706 have been formed within the substrate 700. For example, as part of Stage 1, substrate EMI shielding structures 706A, 706B may be formed within the substrate 700 along edges of the package unit 702A, substrate EMI shielding structures 706C, 706D may be formed within the substrate 700 along edges of the package unit 702B, and substrate EMI shielding structures 706E, 706F may be formed within the substrate 700 along edges of the package unit 702C, as described above with reference to FIGS. 6A-C. For example, the substrate 700 may include or correspond to the substrate 640 of FIG. 6C, the substrate EMI shielding structure 706F may include or correspond to the first substrate EMI shielding structure 630, the substrate EMI shielding structure 706A may include or correspond to the second substrate EMI shielding structure 632, and the substrate EMI shielding structure 706B may include or correspond to the third substrate EMI shielding structure 633. The substrate EMI shielding structures 706 may be formed along edges of the substrate 700 (e.g., the substrate EMI shielding structures 706A, 706F) or along edges of the sawing streets 704 (e.g., the substrate EMI shielding structures 706B, 706C, 706D, 706E).

Stage 2 illustrates a state after one or more devices are attached to the substrate 700. The one or more devices may include one or more dies or chiplets, one or more compartment EMI shielding structures (e.g., multi-layer wall structures), or a combination thereof. For example, as part of Stage 2, a first die 710 and a second die 712 may be attached to the substrate 700 in the package unit 702A, a third die 714 and a fourth die 716 may be attached to the substrate 700 in the package unit 702B, and a fifth die 718 may be attached to the substrate 700 in the package unit 702C. In some implementations, the substrate 700 includes contacts on a surface of the substrate 700 and conductive pathways within the substrate 700 and electrically connected to the contacts, such that the dies 710-718 are electrically connected to the contacts and, by the conductive pathways, electrically connected to each other, to one or more other components, or a combination thereof. Additionally, a first wall structure 720 may be attached to the substrate 700 in the package unit 702A, and a second wall structure 722 may be attached to the substrate 700 in the package unit 702B. For example, the first wall structure 720 may be attached to the substrate 700 along a side wall of the first die 710 that is electrically connected to the substrate 700 and along a side wall of the second die 712 that is electrically connected to the substrate 700. In some implementations, the first wall structure 720 is electrically connected to a contact on the substrate 700, such that one or more conductive pathways within the substrate 700 may electrically connect the first wall structure 720 to one or more other components. In this example, the first wall structure 720 is configured to provide an electromagnetic barrier between the first die 710 and the second die 712.

The wall structures 720-722 may be attached to contacts or other types of interconnects using solder, as described above with reference to FIG. 1A, or other materials or electrical interconnecting processes. Additionally, or alternatively, the wall structures 720-722 may be prepared using the sequence described above with reference to FIGS. 5A-F. Although five dies and two wall structures are shown in FIG. 7A, in other implementations, fewer than five or more than five dies may be attached to the substrate 700, fewer than two or more than two wall structures (e.g., compartment EMI shielding structures) may be attached to the substrate 700, or a combination thereof. It is noted that the example shown in FIGS. 7A-D illustrates formation of a portion of a semiconductor package within the package unit 702A, formation of a semiconductor package within the package unit 702B, and formation of a portion of a semiconductor package within the package unit 702C. It should be appreciated that the substrate 700 can be divided into more than three package units, and that the semiconductor packages formed within the package units may include more components or fewer components than shown in FIGS. 7A-D. Accordingly, the example illustrated in FIGS. 7A-D is illustrative and may omit one or more components for clarity and case of explanation.

Figure 7B:
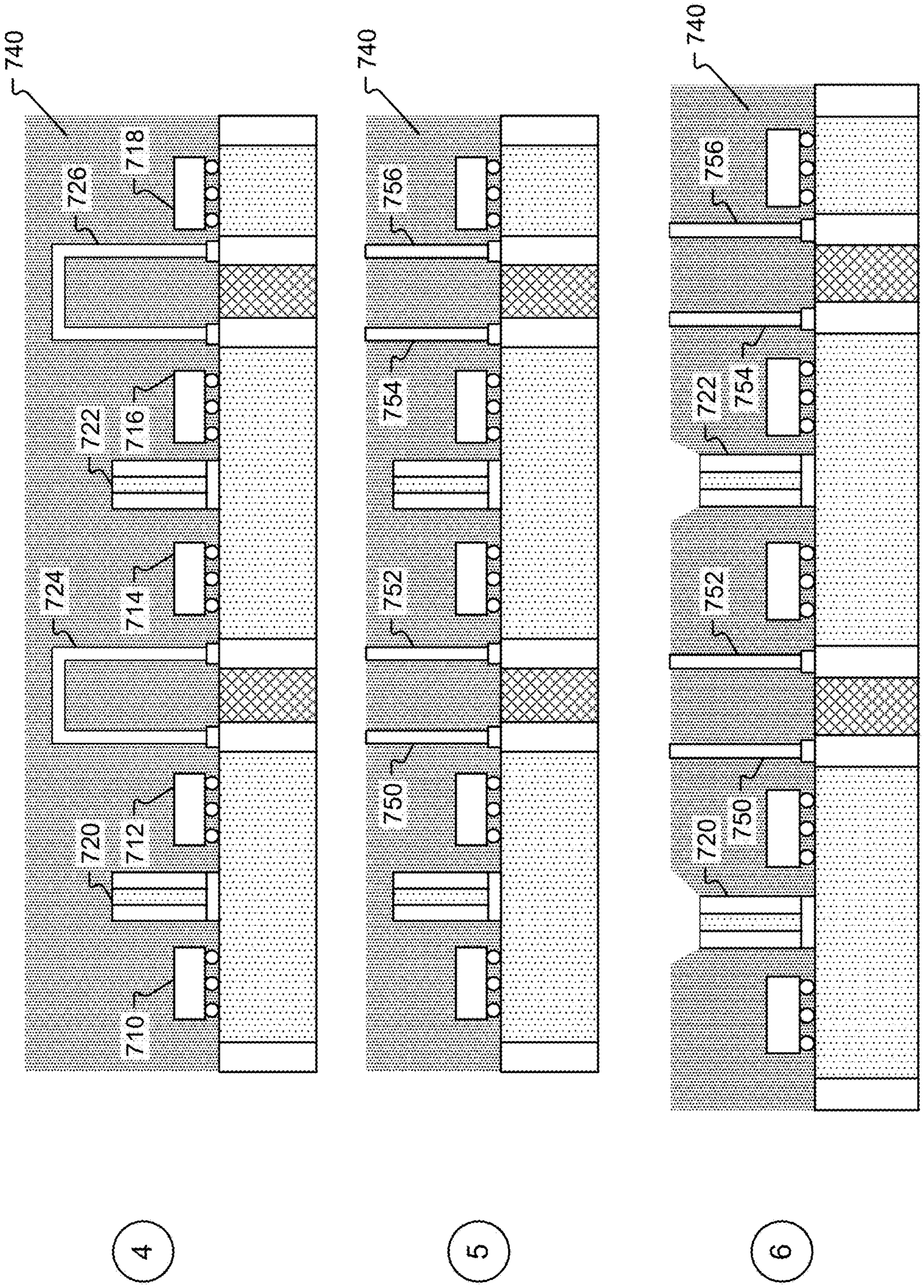
FIG. 7B illustrates a second part of an exemplary sequence for fabricating an exemplary device that includes one or more EMI shielding structures.

Stage 3 illustrates a state after one or more metal structures that are to be used to form package side wall EMI structures are attached to the substrate 700. For example, as part of Stage 3, a first metal structure 724 and a second metal structure 726 may be attached to the substrate 700. In some implementations, the metal structures 724-726 are electrically connected to contacts on the substrate 700. The metal structures 724-726 may be U-shaped metal cans, as shown in FIG. 7B, that each include two respective portions that are attached to the substrate 700 and a respective portion that connects the other two portions. For example, the first metal structure 724 may include a first portion 730, a second portion 732 that extends substantially parallel to the first portion 730, and a third portion 734 that extends substantially orthogonally to, and connects, the first portion 730 and the second portion 732. Alternatively, the metal structures 724, 726 may include any of the metal structures described above with reference to FIGS. 3A-C. Although described as metal cans, the metal structures 724-726 may be metal arches or any type of metal structure described or illustrated herein.

In some implementations, different portions of the metal structures 724-726 are attached to different package units 702 and the metal structures 724-726 span the sawing streets 704. For example, the first portion 730 of the first metal structure 724 may be attached to the package unit 702A (and optionally be electrically connected to the substrate EMI shielding structure 706B), the second portion 732 of the first metal structure 724 may be attached to the package unit 702B (and optionally be electrically connected to the substrate EMI shielding structure 706C), and the first metal structure 724 may span the sawing street 704A. As another example, a first portion of the second metal structure 726 may be attached to the package unit 702B (and optionally be electrically connected to the substrate EMI shielding structure 706D), a second portion of the second metal structure 726 may be attached to the package unit 702C (and optionally be electrically connected to the substrate EMI shielding structure 706E), and the second metal structure 726 may span the sawing street 704B. The metal structures 724-726 may be attached using solder, as described above with reference to FIG. 1A, or other types of materials or interconnects. Although two metal structures are shown in FIG. 7B, in other implementations, fewer than two or more than two metal structures (e.g., to be used to form package side wall EMI shielding structures) may be attached to the substrate 700.

Stage 4 of FIG. 7B illustrates a state after a mold compound 740 is deposited on the substrate 700 and the components attached thereto. For example, as part of Stage 4, an over molding process may be performed to deposit the mold compound 740 to at least partially encapsulate the dies 710-718, the wall structures 720-722, and the metal structures 724-726. The mold compound 740 may include or correspond to the mold compound 122 described above with reference to FIG. 1A.

Stage 5 illustrates a state after removing some of the mold compound 740 to achieve a target package height. For example, as part of Stage 5, a grinding process, such as strip grinding, may be performed to remove some of the mold compound 740 and portions of the metal structures 724-726 (e.g., the respective third portions). The grinding process may be performed until the mold compound 740 and the remaining portions of the metal structures 724-726 have the target package height. Removing portions of the metal structures 724-726 may result in pairs of individual wall structures being formed from each of the metal structures 724-726. For example, removing the third portion 734 of the first metal structure 724 forms a third wall structure 750 in the package unit 702A and a fourth wall structure 752 in the package unit 702B. As another example, removing a portion of the second metal structure 726 forms a fifth wall structure 754 in the package unit 702B and a sixth wall structure 756 in the package unit 702C. The grinding process is also performed until the top surfaces of the wall structures 750-756 are exposed.

Stage 6 illustrates a state after forming openings in the mold compound 740 to expose the top surfaces of the wall structures 720-722. For example, as part of Stage 6, a laser drilling process or another type of material removal process to form openings in the mold compound 740 may be performed above the wall structures 720-722 to expose the top surfaces of the wall structures 720-722. Alternatively, the grinding process described with reference to Stage 5, or another grinding process, may be performed to expose the top surfaces of the wall structures 720-722. For example, if the wall structures 720-722 have the same height as the wall structures 750-756, the grinding process described with reference to Stage 5 may expose the top surfaces of both types of wall structures. After Stage 6 is complete, the top surfaces of the wall structures 720-722 and the top surfaces of the wall structures 750-756 are exposed.

Figure 7C:
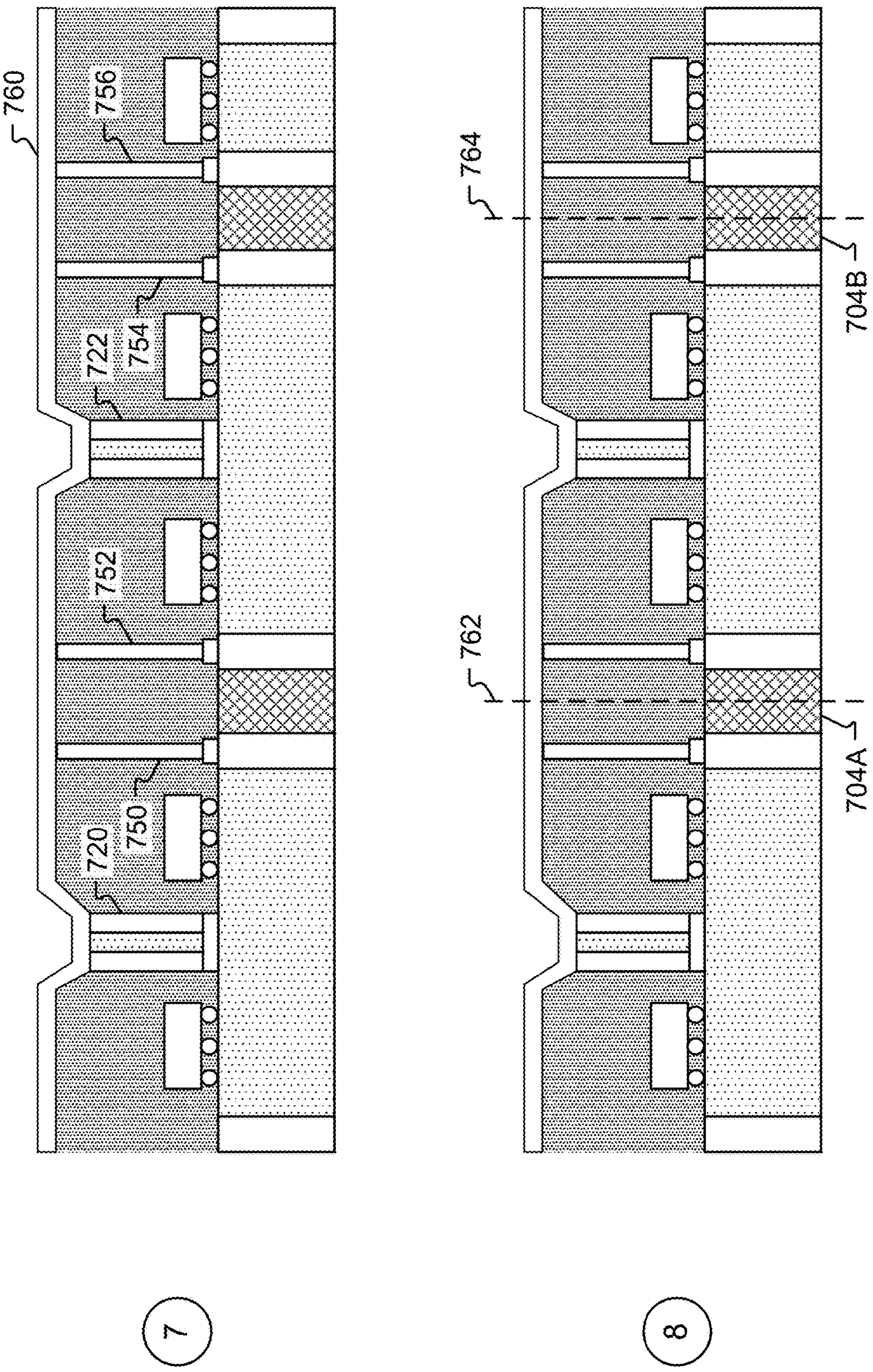
FIG. 7C illustrates a third part of an exemplary sequence for fabricating an exemplary device that includes one or more EMI shielding structures.

Stage 7 of FIG. 7C illustrates a state after depositing a conductive material on the mold compound 740 and the exposed surfaces of the wall structures 720-722 and 750-756. For example, as part of Stage 7, a metal, a metal alloy, or another conductive material that provides EMI shielding capabilities may be deposited on top of the mold compound 740 and the exposed surfaces. The deposition may be performed using sputtering, spraying, plating, or another material deposition process. In some implementations, one or more pre-treatment processes, such as plasma treatment and/or formation of a seed layer on the top surface, are performed prior to the deposition process to facilitate deposition of the cover layer 760. Depositing the conductive material forms a cover layer 760 that is configured to provide electromagnetic shielding for one or more semiconductor packages to be formed and/or to protect adjacent semiconductor packages from EMI generated by the semiconductor package(s) being formed.

Stage 8 illustrates a state prior to, or during, a singulation process performed on the substrate 700. For example, as part of Stage 8, multiple semiconductor packages may be separated from a larger whole by cutting (e.g., sawing) along various locations of the substrate 700. For example, a first cut, along a first cut line 762 (e.g., a border between the package unit 702A and the package unit 702B), may be performed along the sawing street 704A and a second cut, along a second cut line 764 (e.g., a border between the package unit 702A and the package unit 702B), may be performed along the sawing street 704B. The cuts may remove portions of the substrate 700 that are designated as the sawing streets 704, as well as any materials above the sawing streets 704 (e.g., portions of the mold compound 740, portions of the cover layer 760, and the like).

Figure 7D:
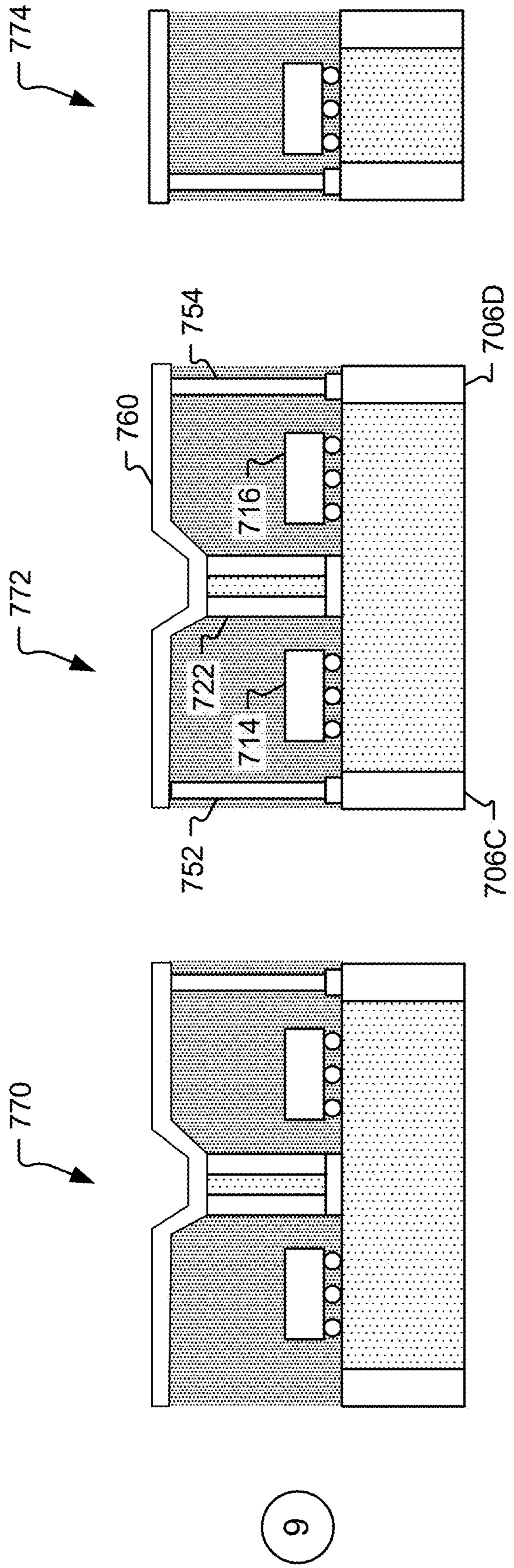
FIG. 7D illustrates a fourth part of an exemplary sequence for fabricating an exemplary device that includes one or more EMI shielding structures.

Stage 9 of FIG. 7D illustrates a state after the singulation process is complete and multiple semiconductor packages with EMI shielding are formed. For example, as part of Stage 9, a first semiconductor package 770, a second semiconductor package 772, and a third semiconductor package 774 may be formed from the substrate 700 (and the components thereon). Each of the semiconductor packages 770-774 may include multiple EMI shielding structures configured to provide various EMI shielding for the respective semiconductor packages and/or for adjacent semiconductor packages, such as substrate EMI shielding structures, package sidewall EMI shielding structures, compartment EMI shielding structures, or a combination thereof. As an illustrative example, the second semiconductor package 772 includes an EMI barrier on the left side of the second semiconductor package 772 including the fourth wall structure 752 and the substrate EMI shielding structure 706C, an EMI barrier on the top including the cover layer 760, an EMI barrier on the right side of the second semiconductor package 772 including the fifth wall structure 754 and the substrate EMI shielding structure 706D, and an EMI barrier between a first compartment that includes the third die 714 and a second compartment that includes the fourth die 716 including the second wall structure 722. Similar EMI barriers may be provided by the EMI shielding structures included in the first semiconductor package 770 and the third semiconductor package 774, respectively.

Although only one package side wall EMI shielding structure is shown as included in the first semiconductor package 770 and the third semiconductor package 774, this is for ease of illustration, and each of the semiconductor packages may include package side wall EMI shielding structures along each side wall. Additionally, or alternatively, some semiconductor packages (e.g., the semiconductor packages 770-772) may include compartment EMI shielding structures (e.g., the wall structures 720-722), and other semiconductor packages (e.g., the third semiconductor package 774) may not include any compartment EMI shielding structures. Additionally, or alternatively, the substrate 700 may be cut into fewer than three or more than three semiconductor packages, each of which may include one or more dies, one or more types of EMI shielding structures, or a combination thereof. As such, techniques of the present disclosure provide multiple granularities of EMI shielding that may be selectively applied to different semiconductor packages based on aspects of the semiconductor packages in a highly scalable process at the strip level or panel level, as compared to the individual unit (e.g., semiconductor package) level.

Formation of the semiconductor packages 770-774 (e.g., device(s) including one or more of the exemplary EMI shielding structures described herein) is complete after Stage 9 of FIG. 7D. In some implementations, the semiconductor packages 770-774 can correspond to the device 100 of FIGS. 1A-C or the device 400 of FIGS. 4A-C, or the stages shown in FIGS. 7A-D can be used to form the device 100 of FIGS. 1A-C or the device 400 of FIGS. 4A-C. For example, additional dies and/or compartment EMI shielding structures may be attached to the second semiconductor package 772 during the process shown in FIGS. 7A-D to form the device 100 of FIGS. 1A-C, and/or a different type of metal structure as shown in FIGS. 3A-C may be used to form the wall structures 752-756. As another example, additional dies and/or compartment EMI shielding structures may be attached to the second semiconductor package 772 during the process shown in FIGS. 7A-D to form the device 400 of FIGS. 4A-C, and/or the anchor structures 450 of FIG. 4C may be formed during formation of the substrate EMI shielding structures 706C, 706D.

Figure 8A:
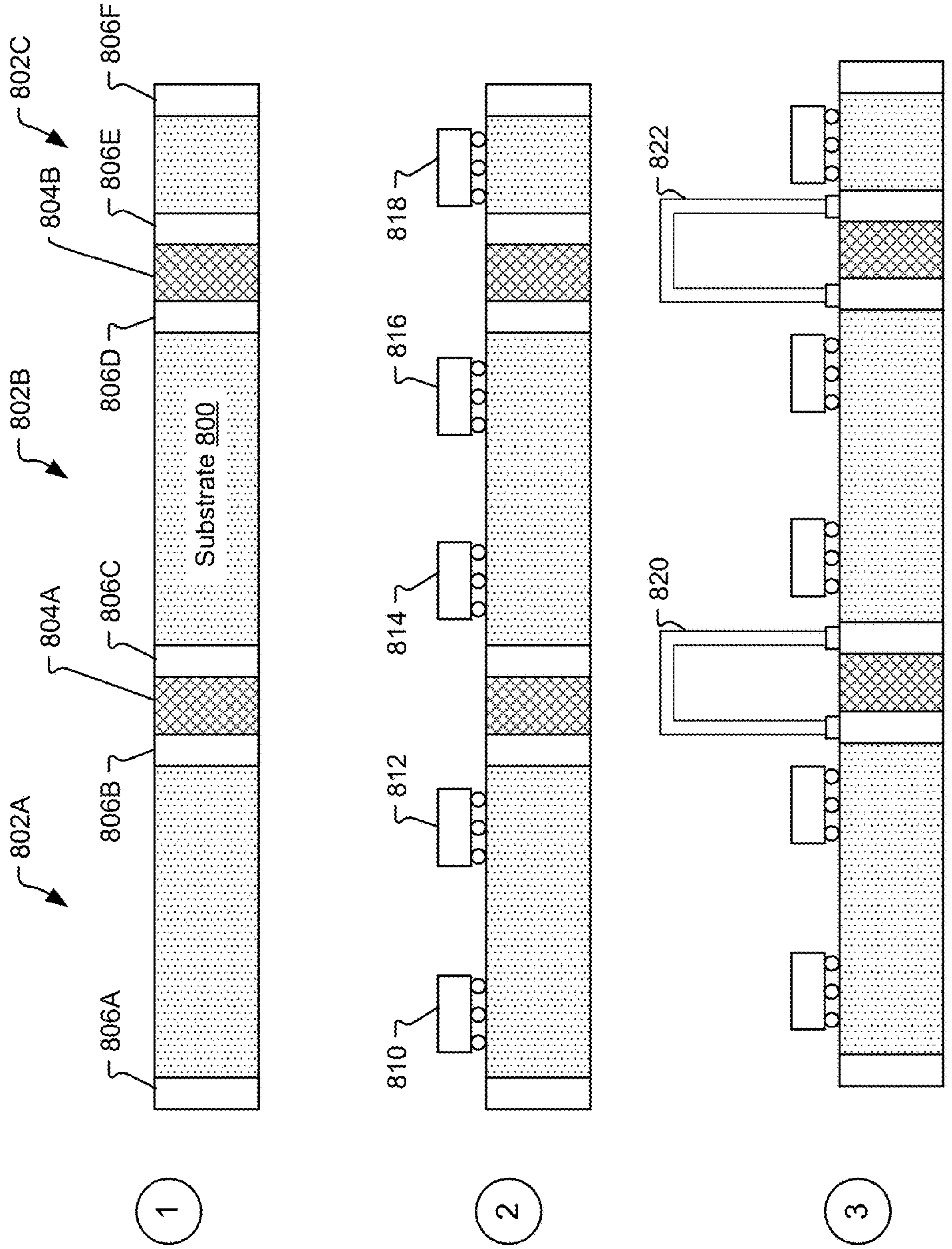
FIG. 8A illustrates a first part of an exemplary sequence for fabricating another exemplary device that includes one or more EMI shielding structures.
Figure 8B:
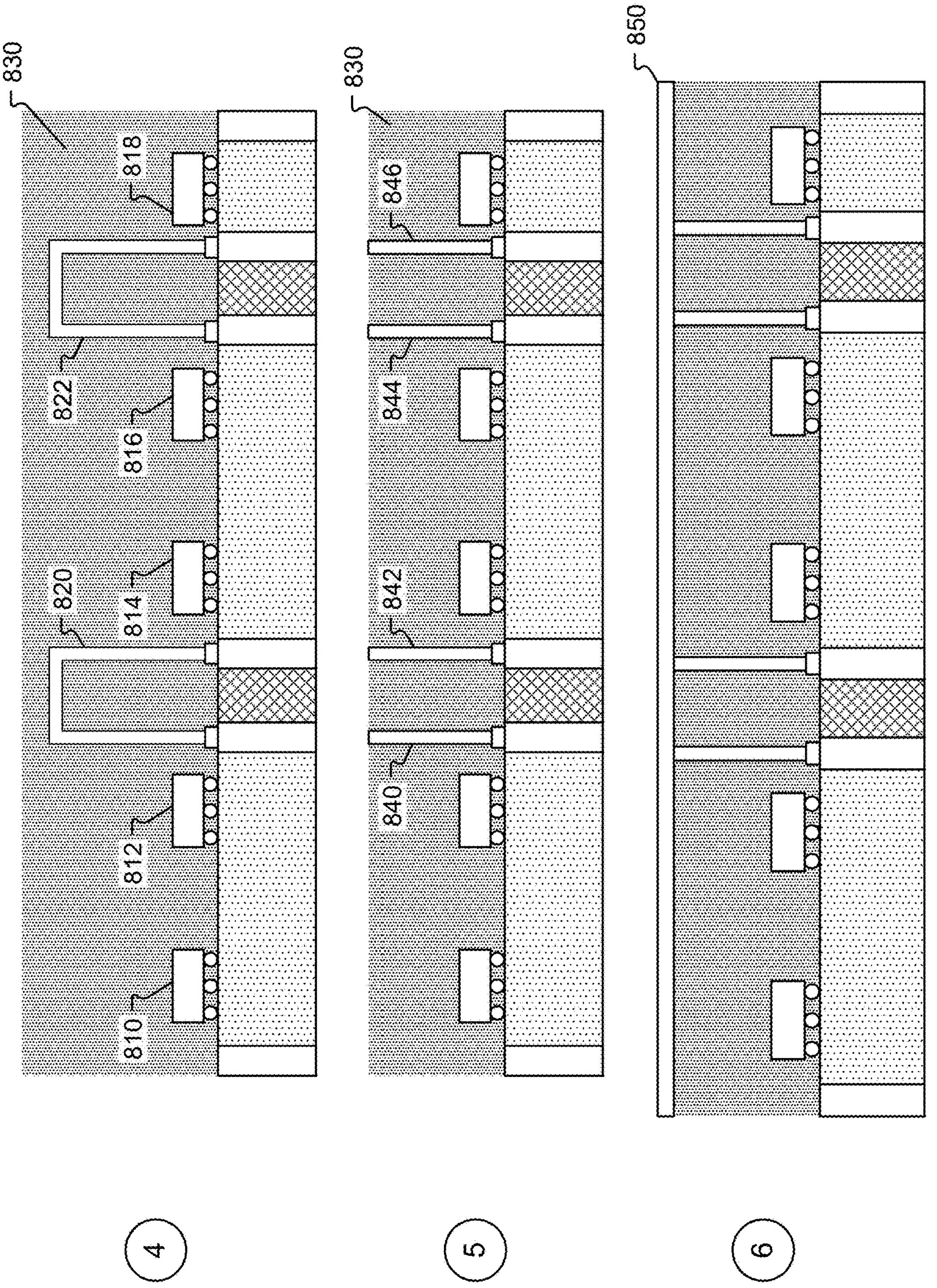
FIG. 8B illustrates a second part of an exemplary sequence for fabricating another exemplary device that includes one or more EMI shielding structures.
Figure 8C:
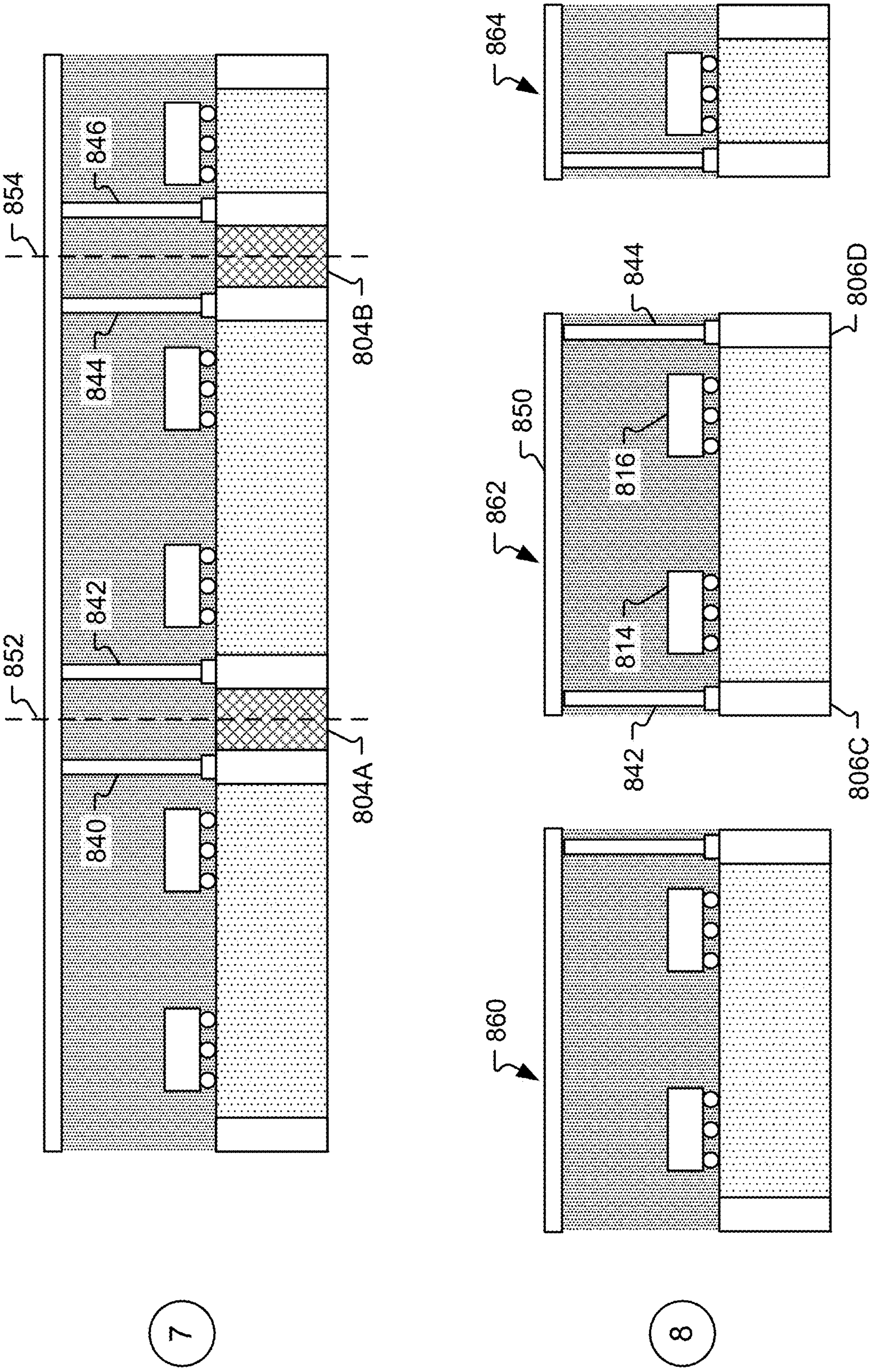
FIG. 8C illustrates a third part of an exemplary sequence for fabricating another exemplary device that includes one or more EMI shielding structures.

The sequence described with reference to FIGS. 8A-C is similar to the sequence described with reference to FIGS. 7A-D. However, in the sequence described with reference to FIGS. 8A-C, compartment EMI shielding structures are not used. Referring to FIGS. 8A-C, Stage 1 of FIG. 8A illustrates a state after a substrate 800 is prepared and one or more substrate EMI shielding structures are formed. In the example illustrated in FIGS. 8A-C, the substrate 800 includes a substrate strip or a substrate panel which can be used to form two or more semiconductor packages concurrently. For example, as part of Stage 1, one or more regions of the substrate 800 are designated as package units 802, and intervening areas are designated as sawing streets 804, similar to as described above with reference to FIG. 7A.

Also as part of Stage 1 (or before), one or more substrate EMI shielding structures 806 are formed within the substrate 800. For example, as part of Stage 1, substrate EMI shielding structures 806A, 806B may be formed within the substrate 800 along edges of the package unit 802A, substrate EMI shielding structures 806C, 806D may be formed within the substrate 800 along edges of the package unit 802B, and substrate EMI shielding structures 806E, 806F may be formed within the substrate 800 along edges of the package unit 802C, similar to as described above with reference to FIGS. 6A-C. To illustrate, the substrate 800 may include or correspond to the substrate 640 of FIG. 6C.

Stage 2 illustrates a state after one or more devices are attached to the substrate 800. For example, as part of Stage 2, a first die 810 and a second die 812 may be attached to the substrate 800 in the package unit 802A, a third die 814 and a fourth die 816 may be attached to the substrate 800 in the package unit 802B, and a fifth die 818 may be attached to the substrate 800 in the package unit 802C, similar to as described above with reference to FIG. 7A (e.g., via electrically connecting the dies 810-818 to contacts on the substrate 800 and conductive pathways within the substrate 800). However, no multi-layer vertical wall structures are attached to the substrate 800 to operate as compartment EMI shielding structures. Although five dies are shown in FIG. 8A, in other implementations, fewer than five or more than five dies may be attached to the substrate 800. It is noted that the example shown in FIGS. 8A-C illustrates formation of a portion of a semiconductor package within the package unit 802A, formation of a semiconductor package within the package unit 802B, and formation of a portion of a semiconductor package within the package unit 802C. It should be appreciated that the substrate 800 can be divided into more than three package units, and that the semiconductor packages formed within the package units may include more components or fewer components than shown in FIGS. 8A-C. Accordingly, the example illustrated in FIGS. 8A-C is illustrative and may omit one or more components for clarity and case of explanation.

Stage 3 illustrates a state after one or more metal structures that are to be used to form package side wall EMI structures are attached to the substrate 800. For example, as part of Stage 3, a first metal structure 820 and a second metal structure 822 may be attached to the substrate 800, similar as to described above with reference to FIG. 7B. The metal structures 820-822 may include or correspond to any of the metal structures described above with reference to FIGS. 3A-C. Although two metal structures are shown in FIG. 8A, in other implementations, fewer than two or more than two metal structures (e.g., to be used to form package side wall EMI shielding structures) may be attached to the substrate 800.

Stage 4 of FIG. 8B illustrates a state after a mold compound 830 is deposited on the substrate 800 and the components attached thereto. For example, as part of Stage 4, an over molding process may be performed to deposit the mold compound 830 to at least partially encapsulate the dies 810-818 and the metal structures 820-822, similar to as described above with reference to FIG. 7B.

Stage 5 illustrates a state after removing some of the mold compound 830 and portions of the metal structures 820-822 to achieve a target package height. For example, as part of Stage 5, a grinding process, such as strip grinding, may be performed to remove some of the mold compound 830 and portions of the metal structures 820-822, as described above with reference to FIG. 7B. Removing portions of the metal structures 820-822 forms a first wall structure 840 in the package unit 802A, a second wall structure 842 and a third wall structure 844 in the package unit 802B, and a fourth wall structure 846 in the package unit 802C. The grinding process is also performed until the top surfaces of the wall structures 840-846 are exposed. Because there are no compartment EMI shielding structures, additional material removal operations, such as laser drilling, are not performed in the sequence of FIGS. 8A-C.

Stage 6 illustrates a state after depositing a conductive material on the mold compound 830 and the exposed surfaces of the wall structures 840-846. For example, as part of Stage 6, optionally after performing one or more pretreatment processes, a conductive material that provides EMI shielding capabilities may be deposited, such as using sputtering, spraying, plating, or another material deposition process, on top of the mold compound 830 and the exposed surfaces to form a cover layer 850 that is configured to provide electromagnetic shielding for one or more semiconductor packages to be formed and/or to protect adjacent semiconductor packages from EMI generated by the semiconductor package(s) being formed, similar to as described above with reference to FIG. 7C.

Stage 7 of FIG. 8C illustrates a state prior to, or during, a singulation process performed on the substrate 800. For example, as part of Stage 7, multiple semiconductor packages may be separated from a larger whole by cutting (e.g., sawing) along a first cut line 852 (e.g., along the sawing street 804A) and along a second cut line 854 (e.g., the sawing street 804B), similar to as described above with reference to FIG. 7C.

Stage 8 illustrates a state after the singulation process is complete and multiple semiconductor packages with EMI shielding are formed. For example, as part of Stage 8, a first semiconductor package 860, a second semiconductor package 862, and a third semiconductor package 864 may be formed from the substrate 800 (and the components thereon), as described above with reference to FIG. 7D. Each of the semiconductor packages 860-864 may include multiple EMI shielding structures configured to provide various EMI shielding for the respective semiconductor packages and/or for adjacent semiconductor packages, such as substrate EMI shielding structures, package sidewall EMI shielding structures, or a combination thereof. As an illustrative example, the second semiconductor package 862 has an EMI barrier on the left side of the second semiconductor package 862 including the second wall structure 842 and the substrate EMI shielding structure 806C, an EMI barrier on the top including the cover layer 850, and an EMI barrier on the right side of the second semiconductor package 862 including the third wall structure 844 and the substrate EMI shielding structure 806D. Similar EMI barriers may be provided by the EMI shielding structures included in the first semiconductor package 860 and the third semiconductor package 864, respectively.

Although only one package side wall EMI shielding structure is shown as included in the first semiconductor package 860 and the third semiconductor package 864, this is for case of illustration, and each of the semiconductor packages may include package side wall EMI shielding structures along each side wall. Additionally, or alternatively, the substrate 800 may be cut into fewer than three or more than three semiconductor packages, each of which may include one or more dies, one or more types of EMI shielding structures, or a combination thereof. Formation of the semiconductor packages 860-864 is complete after Stage 8 of FIG. 8C. In some implementations, the semiconductor packages 860-864 can include or correspond to the device 100 of FIGS. 1A-C or the device 400 of FIGS. 4A-C, as described above with reference to the semiconductor packages 770-774.

Figure 9A:
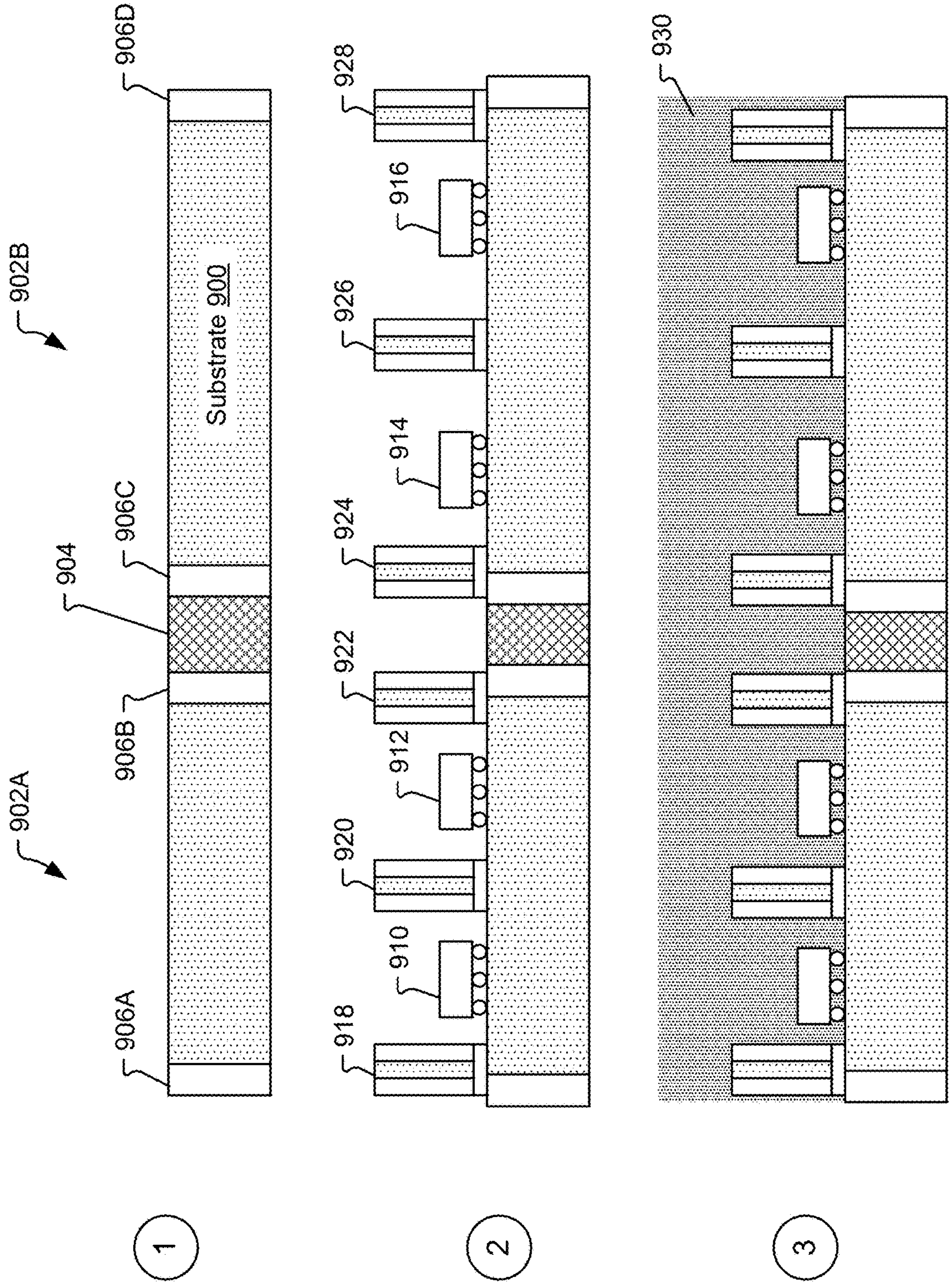
FIG. 9A illustrates a first part of an exemplary sequence for fabricating another exemplary device that includes one or more EMI shielding structures.
Figure 9B:
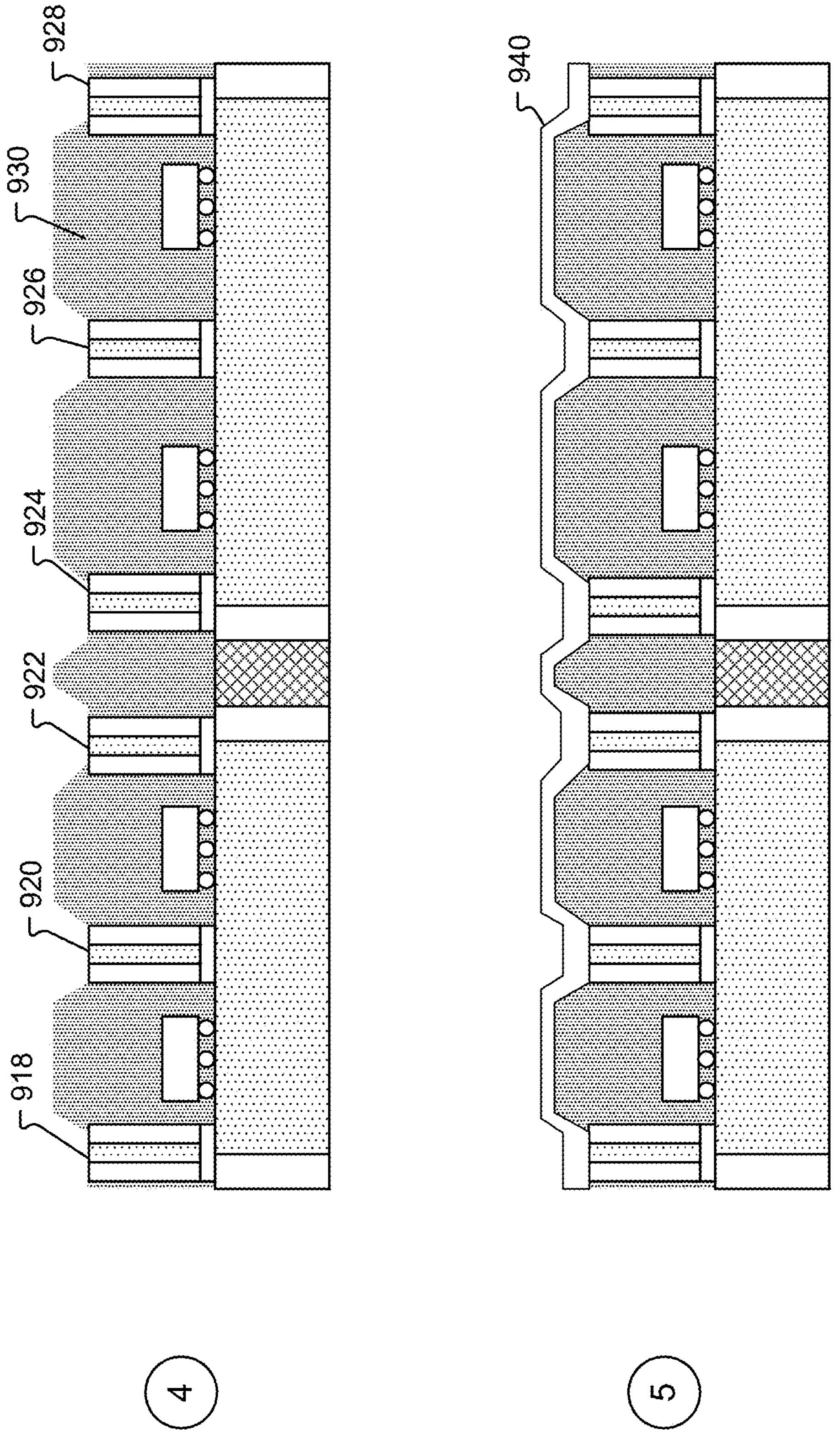
FIG. 9B illustrates a second part of an exemplary sequence for fabricating another exemplary device that includes one or more EMI shielding structures.
Figure 9C:
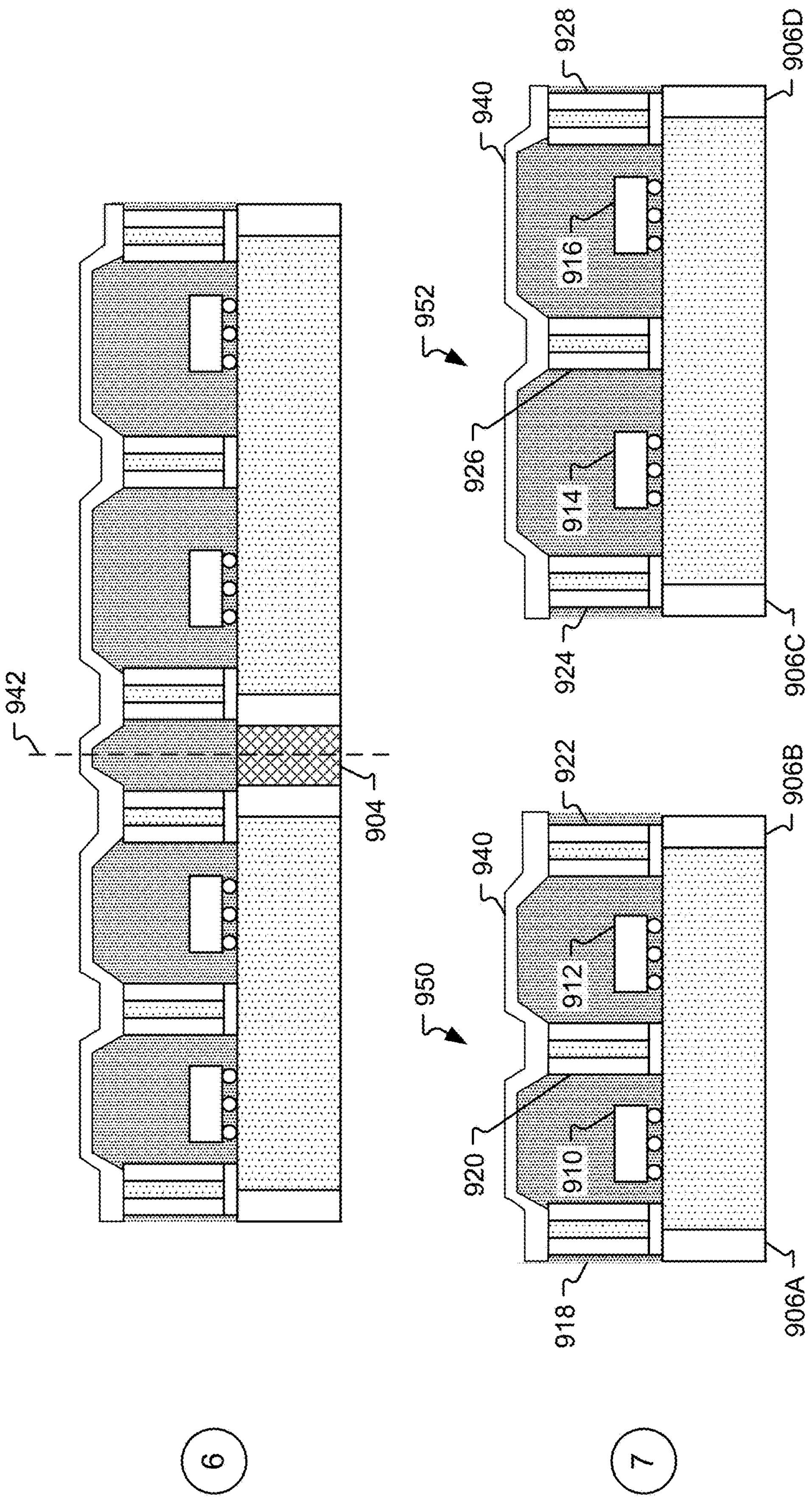
FIG. 9C illustrates a third part of an exemplary sequence for fabricating another exemplary device that includes one or more EMI shielding structures.

The sequence described with reference to FIGS. 9A-C is similar to the sequence described with reference to FIGS. 7A-D. However, in the sequence described with reference to FIGS. 9A-C, instead of using metal structures (e.g., metal cans or other structures) to form package side wall EMI shielding structures, the same type of wall structures (e.g., multi-layer vertical wall structures) used to form compartment EMI shielding structures are used to form package side wall EMI shielding structures. Referring to FIGS. 9A-C, Stage 1 of FIG. 9A illustrates a state after a substrate 900 is prepared and one or more substrate EMI shielding structures are formed. In the example illustrated in FIGS. 9A-C, the substrate 900 includes a substrate strip or a substrate panel which can be used to form two or more semiconductor packages concurrently. For example, as part of Stage 1, one or more regions of the substrate 900 are designated as package units 902, and intervening areas are designated as a sawing street 904, similar to as described above with reference to FIG. 7A, except that the example described in FIGS. 9A-C includes two package units 902A, 902B and a single sawing street 904.

Also as part of Stage 1 (or before), one or more substrate EMI shielding structures 906 are formed within the substrate 900. For example, as part of Stage 1, substrate EMI shielding structures 906A, 906B may be formed within the substrate 900 along edges of the package unit 902A and substrate EMI shielding structures 906C, 906D may be formed within the substrate 900 along edges of the package unit 902B, similar to as described above with reference to FIGS. 6A-C. To illustrate, the substrate 900 may include or correspond to the substrate 640 of FIG. 6C Stage 2 illustrates a state after one or more devices are attached to the substrate 800. For example, as part of Stage 2, a first die 910, a second die 912, a first wall structure 918, a second wall structure 920, and a third wall structure 922 may be attached to the substrate 900 in the package unit 902A, and a third die 914, a fourth die 916, a fourth wall structure 924, a fifth wall structure 926, and a sixth wall structure 928 may be attached to the substrate 900 in the package unit 902B, similar to as described above with reference to FIG. 7A, except that multiple wall structures are attached to the substrate 900 in each package unit. Although four dies and six wall structures are shown in FIG. 9A, in other implementations, fewer than four or more than four dies, fewer than six or more than six wall structures, or a combination thereof, may be attached to the substrate 900. It is noted that the example shown in FIGS. 9A-C illustrates formation of a semiconductor package within the package unit 902A and formation of a semiconductor package within the package unit 902B. It should be appreciated that the substrate 900 can be divided into more than two package units, and that the semiconductor packages formed within the package units may include more components or fewer components than shown in FIGS. 9A-C. Accordingly, the example illustrated in FIGS. 9A-C is illustrative and may omit one or more components for clarity and ease of explanation.

Stage 3 illustrates a state after a mold compound 930 is deposited on the substrate 900 and the components attached thereto. For example, as part of Stage 3, an over molding process may be performed to deposit the mold compound 930 to at least partially encapsulate the dies 910-916 and the wall structures 918-928, similar to as described above with reference to FIG. 7B.

Stage 4 of FIG. 9B illustrates a state after forming openings in the mold compound 930 to expose the top surfaces of the wall structures 918-928. For example, as part of Stage 4, a laser drilling process or another type of material removal process to form openings in the mold compound 930 may be performed above the wall structures 918-928 to expose the top surfaces of the wall structures 918-928, similar to as described above with reference to FIG. 7C. In some implementations, a grinding process, such as a strip grinding or other grinding process, may be performed before Stage 4 to remove some of the mold compound 930 in order to achieve a target package height. In some implementations, the grinding process may be performed to expose the surfaces of the wall structures 918-928, and additional material removal processes (e.g., drilling) are not used. Alternatively, the process described in Stage 3 may be controlled to achieve the target package height after deposition of the mold compound 930, such that a grinding process is not needed. To illustrate, the mold compound 930 can be deposited in a manner that leave top surfaces of the wall structures 918-928 exposed.

Stage 5 illustrates a state after depositing a conductive material on the mold compound 930 and the exposed surfaces of the wall structures 918-928. For example, as part of Stage 5, optionally after performing one or more pre-treatment processes, a conductive material that provides EMI shielding capabilities may be deposited, such as using sputtering, spraying, plating, or another material deposition process, on top of the mold compound 930 and the exposed surfaces to form a cover layer 940 that is configured to provide electromagnetic shielding for one or more semiconductor packages to be formed and/or to protect adjacent semiconductor packages from EMI generated by the semiconductor package(s) being formed, similar to as described above with reference to FIG. 7C.

Stage 6 of FIG. 9C illustrates a state prior to, or during, a singulation process performed on the substrate 900. For example, as part of Stage 6, multiple semiconductor packages may be separated from a larger whole by cutting (e.g., sawing) along a first cut line 942 (e.g., along the sawing street 904), similar to as described above with reference to FIG. 7C.

Stage 7 illustrates a state after the singulation process is complete and multiple semiconductor packages with EMI shielding are formed. For example, as part of Stage 7, a first semiconductor package 950 and a second semiconductor package 952 may be formed from the substrate 900 (and the components thereon), as described above with reference to FIG. 7D. Each of the semiconductor packages 950-952 may include multiple EMI shielding structures configured to provide various EMI shielding for the respective semiconductor packages and/or for adjacent semiconductor packages, such as substrate EMI shielding structures, package sidewall EMI shielding structures, compartment EMI shielding structures, or a combination thereof. For example, the first semiconductor package 950 has an EMI barrier on the left side of the first semiconductor package 950 including the first wall structure 918 and the substrate EMI shielding structure 906A, an EMI barrier on the top including the cover layer 940, an EMI barrier on the right side of the first semiconductor package 950 including the third wall structure 922 and the substrate EMI shielding structure 906B, and an EMI barrier between a first compartment that includes the first die 910 and a second compartment that includes the second die 912 including the second wall structure 920. As another example, the second semiconductor package 952 has an EMI barrier on the left side of the second semiconductor package 952 including the fourth wall structure 924 and the substrate EMI shielding structure 906C, an EMI barrier on the top including the cover layer 940, an EMI barrier on the right side of the second semiconductor package 952 including the sixth wall structure 928 and the substrate EMI shielding structure 906D, and an EMI barrier between a third compartment that includes the third die 914 and a fourth compartment that includes the fourth die 916 including the fifth wall structure 926. As shown in FIG. 9C, wall structures that operate as package side wall EMI shielding structures (e.g., the wall structures 918, 922, 924, 928) and wall structures that operate as compartment EMI shielding structures (e.g., the wall structures 920, 926) are both multi-layer vertical wall structures, as described above with reference to FIGS. 1A-C and 5A-F.

Formation of the semiconductor packages 950-952 is complete after Stage 7 of FIG. 9C. In some implementations, the semiconductor packages 950-952 can include or correspond to the device 100 of FIGS. 1A-C or the device 400 of FIGS. 4A-C, as described above with reference to the semiconductor packages 770-774. Although two semiconductor packages are described with reference to FIGS. 9A-C, the substrate 900 may be cut into fewer than two or more than two semiconductor packages, each of which may include one or more dies, one or more types of EMI shielding structures, or a combination thereof.

Exemplary Flow Diagram of a Method for Fabricating a Device Including EMI Shielding Structure(s)

Figure 10:
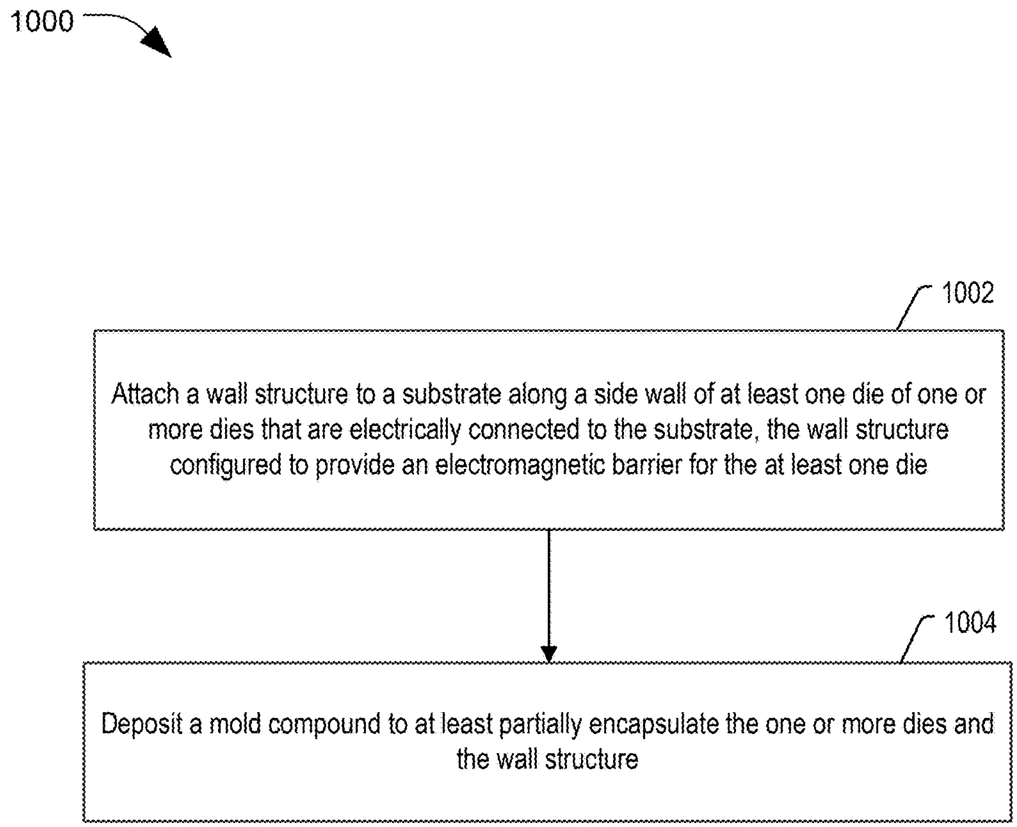
FIG. 10 illustrates an exemplary flow diagram of a method of semiconductor fabrication for a device that includes one or more EMI shielding structures.

In some implementations, fabricating a device including one or more EMI shielding structures includes several processes. FIG. 10 illustrates an exemplary flow diagram of a method 1000 of fabricating an illustrative device that includes one or more EMI shielding structures. In a particular aspect, one or more operations of the method 1000 are performed by one or more processors of a fabrication system. In some implementations, operations of the method 1000 may be stored as instructions by a non-transitory computer-readable storage medium, and the instructions may be executable by at least one processor to cause the at least one processor to perform operations of the method 1000. In some implementations, the method 1000 of FIG. 10 may be used to provide or fabricate any of the device 100 of FIGS. 1A-C, the substrate 200 of FIG. 2, the device 400 of FIGS. 1A-C and 4A-C, the semiconductor packages 770-774 of FIG. 7D, the semiconductor packages 860-864 of FIG. 8C, or the semiconductor packages 950-952 of FIG. 9C.

It should be noted that the method 1000 of FIG. 10 may combine one or more processes in order to simplify and/or clarify the method for providing or fabricating an integrated circuit device. In some implementations, the order of the processes may be changed or modified.

The method 1000 includes attaching a wall structure to a substrate along a side wall of at least one die of one or more dies that are electrically connected to the substrate, at block 1002. The wall structure is configured to provide an electromagnetic barrier for the at least one die. For example, Stage 2 of FIG. 7A illustrates and describes examples of attaching the wall structures 720-722 to the substrate 700, and Stages 3-5 of FIGS. 7A-B illustrate and describes examples of attaching the wall structures 750-756 to the substrate 700. The wall structure of the method 1000 can include the first wall structure 110, the second wall structure 112, the third wall structure 114, the fourth wall structure 116 of FIGS. 1A-C, the first wall structure 408, the second wall structure 410 of FIGS. 4A-C, the wall structures 720-722 and 750-756 of FIGS. 7A-D, the wall structures 840-846 of FIGS. 8A-C, or the wall structures 918-928 of FIGS. 9A-C.

The method 1000 includes depositing a mold compound to at least partially encapsulate the one or more dies and the wall structure, at block 1004. For example, Stage 4 of FIG. 7B illustrates and describes examples of depositing the mold compound 740. The mold compound of the method 1000 can include the mold compound 122 of FIGS. 1A-C, the mold compound 740 of FIGS. 7B-D, the mold compound 830 of FIGS. 8B-C, or the mold compound 930 of FIGS. 9A-C.

In some implementations, the method 1000 also includes forming an opening in the mold compound above the wall structure to expose a top surface of the wall structure and depositing a conductive material on the mold compound and the top surface of the wall structure to form a cover layer of a package that includes the at least one die and the wall structure. The cover layer is configured to provide electromagnetic shielding for the package. For example, Stage 6 of FIG. 7B illustrates and describes examples of forming openings in the mold compound 740, and Stage 7 of FIG. 7C illustrates and describes examples of depositing a conductive material to form the cover layer 760.

In some implementations, the wall structure includes a first portion attached to the substrate, a second portion attached to the substrate, and a third portion connecting the first portion to the second portion, and the method 1000 further includes grinding a surface of the mold compound to remove at least the third portion and at least some of the mold compound and cutting the mold compound and the substrate between the first portion and the second portion to form at least a first package including the at least one die and the first portion. The first portion extends along a side wall of the first package and is configured to provide an electromagnetic barrier for the first package. For example, Stage 5 of FIG. 7B illustrates and describes grinding a surface of the mold compound 740, and Stage 9 of FIG. 7D illustrates and describes cutting the substrate 700 to form the semiconductor packages 770-774.

In some implementations, the method 1000 also includes, prior to attaching the wall structure, forming a first patterned dielectric layer on a first metal layer. The first metal layer is on a first surface of a core layer of the substrate, and the first patterned dielectric layer defines a first recess along an edge of the substrate and on the first metal layer. For example, Stage 2 of FIG. 6A illustrates and describes examples of patterning the first metal layer 602, and Stage 3 of FIG. 6A illustrates and describes examples of forming and patterning the first dielectric layer 610 to form the first recess 612. The first metal layer of the method 1000 can include the third patterned portion 426 of FIG. 4A or the first metal layer 602 and/or the first patterned portion 604 of FIG. 6A, the core layer of the method 1000 can include the core layer 420 of FIG. 4A or the core layer 600 of FIGS. 6A-C, and the first recess of the method 1000 can include the second recess 434 of FIG. 4A or the first recess 612 of FIG. 6A. In such implementations, the method 1000 also includes depositing a conductive material within the first recess to form a conductive sidewall structure extending to the edge of the substrate. For example, Stage 4 of FIG. 6B illustrates and describes examples of depositing a conductive material in the first recess 612 to form the first conductive sidewall structure 614. The conductive sidewall structure of the method 1000 can include the second conductive sidewall structure 436 of FIG. 4A or the first conductive sidewall structure 614 of FIGS. 6A-C. In such implementations, the method 1000 further includes forming a second metal layer on the first patterned dielectric layer and the conductive sidewall structure. The conductive sidewall structure is electrically connected to the first metal layer and to the second metal layer. For example, Stage 5 of FIG. 6B illustrates and describes examples of forming a second patterned metal layer that includes the second patterned portion 616 that is electrically connected to the first conductive sidewall structure 614. The second metal layer of the method 1000 can include the second patterned portion 424 of FIG. 4A or the second patterned portion 616 of FIGS. 6B-C.

In some implementations, the method 1000 also includes attaching one or more wall structures to the substrate along one or more side walls of the one or more dies. The substrate includes a substrate strip. A first region of the substrate strip includes the wall structure and the at least one die, and a second region of the substrate strip includes the one or more wall structures and other dies of the one or more dies. For example, the at least one wall structure of the method 1000 can include the first wall structure 720 of FIGS. 7A-D, the first region of the method 1000 can include the package unit 702A of FIGS. 7A-D, the second region of the method 1000 can include the package unit 702B of FIGS. 7A-D, and the one or more wall structures of the method 1000 can include the fourth wall structure 752 or the fifth wall structure 754 of FIGS. 7A-D. In such implementations, the method 1000 further includes, after depositing the mold compound, cutting the substrate strip at a border between the first region and the second region to form a first package that corresponds to the first region and a second package that corresponds to the second region. For example, the first package of the method 1000 can include the first semiconductor package 770 of FIGS. 7A-D and the second package of the method 1000 can include the second semiconductor package 772 of FIGS. 7A-D.

Figure 11:
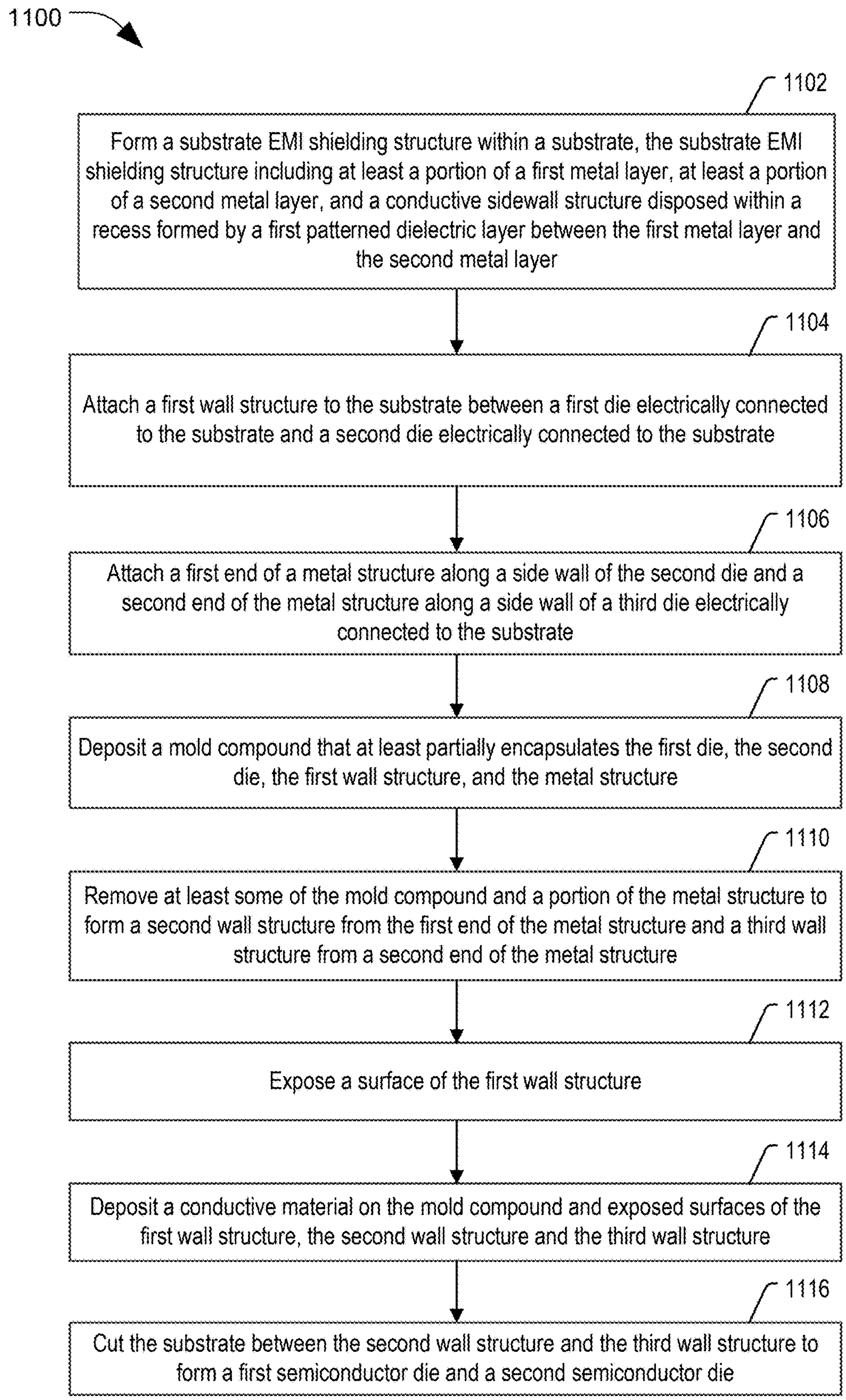
FIG. 11 illustrates an exemplary flow diagram of a method of semiconductor fabrication for a device that includes multiple types of EMI shielding structures.

Exemplary Flow Diagram of a Method for Fabricating a Device Including Multiple Types of EMI Shielding Structures In some implementations, fabricating a device including multiple types of EMI shielding structures includes several processes. FIG. 11 illustrates an exemplary flow diagram of a method 1100 of fabricating an illustrative device that includes multiple types of EMI shielding structures. In a particular aspect, one or more operations of the method 1100 are performed by one or more processors of a fabrication system. In some implementations, operations of the method 1100 may be stored as instructions by a non-transitory computer-readable storage medium, and the instructions may be executable by at least one processor to cause the at least one processor to perform operations of the method 1100. In some implementations, the method 1100 of FIG. 11 may be used to provide or fabricate any of the device 100 of FIGS. 1A-C, the substrate 200 of FIG. 2, the device 400 of FIGS. 1A-C and 4A-C, the semiconductor packages 770-774 of FIG. 7D, the semiconductor packages 860-864 of FIG. 8C, or the semiconductor packages 950-952 of FIG. 9C.

It should be noted that the method 1100 of FIG. 11 may combine one or more processes in order to simplify and/or clarify the method for providing or fabricating an integrated circuit device. In some implementations, the order of the processes may be changed or modified. Additionally, or alternatively, additional processes may be performed to form one or more of the devices described herein.

The method 1100 includes forming a substrate EMI shielding structure within a substrate, at block 1102. The substrate EMI shielding structure includes at least a portion of a first metal layer, at least a portion of a second metal layer, and a conductive sidewall structure disposed within a first recess formed by a first patterned dielectric layer between the first metal layer and the second metal layer. For example, Stages 1-9 of FIGS. 6A-C illustrate and describe examples of forming the substrate EMI shielding structures 630, 632, and 633 within a substrate that includes the core layer 600. The method 1100 includes attaching a first wall structure to the substrate between a first die electrically connected to the substrate and a second die electrically connected to the substrate, at block 1104. For example, Stage 2 of FIG. 7A illustrates and describes examples of attaching the first wall structure 720 to the substrate 700 between the first die 710 and the second die 712.

The method 1100 includes attaching a first end of a metal structure along a side wall of the second die and a second end of the metal structure along a side wall of a third die electrically connected to the substrate, at block 1106. For example, Stage 3 of FIG. 7A illustrates and describes examples of attaching the first portion 730 of the first metal structure 724 along the side wall of the second die 712 and attaching the second portion 732 of the first metal structure 724 along the side wall of the third die 714. The method 1100 includes depositing a mold compound that at least partially encapsulates the first die, the second die, the first wall structure, and the metal structure, at block 1108. For example, Stage 4 of FIG. 7B illustrates and describes examples of depositing the mold compound 740.

The method 1100 includes removing at least some of the mold compound and a portion of the metal structure to form a second wall structure from the first end of the metal structure and a third wall structure from a second end of the metal structure, at block 1110. For example, Stage 5 of FIG. 7B illustrates and describes examples of grinding the top of the mold compound 740 to remove the third portion of the first metal structure 724. The method 1100 includes exposing a surface of the first wall structure, at block 1112. For example, Stage 6 of FIG. 7B illustrates and describes examples of exposing a top surface of the first wall structure 720.

The method 1100 includes depositing a conductive material on the mold compound and exposed surfaces of the first wall structure, the second wall structure and the third wall structure, at block 1114. For example, Stage 7 of FIG. 7C illustrates and describes examples of forming the cover layer 760. The method 1100 includes cutting the substrate between the second wall structure and the third wall structure to form a first semiconductor die and a second semiconductor die, at block 1116. For example, Stage 8 of FIG. 7C and Stage 9 of FIG. 7D illustrate and describe examples of cutting the substrate 700 to form the first semiconductor package 770 and the second semiconductor package 772.

Exemplary Electronic Devices

Figure 12:
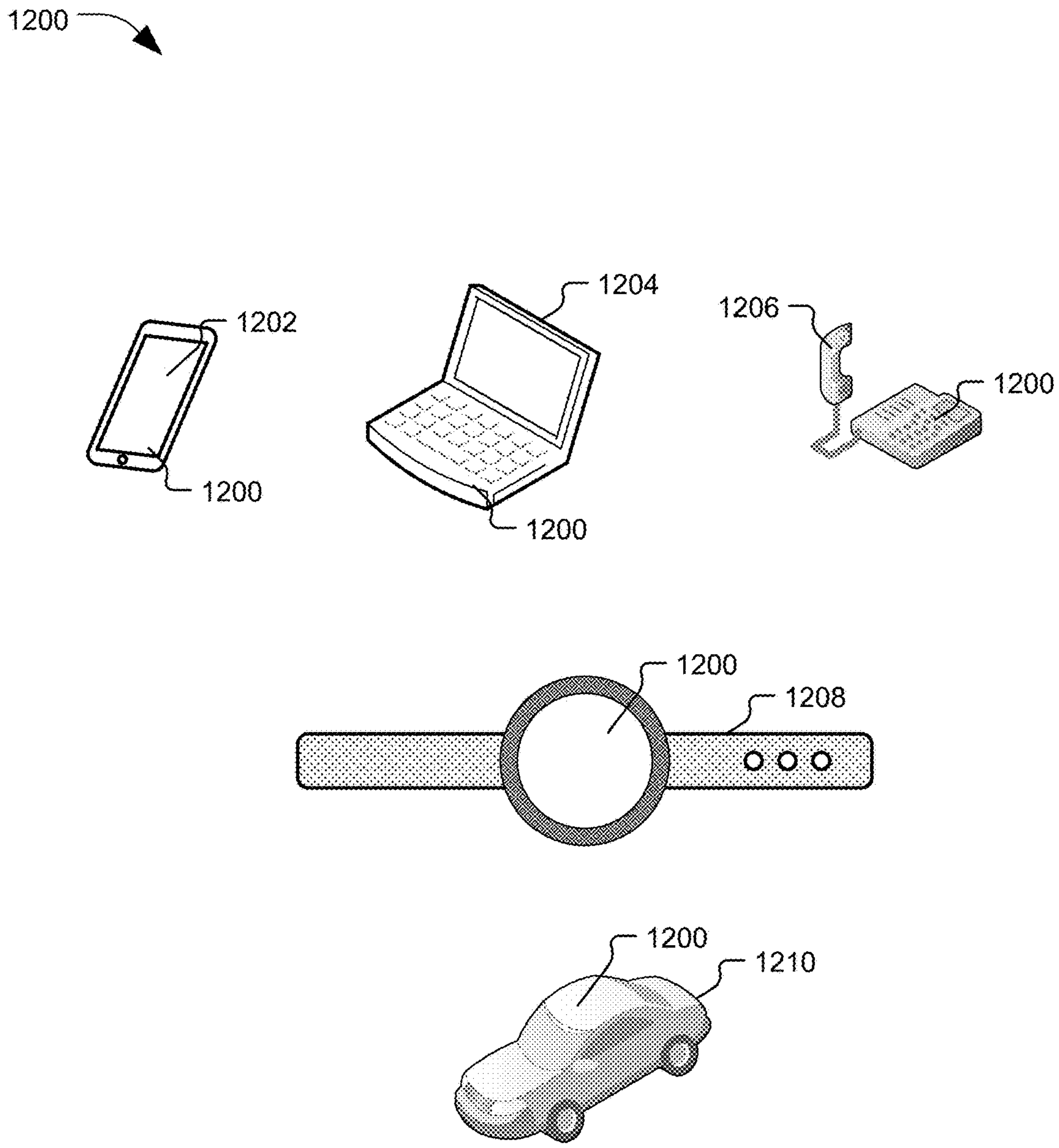
FIG. 12 illustrates various electronic devices that may integrate an exemplary integrated EMI shielding structure described herein.

FIG. 12 illustrates various electronic devices that may include or be integrated with any of the device 100 (that includes the exemplary EMI shielding structures) or the device 400. For example, a mobile phone device 1202, a laptop computer device 1204, a fixed location terminal device 1206, a wearable device 1208, or a vehicle 1210 (e.g., an automobile or an aerial device) may include a device 1200. The device 1200 can include, for example, any of the device 100 or the device 400, and/or any other integrated device that includes one or more EMI shielding structures described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1A-12 may be rearranged and/or combined into a single component, process, feature or function or embodied in several components, processes, or functions. Additional elements, components, processes, and/or functions may also be added without departing from the disclosure. It should also be noted FIGS. 1A-12 and its corresponding description in the present disclosure is not limited to dies and/or ICs. In some implementations, FIGS. 1A-11 and its corresponding description may be used to manufacture, create, provide, and/or produce devices and/or integrated devices. In some implementations, a device may include a die, an integrated device, an embedded multi-chip package, an integrated passive device (IPD), a die package, an IC device, a device package, an IC package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word “exemplary” is used herein to mean “serving as an example, instance, or illustration.” Any implementation or aspect described herein as “exemplary” is not necessarily to be construed as preferred or advantageous over other aspects of the disclosure. Likewise, the term “aspects” does not require that all aspects of the disclosure include the discussed feature, advantage or mode of operation. The term “coupled” is used herein to refer to the direct or indirect coupling (e.g., mechanical coupling) between two objects. For example, if object A physically touches object B, and object B touches object C, then objects A and C may still be considered coupled to one another even if they do not directly physically touch each other. An object A, that is coupled to an object B, may be coupled to at least part of object B. The term “electrically coupled” may mean that two objects are directly or indirectly coupled together such that an electrical current (e.g., signal, power, ground) may travel between the two objects. Two objects that are electrically coupled may or may not have an electrical current traveling between the two objects. The use of the terms “first,” “second,” “third,” and “fourth” (and/or anything above fourth) is arbitrary. Any of the components described may be the first component, the second component, the third component or the fourth component. For example, a component that is referred to as a second component, may be the first component, the second component, the third component or the fourth component. The terms “encapsulate,” “encapsulating” and/or any derivation means that the object may partially encapsulate or completely encapsulate another object. The terms “top” and “bottom” are arbitrary. A component that is located on top may be located over a component that is located on a bottom. A top component may be considered a bottom component, and vice versa. As described in the disclosure, a first component that is located “over” a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term “over” as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located “in” a second component may be partially located in the second component or completely located in the second component. A value that is about X-XX, may mean a value that is between X and XX, inclusive of X and XX. The value(s) between X and XX may be discrete or continuous. The term “about ‘value X’”, or “approximately value X”, as used in the disclosure means within 10 percent of the ‘value X’. For example, a value of about 1 or approximately 1, would mean a value in a range of 0.9-1.1. A “plurality” of components may include all the possible components or only some of the components from all of the possible components. For example, if a device includes ten components, the use of the term “the plurality of components” may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, a device includes a substrate; one or more dies electrically connected to the substrate; a wall structure electrically connected to the substrate and extending along a side wall of at least one die of the one or more dies and configured to provide an electromagnetic barrier for the at least one die; and a mold compound at least partially encapsulating the one or more dies and the wall structure.

Example 2 includes the device of Example 1, wherein the wall structure includes a first wall structure disposed between a first die of the one or more dies and a second die of the one or more dies, and wherein the device further includes a second wall structure electrically connected to the substrate and extending along a side wall of a package defined by the mold compound, the package including the substrate, the one or more dies, the first wall structure, and the second wall structure.

Example 3 includes the device of Example 2, wherein the first wall structure includes: a first vertical metal layer; a second vertical metal layer; and a vertical dielectric layer between the first vertical metal layer and the second vertical metal layer.

Example 4 includes the device of Example 2, wherein the second wall structure includes a unitary wall structure.

Example 5 includes the device of any of Examples 2 to 5, wherein the substrate includes: a first metal layer; a second metal layer; a dielectric layer disposed between the first metal layer and the second metal layer and defining a recess along an edge of the substrate between the first metal layer and the second metal layer; and a conductive sidewall structure electrically connected to the first metal layer and to the second metal layer, the conductive sidewall structure disposed within the recess and extending to the edge of the substrate.

Example 6 includes the device of Example 5, wherein the dielectric layer includes a photo imageable dielectric (PID) material.

Example 7 includes the device of Example 5 or Example 6, wherein the conductive sidewall structure forms a continuous wall along an entirety of the edge of the substrate, and wherein the conductive sidewall structure is electrically connected to the wall structure.

Example 8 includes the device of any of Examples 5 to 7, wherein the substrate further includes: a third metal layer; a second dielectric layer disposed between the second metal layer and the third metal layer and defining a second recess along the edge of the substrate between the second metal layer and the third metal layer; and a second conductive sidewall structure electrically connected to the first metal layer, the conductive sidewall structure, the second metal layer, and the third metal layer, the second conductive sidewall structure disposed within the second recess and extending to the edge of the substrate.

Example 9 includes the device of Example 8, wherein the substrate further includes: a fourth metal layer; a third dielectric layer disposed between the first metal layer and the fourth metal layer; a fifth metal layer; a fourth dielectric layer disposed between the fourth metal layer and the fifth metal layer and defining a third recess along the edge of the substrate between the fourth metal layer and the fifth metal layer; and a third conductive sidewall structure electrically connected to the fourth metal layer and to the fifth metal layer, the third conductive sidewall structure disposed within the third recess and extending to the edge of the substrate.

Example 10 includes the device of Example 9, wherein the third dielectric layer includes one or more vias configured to electrically connect the first metal layer, the conductive sidewall structure, the second metal layer, the second conductive sidewall structure, and the third metal layer to the fourth metal layer, the third conductive sidewall structure, and the fifth metal layer.

Example 11 includes the device of any of Examples 5 to 10, wherein the substrate further includes one or more anchor structures coupled to the conductive sidewall structure.

Example 12 includes the device of Example 1, wherein the wall structure extends along a side wall of a package defined by the mold compound, and wherein the wall structure comprises one or more partial cut-outs in a direction along the side wall of the package.

Example 13 includes the device of Example 1 or Example 12, wherein the wall structure includes two portions each forming an offset bend.

Example 14 includes the device of any of Examples 1 to 13, further including a cover layer disposed on a top surface of the mold compound and configured to provide electromagnetic shielding for the device, wherein the wall structure is electrically connected to the cover layer.

According to Example 15, a method of semiconductor fabrication includes: attaching a wall structure to a substrate along a side wall of at least one die of one or more dies that are electrically connected to the substrate, the wall structure configured to provide an electromagnetic barrier for the at least one die; and depositing a mold compound to at least partially encapsulate the one or more dies and the wall structure.

Example 16 includes the method of Example 15, further including: forming an opening in the mold compound above the wall structure to expose a top surface of the wall structure; and depositing a conductive material on the mold compound and the top surface of the wall structure to form a cover layer of a package that includes the at least one die and the wall structure, the cover layer configured to provide electromagnetic shielding for the package.

Example 17 includes the method of Example 15 or Example 16, wherein the wall structure includes a first portion attached to the substrate, a second portion attached to the substrate, and a third portion connecting the first portion to the second portion, the method further including: grinding a surface of the mold compound to remove at least the third portion and at least some of the mold compound; and cutting the mold compound and the substrate between the first portion and the second portion to form at least a first package including the at least one die and the first portion, the first portion extending along a side wall of the first package and configured to provide an electromagnetic barrier for the first package.

Example 18 includes the method of any of Examples 15 to 17, further including, prior to attaching the wall structure: forming a first patterned dielectric layer on a first metal layer, the first metal layer on a first surface of a core layer of the substrate, wherein the first patterned dielectric layer defines a first recess along an edge of the substrate and on the first metal layer; depositing a conductive material within the first recess to form a conductive sidewall structure extending to the edge of the substrate; and forming a second metal layer on the first patterned dielectric layer and the conductive sidewall structure, wherein the conductive sidewall structure is electrically connected to the first metal layer and to the second metal layer.

Example 19 includes the method of any of Examples 15, 16, or 18, further including, prior to depositing the mold compound: attaching one or more wall structures to the substrate along one or more side walls of the one or more dies, the substrate including a substrate strip, wherein a first region of the substrate strip includes the wall structure and the at least one die, and wherein a second region includes the one or more wall structures and other dies of the one or more dies; and after depositing the mold compound, cutting the substrate strip at a border between the first region and the second region to form a first package that corresponds to the first region and a second package that corresponds to the second region.

According to Example 20, a device includes a substrate including: a first metal layer; a second metal layer; a dielectric layer disposed between the first metal layer and the second metal layer and defining a recess along an edge of the substrate between the first metal layer and the second metal layer; and a conductive sidewall structure electrically connected to the first metal layer and to the second metal layer, the conductive sidewall structure disposed within the recess and extending to the edge of the substrate; the device also including: a first die electrically connected to the substrate; a second die electrically connected to the substrate; a first wall structure electrically connected to the substrate and extending between the first die and the second die and configured to provide an electromagnetic barrier between the first die and the second die; a second wall structure electrically connected to the substrate and extending along a sidewall of the second die; and a mold compound at least partially encapsulating the first die, the second die, the first wall structure, and the second wall structure.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
- a substrate comprising:
  - a first metal layer;
  - a second metal layer;
  - a dielectric layer disposed between the first metal layer and the second metal layer and defining a recess along an edge of the substrate between the first metal layer and the second metal layer; and
  - a conductive sidewall structure electrically connected to the first metal layer and to the second metal layer, the conductive sidewall structure disposed within the recess and extending to the edge of the substrate;
- one or more dies electrically connected to the substrate; and
- a mold compound at least partially encapsulating the one or more dies and a top surface of the substrate.

2. The device of claim 1, further comprising:
- a second wall structure electrically connected to the substrate and extending along a side wall of at least one die of the one or more dies and configured to provide an electromagnetic barrier for the at least one die, wherein the second wall structure is disposed between a first die of the one or more dies and a second die of the one or more dies; and
- a third wall structure electrically connected to the substrate and extending along a side wall of a package defined by the mold compound, the package including the substrate, the one or more dies, the second wall structure, and the third wall structure.

3. The device of claim 2, wherein the second wall structure comprises:
- a first vertical metal layer;
- a second vertical metal layer; and
- a vertical dielectric layer between the first vertical metal layer and the second vertical metal layer.

4. The device of claim 2, wherein the third wall structure comprises a unitary wall structure.

5. The device of claim 2, wherein a thickness of the conductive sidewall structure is based on a size of a patterned region of the PID material.

6. The device of claim 1, wherein the dielectric layer comprises a photo imageable dielectric (PID) material.

7. The device of claim 1, wherein the conductive sidewall structure forms a continuous wall along an entirety of the edge of the substrate.

8. The device of claim 1, wherein the substrate further comprises:
- a third metal layer;
- a second dielectric layer disposed between the second metal layer and the third metal layer and defining a second recess along the edge of the substrate between the second metal layer and the third metal layer; and
- a second conductive sidewall structure electrically connected to the first metal layer, the conductive sidewall structure, the second metal layer, and the third metal layer, the second conductive sidewall structure disposed within the second recess and extending to the edge of the substrate.

9. The device of claim 8, wherein the substrate further comprises:
- a fourth metal layer;
- a third dielectric layer disposed between the first metal layer and the fourth metal layer;
- a fifth metal layer;
- a fourth dielectric layer disposed between the fourth metal layer and the fifth metal layer and defining a third recess along the edge of the substrate between the fourth metal layer and the fifth metal layer; and
- a third conductive sidewall structure electrically connected to the fourth metal layer and to the fifth metal layer, the third conductive sidewall structure disposed within the third recess and extending to the edge of the substrate.

10. The device of claim 9, wherein the third dielectric layer comprises one or more vias configured to electrically connect the first metal layer, the conductive sidewall structure, the second metal layer, the second conductive sidewall structure, and the third metal layer to the fourth metal layer, the third conductive sidewall structure, and the fifth metal layer.

11. The device of claim 1, wherein the substrate further comprises one or more anchor structures coupled to the conductive sidewall structure.

12. The device of claim 2, wherein the third wall structure extends along a side wall of the package, and wherein the third wall structure comprises one or more partial cut-outs in a direction along the side wall of the package.

13. The device of claim 2, wherein the third wall structure comprises two portions each forming an offset bend.

14. The device of claim 2, further comprising:
- a cover layer disposed on a top surface of the mold compound and configured to provide electromagnetic shielding for the device, wherein the second wall structure, the third wall structure, or both, is electrically connected to the cover layer.

15. A method of semiconductor fabrication, the method comprising:
- forming a first patterned dielectric layer on a first metal layer of a substrate, wherein the first patterned dielectric layer defines a first recess along an edge of the substrate and on the first metal layer;
- depositing a conductive material within the first recess to form a conductive sidewall structure extending to the edge of the substrate;
- forming a second metal layer on the first patterned dielectric layer and the conductive sidewall structure, wherein the conductive sidewall structure is electrically connected to the first metal layer and to the second metal layer;

attaching one or more dies to the substrate; and depositing a mold compound to at least partially encapsulate the one or more dies and a top surface of the substrate.

16. The method of claim 15, further comprising:

attaching a second wall structure to the substrate along a side wall of at least one die of the one or more dies;

forming an opening in the mold compound above the second wall structure to expose a top surface of the second wall structure; and depositing a second conductive material on the mold compound and the top surface of the second wall structure to form a cover layer of a package that includes the at least one die, the substrate, and the second wall structure, wherein the cover layer is configured to provide electromagnetic shielding for the package.

17. The method of claim 15, further comprising:

attaching a second wall structure to the substrate along a side wall of at least one die of the one or more dies, wherein the second wall structure comprises a first portion attached to the substrate, a second portion attached to the substrate, and a third portion connecting the first portion to the second portion;

grinding a surface of the mold compound to remove at least the third portion and at least some of the mold compound; and cutting the mold compound and the substrate between the first portion and the second portion to form at least a first package including the at least one die and the first portion, the first portion extending along a side wall of the first package and configured to provide an electromagnetic barrier for the first package.

18. The method of claim 15, further comprising, prior to attaching the one or more dies:

forming a second patterned dielectric layer on a third metal layer, the third metal layer on an opposite side of a core layer of the substrate from the first metal layer, wherein the second patterned dielectric layer defines a second recess along the edge of the substrate and on the third metal layer;

depositing a second conductive material within the second recess to form a second conductive sidewall structure extending to the edge of the substrate; and forming a fourth metal layer on the second patterned dielectric layer and the second conductive sidewall structure, wherein the second conductive sidewall structure is electrically connected to the third metal layer and to the fourth metal layer.

19. The method of claim 15, further comprising, prior to depositing the mold compound:

attaching one or more wall structures to the substrate along one or more side walls of the one or more dies, the substrate comprising a substrate strip, wherein a first region of the substrate strip includes the conductive sidewall structure and at least one die of the one or more dies, and wherein a second region of the substrate strip includes the one or more structures and other dies of the one or more dies; and after depositing the mold compound, cutting the substrate strip at a border between the first region and the second region to form a first package that corresponds to the first region and a second package that corresponds to the second region.

20. A device comprising:

a substrate comprising:

a first metal layer;

a second metal layer;

a dielectric layer disposed between the first metal layer and the second metal layer and defining a recess along an edge of the substrate between the first metal layer and the second metal layer; and a conductive sidewall structure electrically connected to the first metal layer and to the second metal layer, the conductive sidewall structure disposed within the recess and extending to the edge of the substrate;

a first die electrically connected to the substrate;

a second die electrically connected to the substrate;

a first wall structure electrically connected to the substrate and extending between the first die and the second die and configured to provide an electromagnetic barrier between the first die and the second die;

a second wall structure electrically connected to the substrate and extending along a sidewall of the second die; and a mold compound at least partially encapsulating the first die, the second die, the first wall structure, and the second wall structure.

* * * * *